US009507271B1

(12) United States Patent
Chen et al.

(10) Patent No.: US 9,507,271 B1
(45) Date of Patent: Nov. 29, 2016

(54) SYSTEM AND METHOD FOR MANUFACTURING MULTIPLE LIGHT EMITTING DIODES IN PARALLEL

(75) Inventors: Jang Fung Chen, Cupertino, CA (US); Thomas Laidig, Richmond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 860 days.

(21) Appl. No.: 13/225,405

(22) Filed: Sep. 3, 2011

Related U.S. Application Data

(63) Continuation-in-part of application No. 12/475,114, filed on May 29, 2009, now Pat. No. 8,670,106.

(60) Provisional application No. 61/379,734, filed on Sep. 3, 2010.

(51) Int. Cl.
*G03B 27/44* (2006.01)
*G03F 7/20* (2006.01)

(52) U.S. Cl.
CPC ....... *G03F 7/70433* (2013.01); *G03F 7/70275* (2013.01); *G03F 7/70475* (2013.01); *G03F 7/70508* (2013.01); *G03F 7/70391* (2013.01)

(58) Field of Classification Search
CPC .. G03F 7/70; G03F 7/70216; G03F 7/70275; G03F 7/70375; G03F 7/70383; G03F 7/70425; G03F 7/70475; G03F 7/70483; G03F 7/70491; G03F 7/70508; G03F 7/70291; G03F 7/70533; G03F 7/70391; G03F 7/70433
USPC ............................ 355/46, 50, 53, 55, 67, 77
See application file for complete search history.

(56) References Cited

U.S. PATENT DOCUMENTS

| 5,117,254 | A | * | 5/1992 | Kawashima et al. | ........... 355/43 |
| 5,286,963 | A | * | 2/1994 | Torigoe | ..................... 250/201.2 |
| 5,557,115 | A | * | 9/1996 | Shakuda | ......................... 257/81 |
| 5,668,624 | A | * | 9/1997 | Naraki et al. | ................... 355/53 |
| 5,691,541 | A | * | 11/1997 | Ceglio et al. | .............. 250/492.1 |
| 5,878,152 | A | * | 3/1999 | Sussman | ..................... 382/106 |
| 6,233,039 | B1 | * | 5/2001 | Yen et al. | ...................... 355/53 |
| 6,512,573 | B2 | * | 1/2003 | Furter | ............................. 355/67 |
| 6,552,775 | B1 | * | 4/2003 | Yanagihara et al. | ............ 355/55 |
| 7,106,490 | B2 | * | 9/2006 | Sandstrom | ..................... 359/290 |
| 7,167,296 | B2 | * | 1/2007 | Meisburger | ................... 359/290 |
| 7,405,807 | B2 | * | 7/2008 | Van De Rijdt et al. | ........ 355/67 |
| 8,253,923 | B1 | * | 8/2012 | Chen et al. | ..................... 355/53 |
| 8,390,781 | B2 | * | 3/2013 | Laidig | ............................ 355/53 |
| 8,390,786 | B2 | * | 3/2013 | Laidig | ............................ 355/67 |
| 8,395,752 | B2 | * | 3/2013 | Laidig | ............................ 355/53 |
| 8,670,106 | B2 | * | 3/2014 | Chen et al. | ..................... 355/46 |

(Continued)

*Primary Examiner* — Thomas R Artman
(74) *Attorney, Agent, or Firm* — Silicon Valley Patent Group LLP; Thomas C. Chan

(57) ABSTRACT

System and method for manufacturing multiple light emitting diodes in parallel are disclosed. In one embodiment, the method includes providing an imaging writer system that includes a plurality of spatial light modulator (SLM) imaging units arranged in one or more parallel arrays, providing one or more substrates corresponding to multiple LEDs to be manufactured, receiving mask data to be written to the one or more substrates corresponding to the multiple LEDs, processing the mask data to form a plurality of partitioned mask data patterns corresponding to the plurality substrates of the multiple LEDs, assigning one or more SLM imaging units to handle each of the partitioned mask data pattern, and controlling the plurality of SLM imaging units to write the plurality of partitioned mask data patterns to the plurality substrates of the multiple LEDs in parallel.

14 Claims, 39 Drawing Sheets

(56) References Cited

U.S. PATENT DOCUMENTS

2006/0256310 A1* 11/2006 Van De Rijdt et al. ........ 355/67
2008/0013061 A1* 1/2008 Kato ............................... 355/53
2012/0026478 A1* 2/2012 Chen et al. .................... 355/53
2012/0262686 A1* 10/2012 Laidig ............................ 355/53
2012/0264066 A1* 10/2012 Chen et al. ................... 430/322
2012/0265332 A1* 10/2012 Laidig ........................... 700/104
2012/0307225 A1* 12/2012 Chen et al. ..................... 355/71
2013/0003029 A1* 1/2013 Laidig ............................ 355/53

* cited by examiner

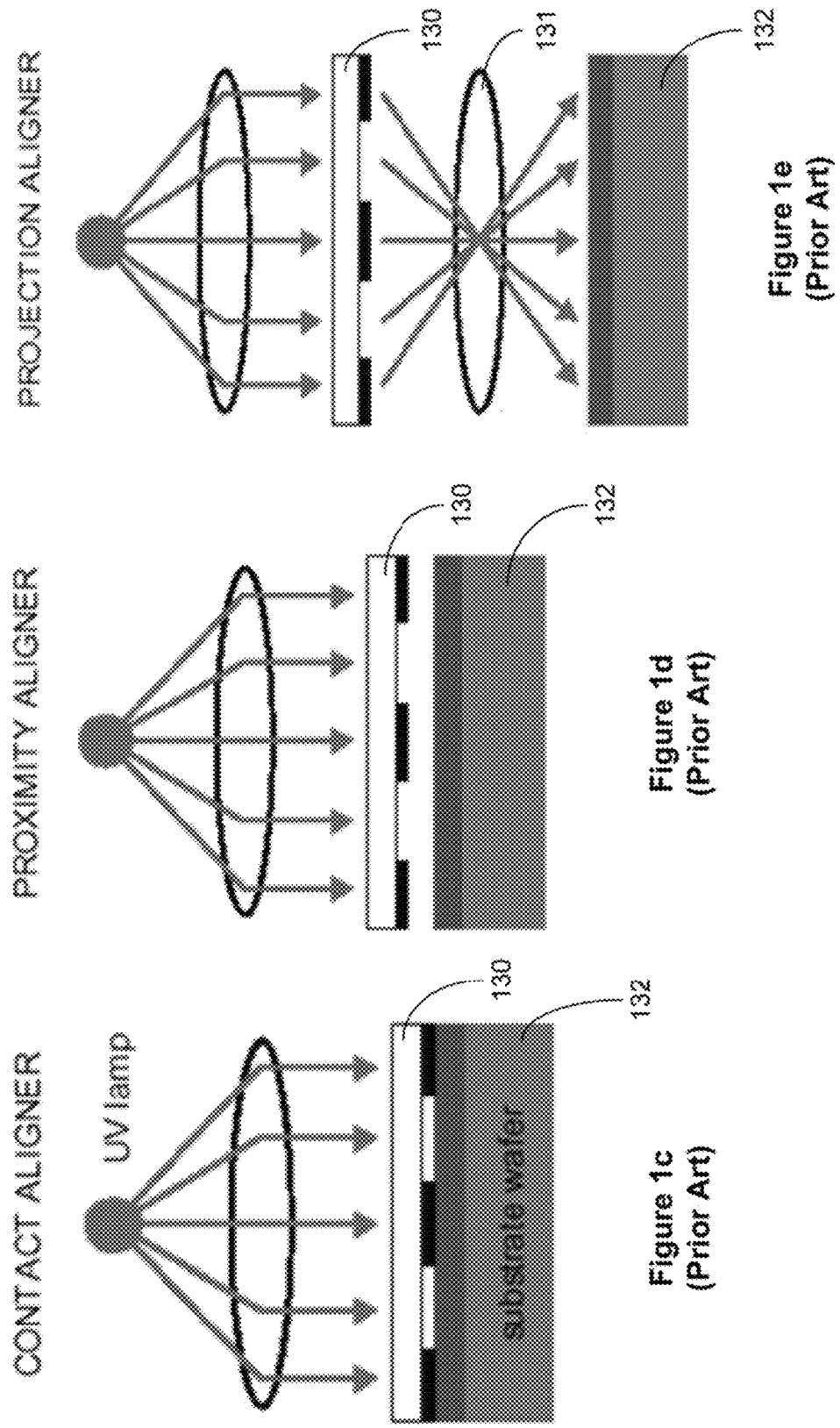

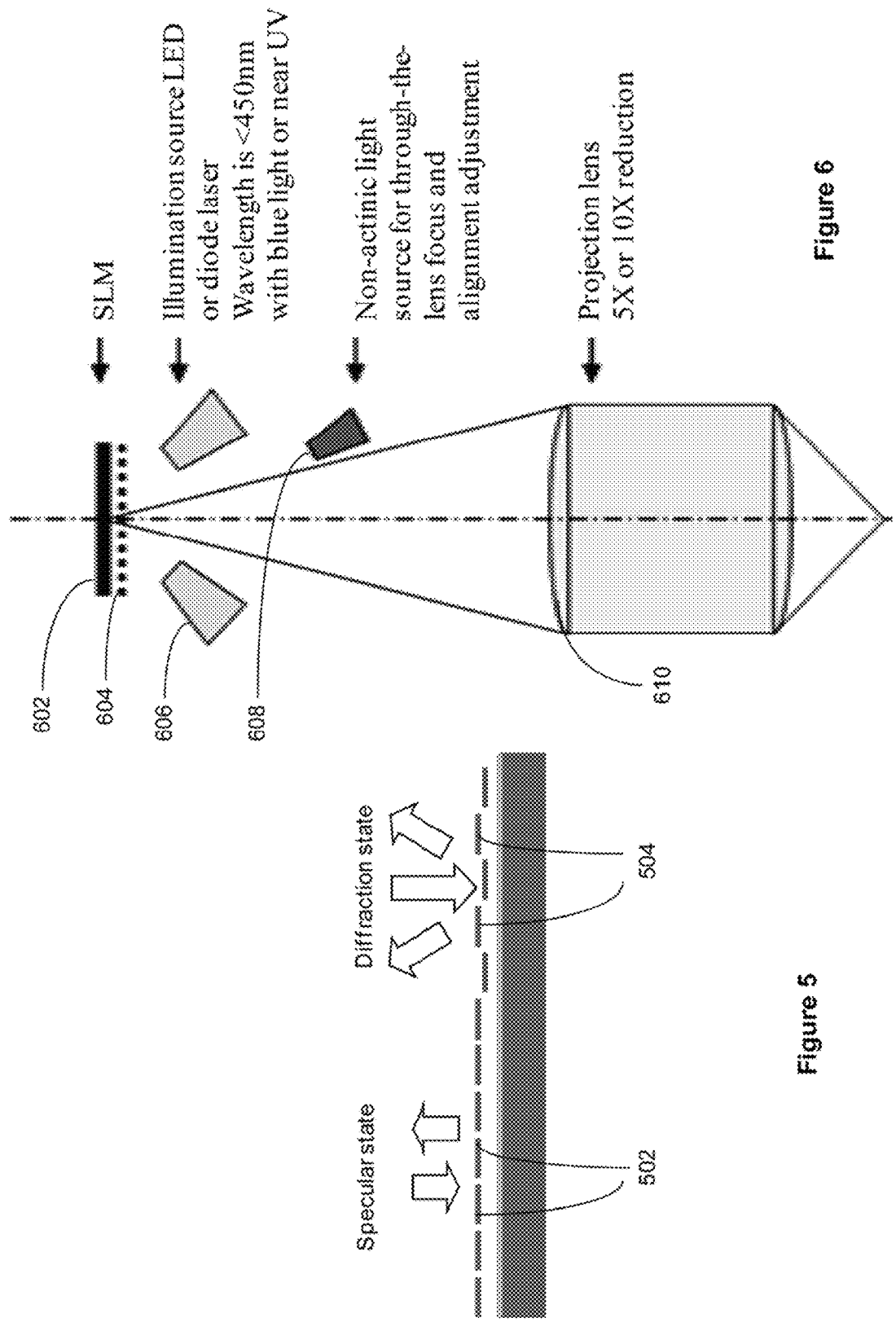

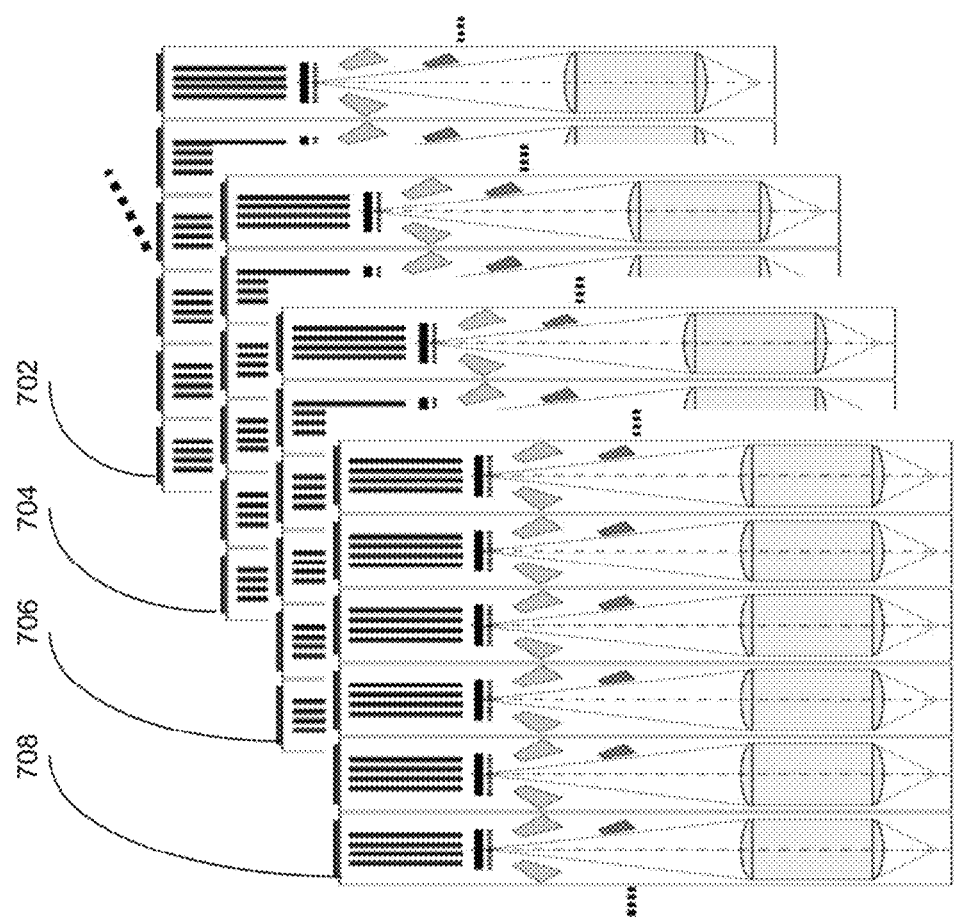

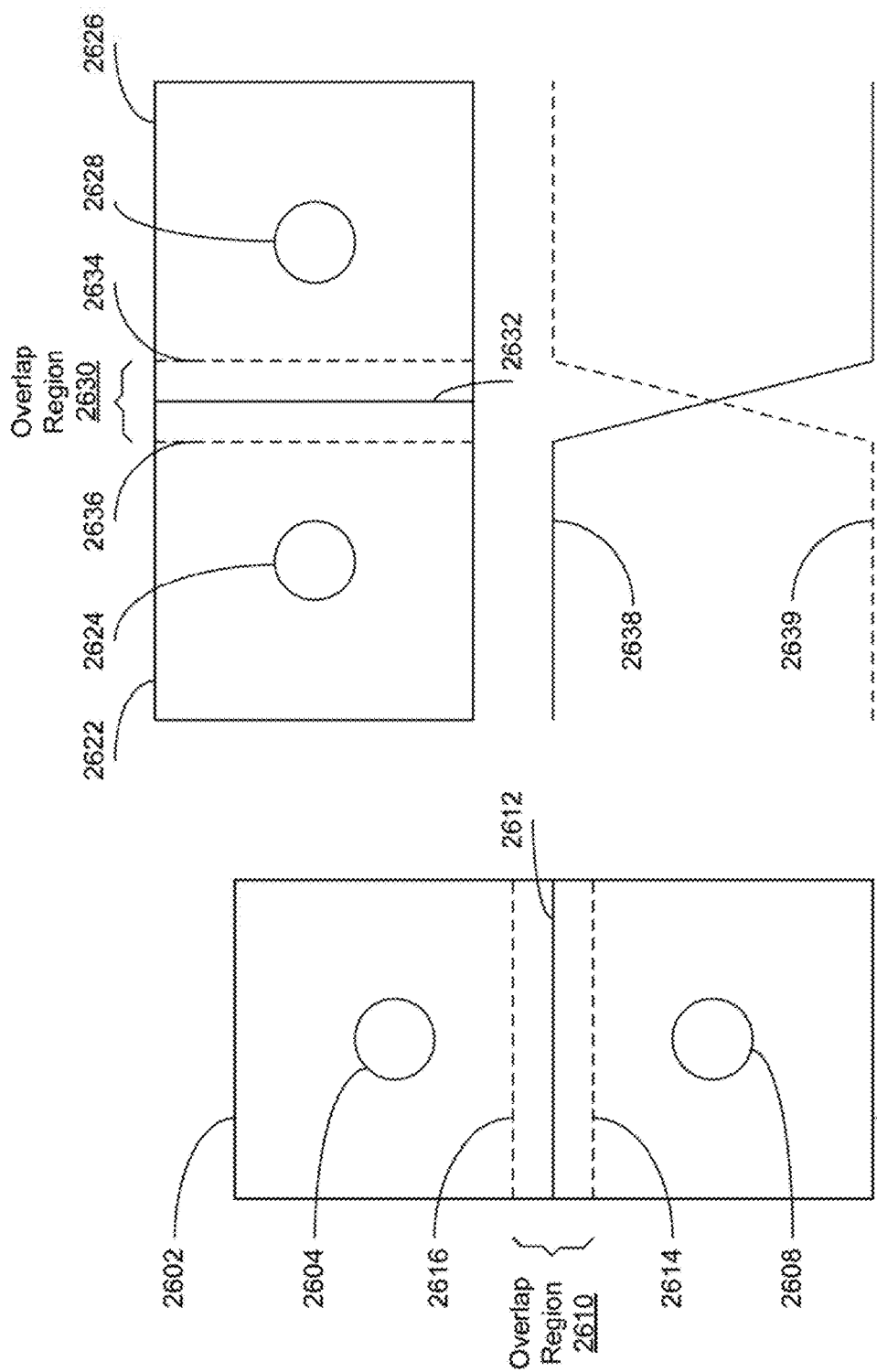

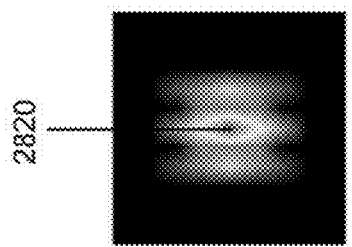
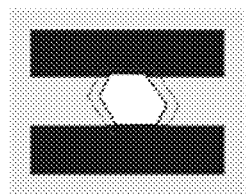
Figure 28d
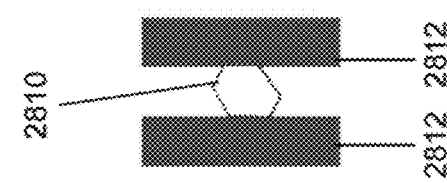
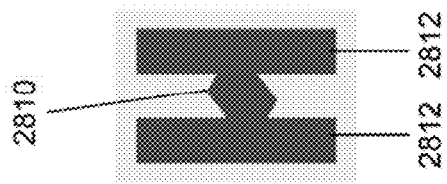
Figure 28c

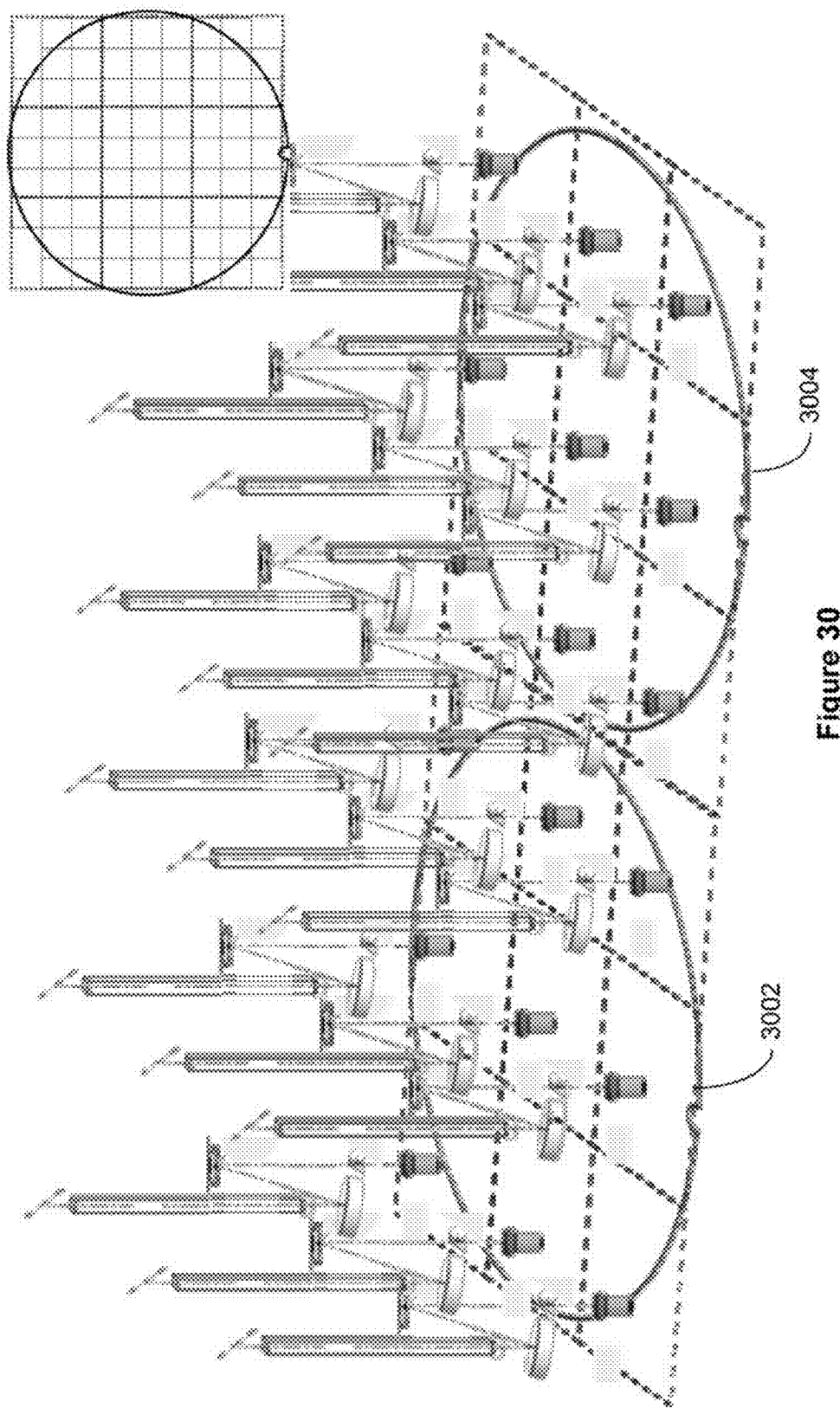

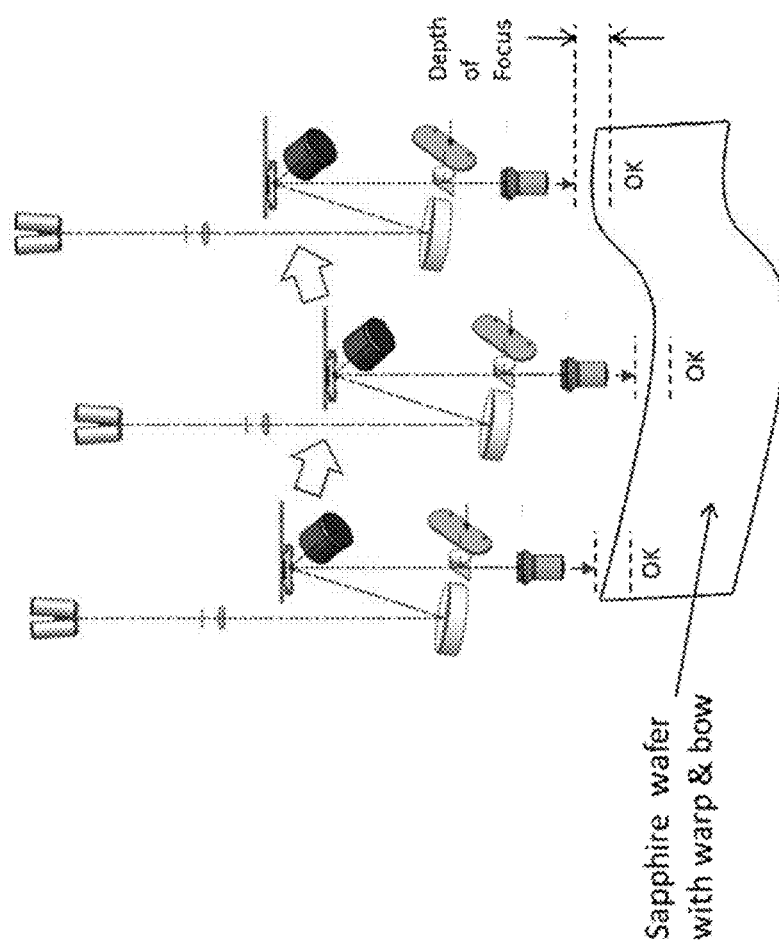

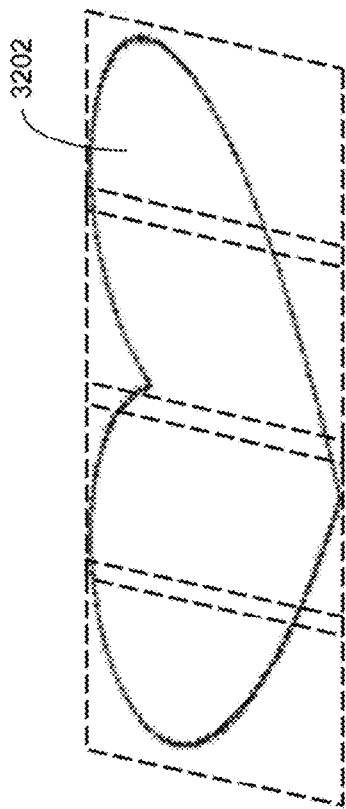
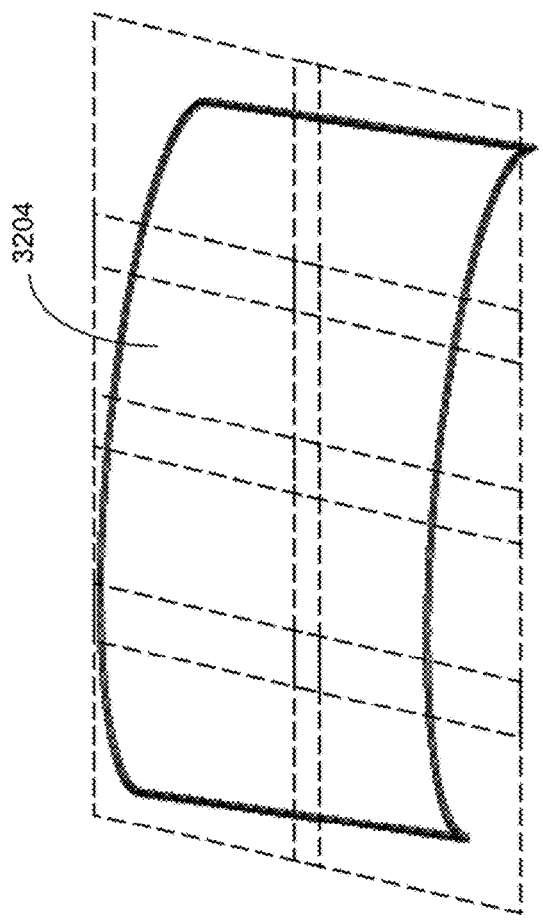

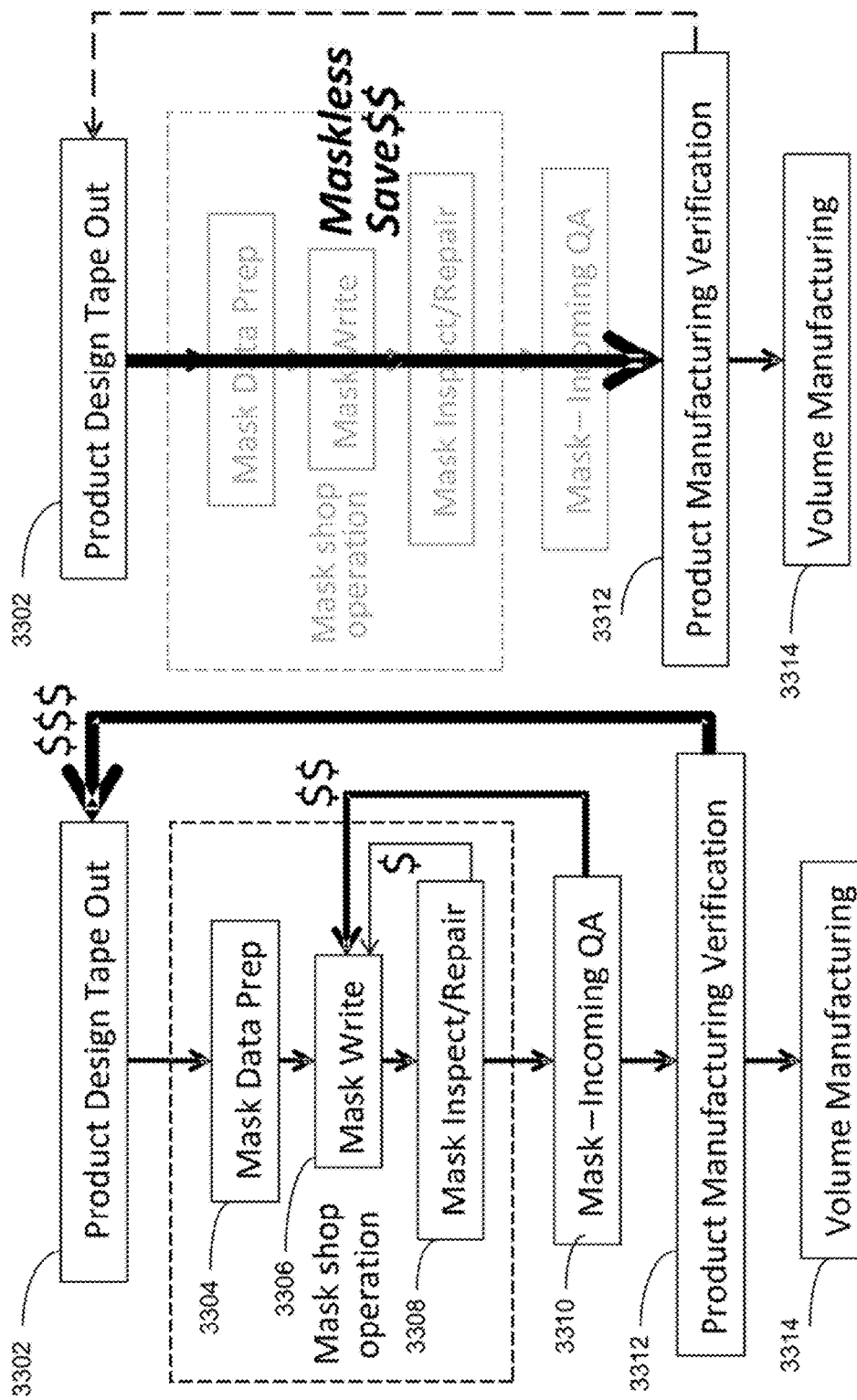

SYSTEM AND METHOD FOR MANUFACTURING MULTIPLE LIGHT EMITTING DIODES IN PARALLEL

CROSS REFERENCE TO RELATED APPLICATIONS

This application is a continuation-in-part of, and claims priority under 35 U.S.C. §120 to United States non-provisional patent application bearing Ser. No. 12/475,114, filed May 29, 2009, which claims the benefit of U.S. non-provisional application Ser. No. 12/337,504, filed Dec. 17, 2008, which claims the benefit of U.S. provisional application No. 61/099,495, "An Optical Imaging Writer System" filed Sep. 23, 2008. This application also claims the benefit of U.S. provisional application no. 61/379,734, "System and Method for Manufacturing Multiple Light Emitting Diodes in Parallel" filed Sep. 3, 2010. The aforementioned United States applications are hereby incorporated by reference in their entirety.

FIELD OF THE INVENTION

The present invention relates to the field of integrated circuit manufacturing. In particular, the present invention relates to system and method for manufacturing light emitting diodes in parallel.

BACKGROUND OF THE INVENTION

Fast-paced technology progress in semiconductor integrated circuit (IC) industry has benefited well for the manufacturing of active matrix liquid crystal display (AMLCD) TV and computer monitor displays. In the recent years, the size of LCD TV and computer monitor displays has grown to be larger and yet more affordable.

In the semiconductor IC industry, a technology generation is defined by the critical dimension (CD) of the circuit design rules. As each technology generation progresses, the IC of the later generation has smaller feature CD target and tighter tolerance. For the Flat Panel Display (FPD) industry, on the other hand, a technology generation is classified by the physical dimension of substrate used in manufacturing. In one example, the substrate sizes (in millimeter×millimeter) of FPDs sixth generation (G6) in 2005, eighth generation (G8) in 2007, and tenth generation (G10) in 2009 are 1500×1800, 2160×2460, and 2880×3080 respectively.

The lithography challenges in terms of making semiconductor ICs and FPD substrates are both trying to make larger sizes more affordable. However, they are entirely different from the manufacturing perspective. For the IC industry, a primary challenge is small CD features can be produced on a round 300 mm wafer. The goal is to pack as many transistors as possible for achieving better functionalities in the same die size. But for the FPD industry, one primary challenge is how large an entire rectangle substrate can be processed. The larger FPD substrate can be processed in a manufacturing line, the bigger size TVs or monitors can be produced with lower cost. The typical LCD TVs and monitors are designed with more sophisticated thin film transistor (TFT) for better performance. Still, the TFT CD target remains in the same specification range. In one viewpoint, one of the main challenges for FPD manufacturing is to keep throughput in pace with justifiable economics for each successive generation. Achieving profitable process yield is a key consideration, and the manufacturing process window needs to be preserved.

Conventionally, lithography technologies for manufacturing of FPD are derived from lithography process technologies for making semiconductor ICs. Majority of lithography exposure tools used for making FPD substrates are projection stepper and/or scanner systems. These are either 2-times reduction or 1-to-1 projection from mask to substrate. In order to project mask patterns to the substrate, the mask must first be made with the acceptable CD specifications. The FPD mask manufacturing process is similar to the one used for manufacturing semiconductor ICs, with the exception that the mask size for making semiconductor ICs is about 150 mm or 6 inches per side, whereas the mask size for manufacturing FPD, in one example, may be nearly 8-times larger per side, or physically more than one meter per side.

FIG. 1 illustrates a conventional configuration of projection exposure tool used for scanning mask patterns onto FPD substrate. In this configuration, the exposure sources used are mainly high pressure mercury (Hg) short-arc lamps. The incoming illumination light is reflected by a light folding mirror 102, and the reflected light passes through a mask 104, a projection lens 106 before it reaches a FPD substrate 108. The concern of using this conventional mask-based exposure tool configuration as shown in FIG. 1 for the upcoming FPD lithography manufacturing is the issue of handling the increasing physical size of masks. In one example, for the G8 FPD, the size of a mask is about 1080 mm×1230 mm. The area size of G8 substrate is four times larger. The TFT CD feature specification is in the range of 3 microns ±10%. The CD control for TFT over more-than-two-meters per side of G8 substrate is more challenging than controlling specifications for printing advanced IC features on a 300 mm silicon wafer. The challenge facing the FPD industry is to build such a mask-based exposure tool cost effectively for the upcoming FPD generations while preserving acceptable lithography process window.

To mitigate CD uniformity issue over the entire FPD exposure field, one approach is to use multiple exposures method. The nominal exposure is composed of several component exposures in adequate proportions. Each component exposure uses pre-selected wavelength for illumination along with the corresponding projection lens for scanning and stepping. More than one projection lenses need to be included in this type of exposure tool but only single illumination source is equipped. This is due to the need of using high powered Hg short-arc illumination sources in kilo Watts (KW) for throughput. The selection of exposure wavelength can be done by applying adequate filter to the source. In one example, this multi-wavelength exposure method relaxes the negative impact on CD uniformity over a G8 substrate hence allowing more economical quality of lens and illumination set-up to be used.

In using multi-wavelength exposures, it is necessary to specify more stringent CD target and uniformity on the mask itself. In one example, the TFT mask CD tolerance is under 100 nm, much smaller than otherwise necessary for the nominal 3 microns mask CD target. One reason is that the process window for FPD lithography manufacturing can be more manageable for the existing exposure tool configuration. Unfortunately, the tighter FPD mask CD specifications required would push the already costly mask set to be even more expensive. In some situations, making a critical level mask for the G8 FPD becomes very expensive and has long delivery lead time.

Yet another problem with the conventional approach is the defect density control for the use of larger sized masks. Lithography processing with such a large size mask using multiple exposures, even starting with defect free mask, is prone to introduce detrimental defects. A defect prone process impacts yield and ultimately the cost of the mask.

FIG. 1b illustrates another setup of a conventional exposure tool. As shown in FIG. 1b, the exposure tool includes a light source 110, a first projection lens 112, a reticle 114 (also referred to as a mask), a second projection lens 116, a wafer 118, and a wafer stage 120. The light source 110 is controlled to project rays of light via the first projection lens 112 to the reticle 114, where the reticle contains patterns to be imaged onto the wafer 118. A portion of the light rays is blocked by the reticle 114, and other portion of the light rays is allowed to pass through the reticle 114 to expose the wafer 118 via the second project lens 116. The light rays passed through the reticle 114 exposed certain areas of the wafer 118 to generate a set of pattern images that corresponds to IC design pattern formed on the reticle 122.

Note that the wafer is held by the wafer stage 120, which may be controlled to move in directions as shown by the arrows. In a conventional stepper system, the light source 110 is either blue visible light or near UV, the first projection lens 112, the reticle 114, the second projection lens 116 remain stationery, while the wafer 118 and the wafer stage 120 that holds the wafer move to allow different areas on the wafer 118 to be exposed. The stepper system may be used to manufacture designs with resolution accuracies in the range of 1 to 3 microns, such as for manufacturing small sized masks, LEDs, and fourth generation or earlier flat panel displays. In a conventional scanner system, both the light source 110, the first projection lens 112, and the second projection lens 116 remain stationery, while the reticle 114, the wafer 118 and the wafer stage 120 that holds the wafer move to allow different areas on the wafer 118 to be exposed. The scanner system is more efficient in handling large-sized mask flat panel displays than the stepper system, and is more expensive than the stepper system. The scanner system is typically used to manufacture sixth generation of later flat panel displays that are made with much larger substrate size.

FIGS. 1c-1e illustrates different ways a mask may be held in conventional exposure tools, and manners to align the mask for exposure. In FIG. 1c, the mask 130 is held in contact with the substrate wafer 132 and is commonly referred to as a contact aligner system; while in FIG. 1d, the mask 130 is held in proximity of the substrate wafer 132 and is commonly referred to as a proximity aligner system. The conventional contact aligner system and the proximity aligner system are typically used in manufacturing of printed circuit boards, touch panels (25-40 um), light emitting diodes (3-5 um), and solar panels (>100 um). Some of the drawbacks of the contact aligner and proximity aligner systems are that they have problems handling high resolution designs and warped wafers or substrate larger than 4 inches in size.

FIG. 1e illustrates a conventional projection aligner system, where there is a projection lens 131 between the mask 130 and the substrate wafer 132. It is typically used in manufacturing of circuits in the range of 5-10 um. Such a projection aligner is more suited with the use of large-sized mask for making color filters in flat panel displays. The drawback is that such large-sized masks are quite expensive. Therefore, the projection aligner system is not cost efficient for manufacturing of printed circuit boards, and light emitting diodes where substantial mask cost is less tolerable.

FIG. 2 illustrates a conventional mask making exposure tool configuration. In this exposure tool configuration, illumination light 202 is sent to a beam splitter 204 and then partially reflected to illuminate the spatial light modulator (SLM) 206 through a Fourier lens 208. Then, the imaging light rays reflected back, pass through the Fourier lens 208, the beam splitter 204, the Fourier filter 210 and the reduction lens 212, and finally reach to the mask blank substrate 216. Mask data 214 is sent to the SLM 206 electronically to set the micro-mirror pixels. The reflected light produce bright spots on the mask blank substrate 216, or otherwise absence of reflected light would produce dark spots on the mask blank substrate 216. By controlling and composing the reflections, mask data patterns can be transferred to the mask blank substrate 216.

Note that for this type of exposure tool configuration, the illumination light path is folded in order to illuminate the SLM at a right angle incidence. This folded illumination path makes a "T" joint to the exposure imaging path. In addition to high power illumination source, this type of exposure system requires using projection lens with high reduction ratio in order to write mask pattern in high accuracy and precision. Typically, the lens reduction ratio is about 100 times. Using such a high reduction ratio of lens makes the exposure field very small with a single SLM die. The physical die size for SLM is in the neighborhood of 1 cm. After a 100-times reduction, the SLM writing field is reduced to around 100 microns. This writing field size is very small and therefore slow when attempting to write a full G8 FPD mask.

Another conventional approach is to use multiple laser beams to illuminate the SLM in succession. The multiple beams are generated by reflecting a single illumination laser source from multi-faced rotating mirrors. Multiple illumination beams speed up mask writing as they make multiple exposures at a given time. With this configuration, in one instance, the time for writing a G8 FPD mask takes nearly twenty hours. Such a long write time makes machine control expensive to sustain both mechanically and electronically, hence increases the cost of the FPD mask produced. Using the same exposure tool for the upcoming G10 or beyond, the cost of manufacturing FPD masks will be even higher.

In another conventional approach, to address the mask cost issue for low volume prototyping application, one exposure tool configuration is to make use of transparent SLM as the mask. This is done such that the mask pattern can be read into SLM to show desired mask patterns without the need to make a real physical mask. The function of such a transparent SLM mask takes place of the real mask. This saves the mask cost. From the exposure tool configuration perspective, this method is essentially the same as the mask-based projection system. Unfortunately, the SLM mask has lower image quality as compared to the image quality on an actual mask. It does not meet the pattern specification requirements for FPD manufacturing.

In yet another conventional approach, a process for roll-to-roll manufacture of a display by synchronized photolithographic exposure on a substrate web is described in U.S. Pat. No. 6,906,779 (the '779 patent). The '779 patent teaches a method to expose mask pattern on a roll of substrate. In addition, another conventional method for doing roll-to-roll lithography is described in the article "High-Speed Roll-to-Toll Nanoimprint Lithography on Flexible Plastic Substrates" by Se Hyun Ahn, etc., *Wiley-VCH Verlag GmbH & Co. KGaA, Weinheim; Advanced Materials* 2008, 20, page 2044-2049 (the Ahn article).

However, in both conventional methods described above, the mask is limited to a predetermined physical size, and the physical mask dimension essentially limits the dimension of the flexible display that can be manufactured. Another problem with the conventional methods described by the 779 patent and the Ahn article is that, to achieve a reasonable printing result, the roll of substrate must be stretched flat during the exposure stage. As a result, the surface flatness of the substrate is not as good as rigid glass substrate, typically used for LCD TV display. With such a mask-based lithography, the depth of focus (DOF) is limited due to uneven substrate surface. Thus, it can be very challenging for these conventional methods to pattern TFT feature critical dimension (CD) at 5 μm or less. To achieve decent definition display based on TFT, it is necessary to have CD for TFT mask pattern in the neighborhood of 3 μm.

The challenges discussed previously for the manufacturing of future generations of FPDs are driven by the need for cost reduction for the FPD industry. One key motivation is to achieve cost efficiency when the newer manufacturing generation is being adopted. Lithography process requires maintaining throughput efficiency while assuring product yield better than previous generations. This demands wider lithography process window and fewer process defects while contending with bigger FPD substrates. As discussed above, there are numerous shortcomings with the existing exposure tool configurations. One of the major shortcomings is associated with the use of a mask. The size of the mask is too large to be manufactured cost effectively. This shortcoming continues to grow as the size of the mask must increase in order to keep up with future generations of FPDs. Therefore, there is a need for an improved imaging writer system that addresses the issues of the conventional tools and approaches.

SUMMARY

The present invention relates to systems and methods for applying mask data patterns to substrate in a lithography manufacturing process. In one embodiment, the imaging system includes a plurality of spatial light modulator (SLM) imaging units, where each of the plurality of SLM imaging units includes one or more illumination sources, one or more alignment sources, one or more projection lenses, and a plurality of micro mirrors configured to project light from the one or more illumination sources to the corresponding one or more projection lens. The imaging system further includes a controller configured to control the plurality of SLM imaging units, where the controller tunes each of the SLM imaging unit individually in writing a mask data to a substrate in a lithography manufacturing process.

In another embodiment, a method for manufacturing a three-dimensional integrated circuits includes providing an imaging writer system that includes a plurality of spatial light modulator (SLM) imaging units arranged in one or more parallel arrays, receiving mask data to be written to one or more layers of the three-dimensional integrated circuit, processing the mask data to form a plurality of partitioned mask data patterns corresponding to the one or more layers of the three-dimensional integrated circuit, assigning one or more SLM imaging units to handle each of the partitioned mask data pattern, and controlling the plurality of SLM imaging units to write the plurality of partitioned mask data patterns to the one or more layers of the three-dimensional integrated circuits in parallel.

The method of assigning one or more SLM imaging units to handle each of the partitioned mask data pattern includes at least one of performing scaling corrections on the plurality of partitioned mask data patterns in accordance with the plurality of SLM imaging units, where each of the partitioned mask data pattern has a corresponding scaling correction; performing alignment corrections on the plurality of partitioned mask data patterns in accordance with the plurality of SLM imaging units, where each of the partitioned mask data pattern has a corresponding alignment correction; performing inter-ocular displacement corrections on the plurality of partitioned mask data patterns in accordance with the plurality of SLM imaging units, where each of the partitioned mask data pattern has a corresponding inter-ocular displacement correction; performing rotational factor corrections on the plurality of partitioned mask data patterns in accordance with the plurality of SLM imaging units, where each of the partitioned mask data pattern has a corresponding rotational factor correction; performing substrate deformation corrections on the plurality of partitioned mask data patterns in accordance with the plurality of SLM imaging units, where each of the partitioned mask data pattern has a corresponding substrate deformation correction. The method of controlling the plurality of SLM imaging units includes exposing a corresponding partitioned mask data pattern independent of other SLM imaging units in the image writer system for each SLM imaging unit.

In yet another embodiment, a method for manufacturing multiple designs on a printed circuit board (PCB) in parallel includes providing an imaging writer system having a plurality of spatial light modulator (SLM) imaging units arranged in one or more parallel arrays, providing a printed circuit board that is partitioned into multiple regions, and each region holds a design to be manufactured, receiving mask data to be written to the multiple regions of the printed circuit board, processing the mask data to form a plurality of partitioned mask data patterns corresponding to the multiple regions of the printed circuit board, assigning one or more SLM imaging units to handle each of the partitioned mask data pattern, where the assigning performs at least one of scaling, alignment, inter-ocular displacement, rotational factor, or substrate warpage correction, and controlling the plurality of SLM imaging units to write the plurality of partitioned mask data patterns to the multiple regions of the printed circuit board in parallel.

In yet another embodiment, a method of manufacturing using partial wafers includes providing an imaging writer system having a plurality of spatial light modulator (SLM) imaging units arranged in one or more parallel arrays, providing one or more partial wafers to be manufactured, receiving mask data to be written to substrates of the one or more partial wafers, processing the mask data to form a plurality of partitioned mask data patterns corresponding to the substrates of the one or more partial wafers, assigning one or more SLM imaging units to handle each of the partitioned mask data pattern, where the assigning performs at least one of scaling, alignment, inter-ocular displacement, rotational factor, or substrate warpage correction, and controlling the plurality of SLM imaging units to write the plurality of partitioned mask data patterns to the substrates of the one or more partial wafers in parallel.

In yet another embodiment, a method for manufacturing multiple light emitting diodes (LEDs) in parallel includes providing an imaging writer system that includes a plurality of spatial light modulator (SLM) imaging units arranged in one or more parallel arrays, providing one or more substrates corresponding to multiple LEDs to be manufactured, receiving mask data to be written to the one or more substrates corresponding to the multiple LEDs, processing the mask data to form a plurality of partitioned mask data patterns corresponding to the plurality substrates of the multiple LEDs, assigning one or more SLM imaging units to handle each of the partitioned mask data pattern, and controlling the plurality of SLM imaging units to write the plurality of partitioned mask data patterns to the plurality substrates of the multiple LEDs in parallel.

The method of processing mask data includes at least one of processing the mask data to form a plurality of partitioned mask data patterns corresponding to the plurality substrates of the multiple LEDs of a same design; and processing the mask data to form a plurality of partitioned mask data patterns corresponding to the plurality substrates of the multiple LEDs of different designs. The method of controlling the plurality of SLM imaging units includes at least one of detecting deformation at each local region of the substrate associated with each SLM imaging unit, and adjusting focus at each SLM imaging unit in response to the deformation at each local region of the substrate; detecting rotational errors at each local region of the substrate associated with each SLM imaging unit, determining rotational correction factors to the corresponding partitioned mask data pattern; and applying the rotational correction factors to the corresponding partitioned mask data pattern for each local region of the substrate associated with each SLM imaging unit; and detecting pattern distortions due to substrate deformation at each local region of the substrate associated with each SLM imaging unit, determining pattern correction factors to the corresponding partitioned mask data pattern, and applying the pattern correction factors to the corresponding partitioned mask data pattern for each local region of the substrate associated with each SLM imaging unit.

In yet another embodiment, a method for performing automatic optical inspection includes providing an imaging writer system having a plurality of spatial light modulator (SLM) imaging units arranged in one or more parallel arrays, providing one or more patterned substrates for inspection, partitioning the one or more patterned substrates to a plurality of regions, receiving reference mask data corresponding to the one or more patterned substrates, processing the reference mask data to form a plurality of partitioned mask data patterns corresponding to the plurality of regions of the one or more patterned substrates, capturing information of the plurality of regions of the one or more patterned substrates using the plurality of SLM imaging units, analyzing information of the plurality of regions with respect to the corresponding plurality of partitioned mask data patterns to generate inspection results, and storing the inspection results in a memory device.

The method of analyzing information of the plurality of regions includes inspecting for discrepancies between the plurality of regions of the one or more patterned substrates and the corresponding plurality of partitioned mask data patterns, and identifying one or more regions of the one or more patterned substrates for repair in response to the discrepancies found in the one or more regions of the one or more patterned substrates.

The method of inspecting for discrepancies includes at least one of inspecting for substrate pattern distortions between the plurality of regions of the one or more patterned substrates and the corresponding plurality of partitioned mask data patterns, and identifying one or more regions of the one or more patterned substrates for repair in response to the substrate pattern distortions found in the one or more regions of the one or more patterned substrates; inspecting for unwanted extra circuit elements on substrates of the plurality of regions of the one or more patterned substrates, and identifying one or more regions of the one or more patterned substrates for repair in response to the unwanted extra circuit elements found in the one or more regions of the one or more patterned substrates; inspecting for missing circuit elements on substrates of the plurality of regions of the one or more patterned substrates, and identifying one or more regions of the one or more patterned substrates for repair in response to the missing circuit elements found in the one or more regions of the one or more patterned substrates; and inspecting for foreign particles on substrates of the plurality of regions of the one or more patterned substrates, and identifying one or more regions of the one or more patterned substrates for repair in response to the foreign particles found in the one or more regions of the one or more patterned substrates.

The method of performing automatic optical inspection further includes re-coating photoresist on substrates of the one or more regions of the one or more patterned substrates identified for repair, performing pattern reconstruction on the one or more regions of the one or more patterned substrates identified for repair, re-inspecting the one or more regions of the one or more patterned substrates identified for repair using the plurality of SLM imaging units, and updating the inspection results in accordance with information obtained from re-inspection.

The method of performing automatic optical inspection further includes re-coating photoresist on substrates of the plurality of regions of the one or more patterned substrates, performing pattern reconstruction on the plurality of regions of the one or more patterned substrates, re-inspecting the plurality of regions of the one or more patterned substrates using the plurality of SLM imaging units, and updating the inspection results in accordance with information obtained from re-inspection.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

FIGS. 1a-1e illustrate various conventional exposure tools used in manufacturing integrated circuits, printed circuit boards, and flat panel displays.

FIG. 5 illustrates an exemplary specular state and diffraction state of a grating light valve (GLV) device according to embodiments of the present invention.

FIG. 6 illustrates an example of a compact SLM imaging unit according to embodiments of the present invention.

FIG. 7 illustrates an exemplary parallel array of SLM imaging units according to embodiments of the present invention.

FIGS. 26a-26b illustrate methods to stitch adjacent imaging areas using an overlapping region according to embodiments of the present invention.

FIG. 30 illustrates a method of multi-wafer direct imaging according to embodiments of the present invention.

FIG. 31 illustrates another method of multi-wafer direct imaging according to embodiments of the present invention.

FIGS. 32c-32d illustrates methods of direct imaging designs having different shapes according to embodiments of the present invention.

FIGS. 33a-33b illustrate methods of maskless manufacturing according to embodiments of the present invention.

Like numbers are used throughout the specification.

DESCRIPTION OF EMBODIMENTS

System and method are provided for manufacturing 3-D integrated circuits. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Embodiments of the present invention use spatial light modulator (SLM) based image project devices. Two types of SLM based image projection may be used, one is the digital micro-mirror device (DMD) and the other is the grating light valve (GLV). Both types of devices may be produced by using micro-electro-mechanical (MEM) manufacturing methods.

Figure 3:
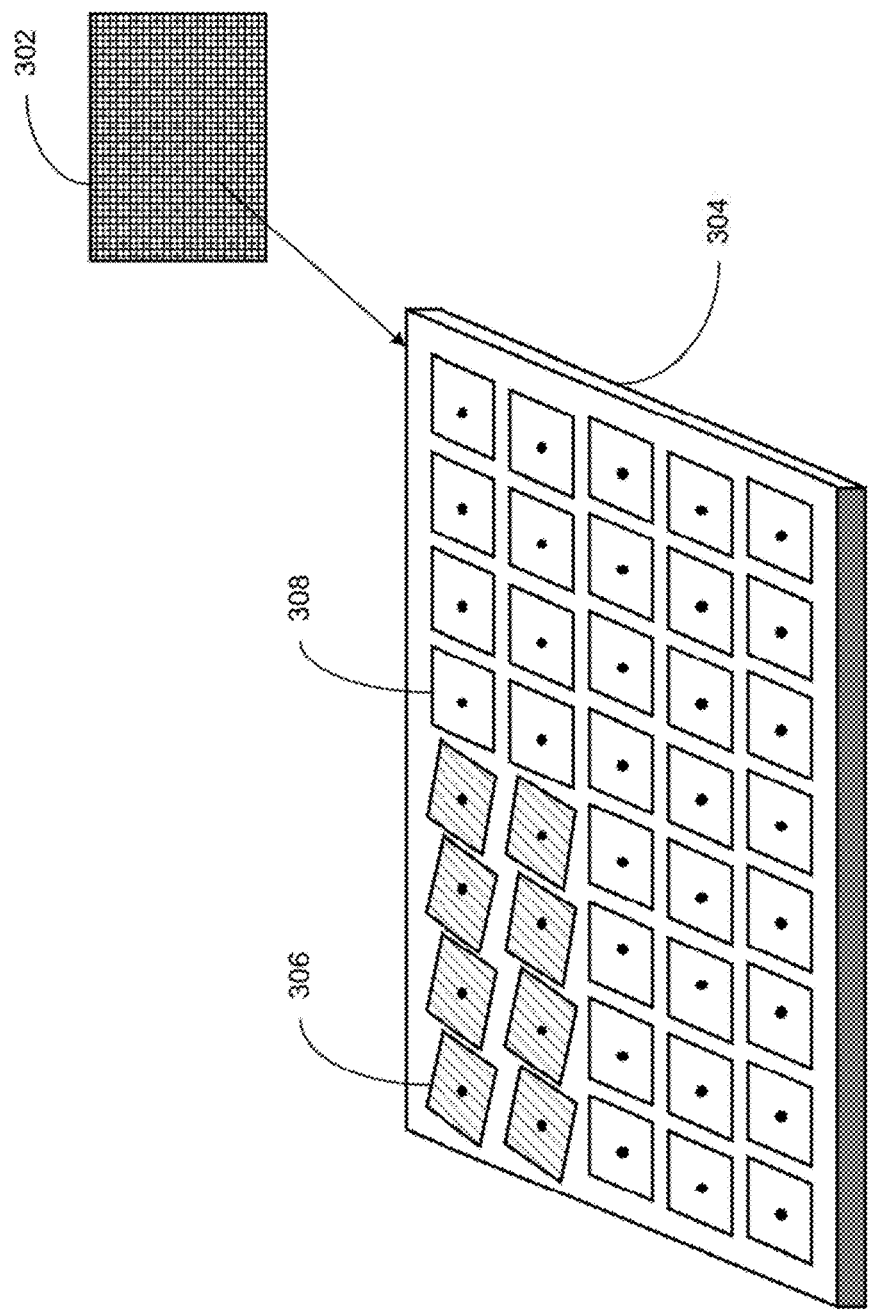
FIG. 3 illustrates an exemplary digital micro-mirror device according to embodiments of the present invention.

FIG. 3 illustrates an exemplary digital micro-mirror device according to embodiments of the present invention. In this example, a single DMD die is represented by numeral 302 and an enlarged and simplified view of the same DMD die is represented by numeral 304. DMD can be addressed by tilting micro-mirrors in fixed angles, typically around ±10° or ±12°, to act as spatial light modulator (SLM). The mirror surface of DMD is highly reflective to the incident illumination. Each micro-mirror can be manipulated to tilt (represented by numeral 306) or left un-changed (represented by numeral 308) by the transistor controller underneath. In one implementation, DMD may have pitch dimension of about 14 µm with about 1 µm space between each micro-mirror. The pixel count on a single DMD die may be 1920×1080 mirror pixels, compatible to high definition television (HDTV) display specifications.

Figure 4:
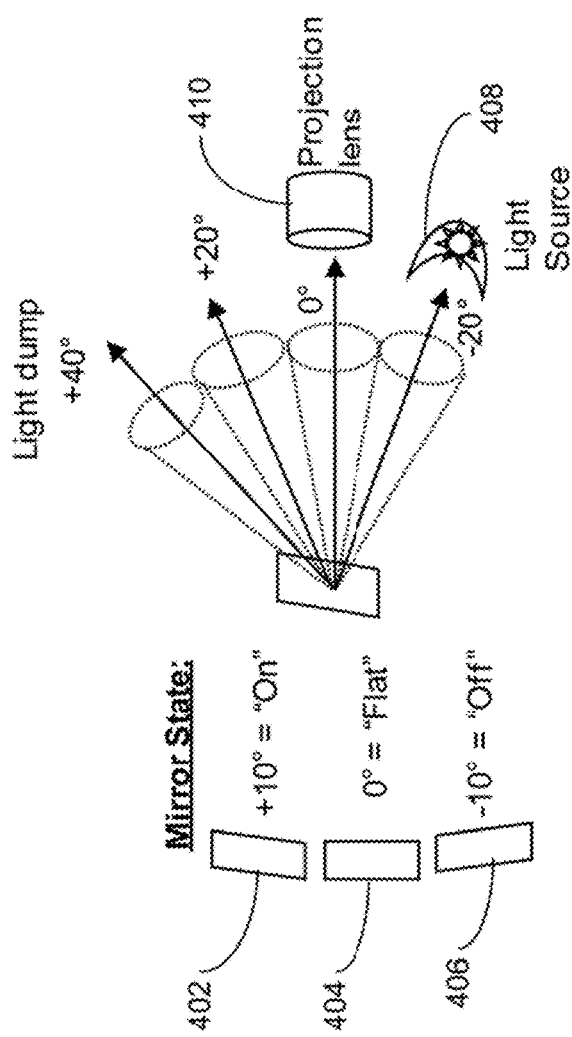
FIG. 4 illustrates a DMD-based projection system according to embodiments of the present invention.

FIG. 4 illustrates a DMD-based projection system according to embodiments of the present invention. In this example, the micro-mirror has three states: 1) "On" State 402 at about +10° tilting angle, 2) "Flat" State 404 at no tilt, and 3) "Off" State 406 at about −10° tilting angle. When a ray of light beams shine from a light source 408 located at −20° angle to the DMD, they can reflect light beams directly to pass through projection lens 410 to form bright spots on the display substrate, for the mirrors that are at "On" State or "1" in binary. For mirrors that are at "Flat" State and "Off" State, or the "0", the light beams reflected in an angle falling outside of the collection cone of the projection lens, at approximately −20° and −40° respectively. Hence no light pass though from those mirror sites, dark spots are then formed on the display substrate. Since each of micro-mirror reflection cannot be visually resolvable by human eyes, a gray shade can be constructed by combining a group of light and dark spot pixels in a ratio when projected. This method enables the projection of realistic images with million shades of grays and colors.

Note that the higher diffraction orders of diffraction beam from the "Flat" State and the $2^{nd}$ order of diffraction beam from the "Off" State can still fall within the collection cone angle of the projection lens. This may create unwanted flare that reduces the desire image contrast. According to embodiments of the present invention, a precisely aimed and focused high intensity illumination source may be used to increase the pixel diffraction efficiency to optimize the design of the projection optics using DMD for imaging writer.

According to other embodiments of the present invention, GLV is another approach for implementing image projection. The top layer of GLV device is a linear array of materials, also referred to as ribbons, which are highly reflective. In one embodiment, ribbons may be 100-1000 m long, 1-10 μm wide and closely spaced by 0.5 μm. The imaging mechanism of GLV is essentially addressable dynamic diffraction grating. It functions as a phase modulator. A GLV device may include a group of six alternative ribbons deflected to form dynamic diffraction grating.

FIG. 5 illustrates an exemplary specular state and diffraction state of a GLV device according to embodiments of the present invention. When the GLV ribbons (in cross-sectional view) are co-planar (represented by numeral 502), the incident light is reflected specularly, i.e. all in the $0^{th}$ diffraction order. When incident light shines on a group of ribbons, where ribbons are deflected in an alternating fashion (represented by numeral 504), and a diffraction pattern is formed with strong $\pm 1^{st}$ orders but with suppressed $0^{th}$ order. A high contrast reflection image can be constructed by filtering out either $0^{th}$ or $\pm 1^{st}$ orders. That is, no image may be formed if to re-capture all of $0^{th}$ or $\pm 1^{st}$ orders in the objective lens. Unlike DMD, the entire image in a field of view as formed by GLV is based on scanning line by line since there may be one line of diffraction images are formed by the linear array of grating ribbons at one time.

Figure 1B:
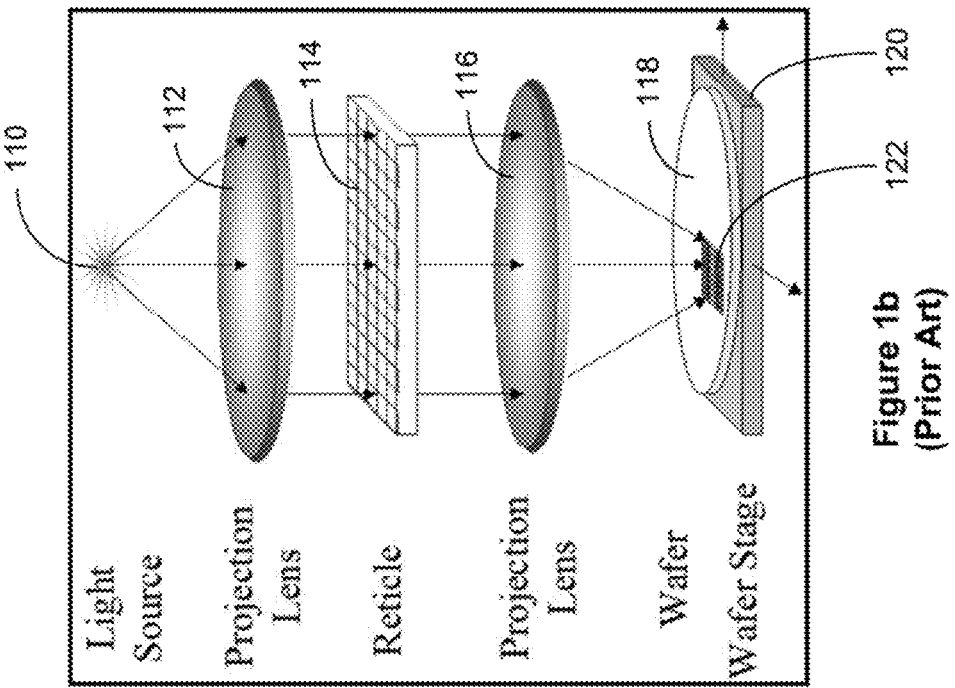
Figure 1A:
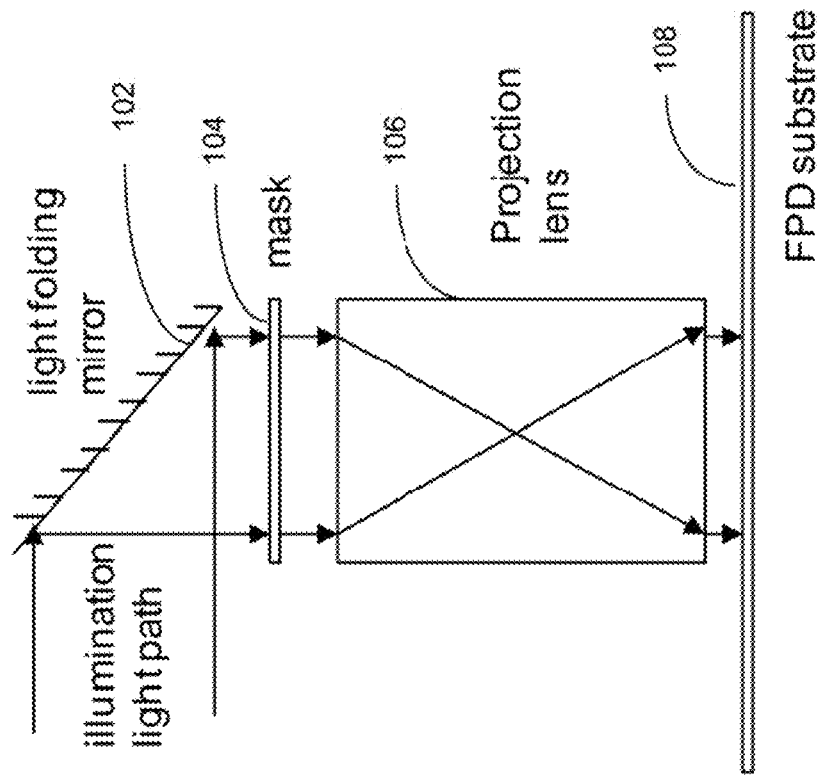
Figure 2:
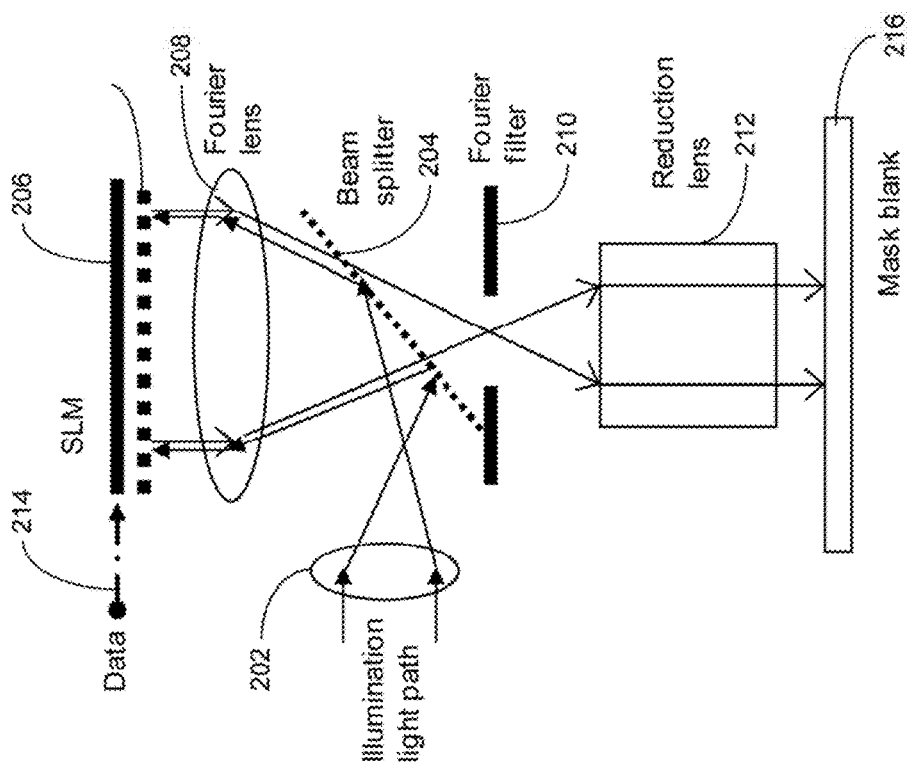
FIG. 2 illustrates a conventional mask making exposure tool configuration.

As discussed in association with FIG. 1 and FIG. 2, in order to achieve the throughput requirements, high powered illumination sources for the conventional systems are necessary. In one example, high pressure Hg short-arc lamp in the kilo-Watts range is used. Another example is to use high powered Excimer laser. Due to the use of high power illumination sources, the illumination light path needs to be directed from a distance to reduce the heat generated and then be folded for a right illumination. This type of configuration separates the illumination and SLM imaging system into two separate units and the light path and the lens are perpendicular to each other.

To address the limitation of the conventional systems and approaches, the improved exposure tool configuration reduces the need to use high-powered illumination sources. An in-line imaging system is configured where each of the imaging unit includes the SLM, the illumination sources, the alignment illumination, the electronic control, and the imaging lens. This system may have a lower exposure throughput when using low powered LED and diode laser illumination sources. However, the exposure throughput may be increased by using a larger number of imaging units. One of the benefits of using a compact SLM imaging unit is that a scalable array of such units may be packed for different imaging applications. In one application example, when arrayed with more than 1000 such compact SLM imaging units, the writing throughput exceeds the existing multi-wavelength, mask-based exposure tool configuration.

FIG. 6 illustrates an example of a compact SLM imaging unit according to embodiments of the present invention. In this example, the compact SLM imaging unit includes a spatial light modulator 602, a set of micro-mirrors 604, one or more illumination sources 606, one or more alignment light sources 608, and a projection lens 610. The illumination source 606 may be implemented with LED or diode laser having wavelength less than 450 nm with blue light or near UV. The alignment light source 608 may be implemented with a non-actinic laser source or LED for through-the-lens focus and alignment adjustment. The projection lens 610 may be implemented with a lens having a 5× or 10× reduction. As shown in FIG. 6, the illumination sources 606 and the alignment light source 608 are all placed outside of the collection cone angle of the projection lens. In this exemplary implementation, off-the-shelf projection lenses with numerical aperture NA of 0.25 at resolving power of about 1 μm may be used. The relatively low NA ensures better depth of focus (DOF). In one lithography process example, using NA of 0.25 for 1 μm photo resist CD target, the DOF may be >5.0 μm. The resolution and DOF calculations are based on Rayleigh criterion:

$$\text{Minimum feature resolution} = k_1(\lambda/NA)$$

$$DOF = k_2(\lambda/NA^2)$$

where, $k_1$ and $k_2$ are process capability factors. According to an implementation of lithography manufacturing process based on Novolak chemistry photoresist, $k_1$ is in the range from 0.5 to 0.7, $k_2$ is from 0.7 to 0.9, and $\lambda$ refers to the exposure wavelength.

In order to fit a compact form factor, illumination sources may be blue, near UV LED, or semiconductor diode laser. To get sufficient intensity, in one design example, the illumination sources are placed close to the SLM surface and there may be multiple illumination sources placed surrounding the SLM. The SLM may be DMD or GLV with proper optical lens design matched to each. In one example, the targeted intensity level at the substrate may be between 10-100 mW per square centimeter of the actinic exposure wavelength.

In this exposure tool configuration example, the housing for the electronic control boards for each compact imaging system conforms to a specified compact factor. It is located on the top of the SLM, away from the illumination sources. This facilitates ventilation and heat dissipation. The physical dimension for a single compact SLM imaging unit depends on the required imaging performance and the available components use off-the-shelf supply, such as the projection lens, LED or diode laser illumination sources, and focus/alignment diode laser, each with required room for heat dissipation. Another approach is to have custom design for the components so that the physical dimension for a single SLM imaging unit can be trimmed to an even more compact form. A custom designed SLM imaging unit may have a dimension of approximately 5 cm×5 cm in 2D cross-section compared to a dimension of approximately 10 cm×10 cm using off-the-shelf supply.

For the G10 FPD manufacturing, a typical substrate size is 2880 mm×3130 mm. Using the physical dimension of compact SLM imaging lens, a system may include hundreds of compact SLM imaging units arranged into an array of parallel imaging units. FIG. 7 illustrates an exemplary parallel array of SLM imaging units according to embodiments of the present invention. In this example, the image writing can be performed by 600 to 2400 parallel arrays of SLM imaging units (702, 704, 706, 708, etc.) simultaneously and each parallel array may includes multiple SLM imaging units.

According to embodiments of the present invention, the exposure throughput may be determined using a known example throughput of a SLM mask writer, such as 20 hours for the mask size of 1300 mm×1500 mm, may be used as a starting point. Throughput depends on the intensity level at the substrate plane. In this approach, for the intensity level of 50 mW per square centimeter, achievable with LED or diode laser sources, and for the nominal exposure energy of 30 mJ/sq-cm-sec, the exposure time is approximately 0.6 seconds. In another approach, where the exposure tool uses high-powered illumination source, the intensity level at the substrate is at least 200 mW per square centimeter or higher. The throughput for such a mask-based stepper/scanner system is about 50 G8 FPD substrate plates per hour. By taking into account of both high-powered and low-powered illumination sources, the throughput estimation in one example is from 25 to 100 substrates per hour, depending on the density of parallel SLM imaging units used in the array. This shows that such an array parallel exposure configuration is competitive economically.

Figure 8:
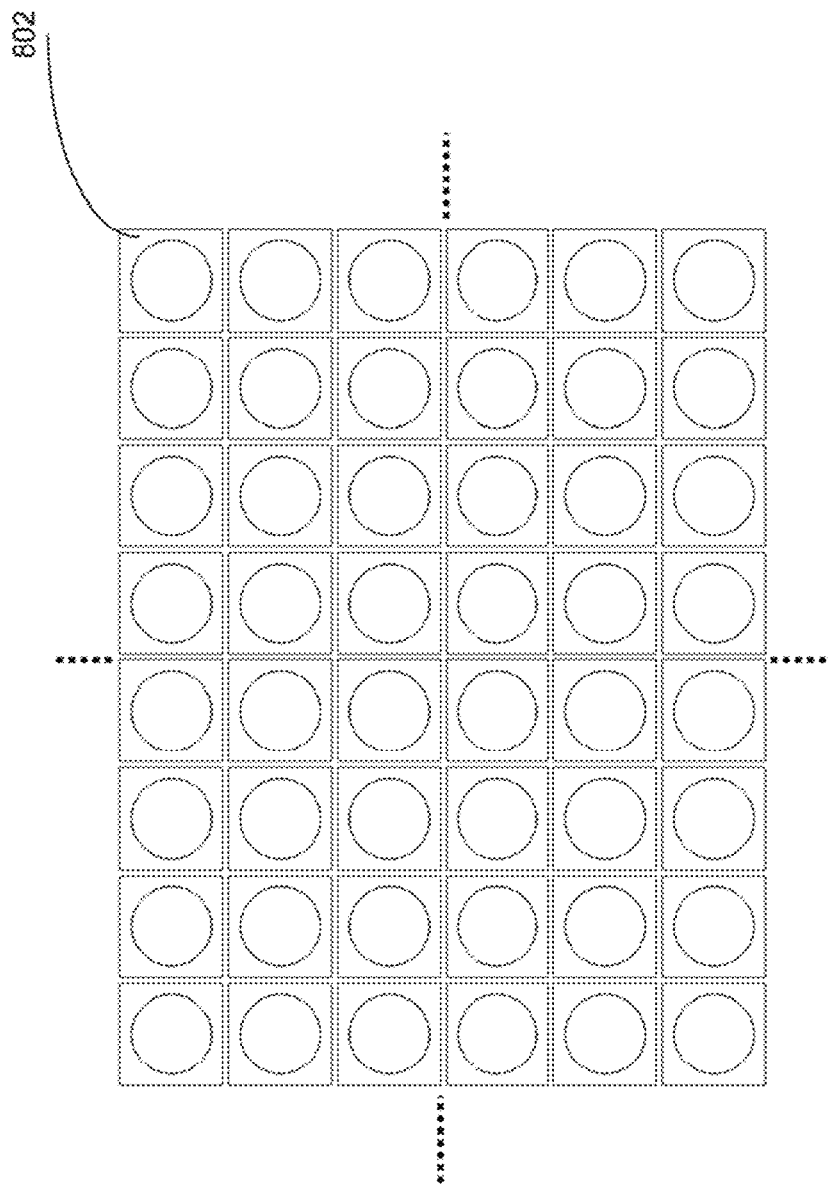
FIG. 8 illustrates the corresponding top-down view of the parallel array of SLM imaging units of FIG. 7 according to embodiments of the present invention.

FIG. 8 illustrates the corresponding top-down view of the parallel array of SLM imaging units of FIG. 7 according to embodiments of the present invention. In this example, each row or column may represent a parallel array of SLM imaging units, and each parallel array may include multiple SLM imaging units 802. Lithography manufacturing yield is directly related to process window. Here process window refers to the range focus settings in conjunction with the range of exposure dose settings that can print feature CDs within the specifications. That is, for a more robust process window, it can tolerate wider defocus settings and/or exposure dose settings. A wider process window may produce a better product yield. With bigger substrate for each newer generation, lithography window becomes smaller. This is mainly due to the more tendencies for larger and thinner substrate material to warp or sag. To address this issue, the solution calls for tightening thickness and surface uniformity specifications for substrate material. For mask-based exposure tool, maintaining uniformity and focus control over an exposure field that is larger than about two meters in one side is not only very expensive but also technologically challenging. To assure a workable process window, exposure tool need to be able to optimize focus and illumination in both local and global fashions.

As shown in FIG. 8, this array parallel exposure system addresses the issues discussed above. This is because each of the compact SLM imaging units can be optimized locally for better illumination and focus corresponding to its own exposure area. That ensures a better process window in each exposure area of the SLM imaging unit. The entire process window is then improved globally using optimized contributions from the SLM imaging units.

Figure 9:
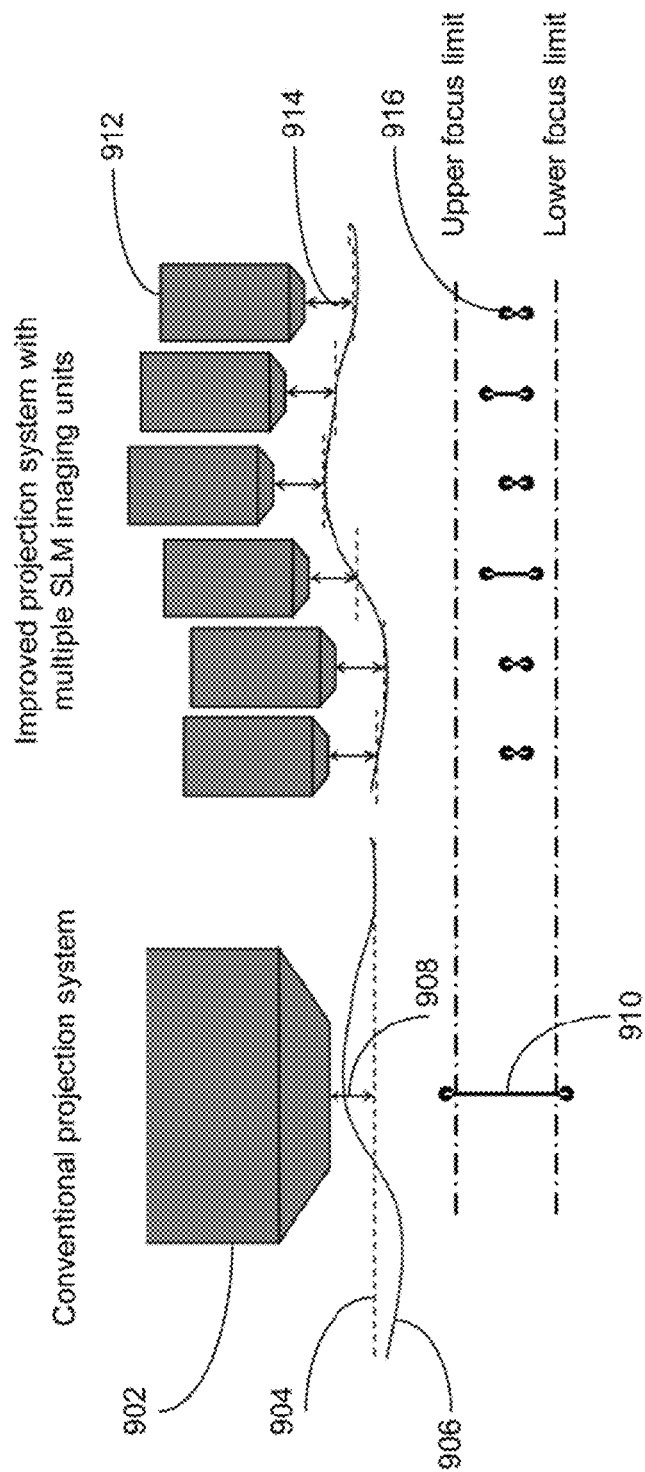
FIG. 9 illustrates a comparison of a conventional single lens projection system versus the localized process window optimization using the arrayed imaging system according to embodiments of the present invention.

FIG. 9 illustrates a comparison of a conventional single lens projection system versus the localized process window optimization using the arrayed imaging system according to embodiments of the present invention. On the left hand side of FIG. 9, the conventional single lens projection system 902 must be tuned to a compromised focal plane 904, as shown in dotted line. The solid line 906 represents the actual surface contour of the substrate in cross-sectional view. The double arrow 908 indicates the best focus setting corresponding to a single lens that is used to image the pattern. The lines with round heads 910 represent the maximum contour range correspond to each imaging lens and the dot-dashed lines indicate the upper and lower limits of the focus range.

As shown in FIG. 9, for the conventional single lens projection system, the large-sized substrate curvature may have already exceeded the focus range of the lens. The center of focus may be only marginally acceptable with respect to both of the peak and valley curvatures in the substrate. The overall process window becomes limited. On the other hand, the right hand side of FIG. 9 shows an improved projection system with imaging units arranged in an array. The focus 914 of an imaging unit 912 can be tuned individually for each localized area covered. As a result, each focus setting can be placed well within the focus control limits as represented by the lines 916. In addition to the ability to fine tune focus in each of the local area covered, the illumination of each imaging unit may also be adjusted to achieve a better uniformity compared to the adjustment may be performed by a single lens system. Therefore, a more robust process window is achieved by using the arrayed imaging unit system.

Figure 10:
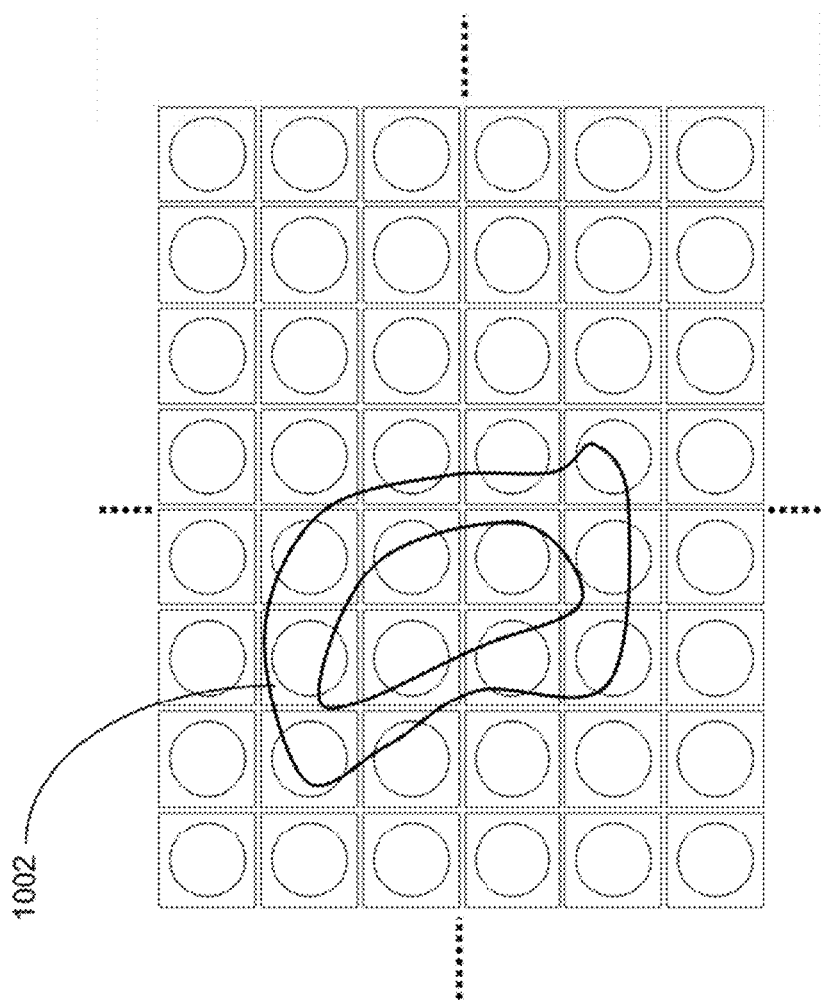
FIG. 10 illustrates a method for optimizing localized unevenness in substrate according to embodiments of the present invention.

FIG. 10 illustrates a method for optimizing localized unevenness in substrate according to embodiments of the present invention. In this example, region of uneven contours are detected in the substrate as indicated by numeral 1002. One method of tuning optimization is to apply a focus averaging scheme for the uneven local exposure areas that are associated with a SLM imaging unit as well as the surrounding areas associated with SLM imaging units in the neighborhood of the SLM imaging unit of interest. The more imaging units in the neighborhood of the uneven areas that can be included for averaging, the better globalized optimization can be achieved. A person skilled in the art would appreciate that other averaging techniques may be applied to the disclosed imaging system for the entire substrate plate to achieve a more uniform image globally across the whole substrate.

In one implementation, the mask data format for thin film transistor (TFT) based LCD display may be implemented as follows. Note that the hierarchical stream data format GDSII may be used for taping out mask data, but this type of mask data format may not be well-suited for this parallel SLM imaging system. To convert from hierarchal mask data to flat format, this can be done by using an off-the-shelf CAD software program. However, after flattened the mask data, further processing the mask data is needed. Mask data structure is used in conjunction with the arrayed parallel imaging writer system to produce higher quality images.

For the arrayed parallel imaging writer system, the mask data structure may be flattened and may be partitioned into pieces of a predefined size to properly or evenly feed to every SLM imaging unit. The mask data structure includes information that indicates the placement for each piece of mask data relative to its respective imaging unit. Moreover, the mask data structure includes information that specifies how features that span multiple imaging units will be divided among them. The data placement tuning can be recognized via the mask data structure that is related to the adjacent mask data areas from the adjacent imaging units.

Figure 11:
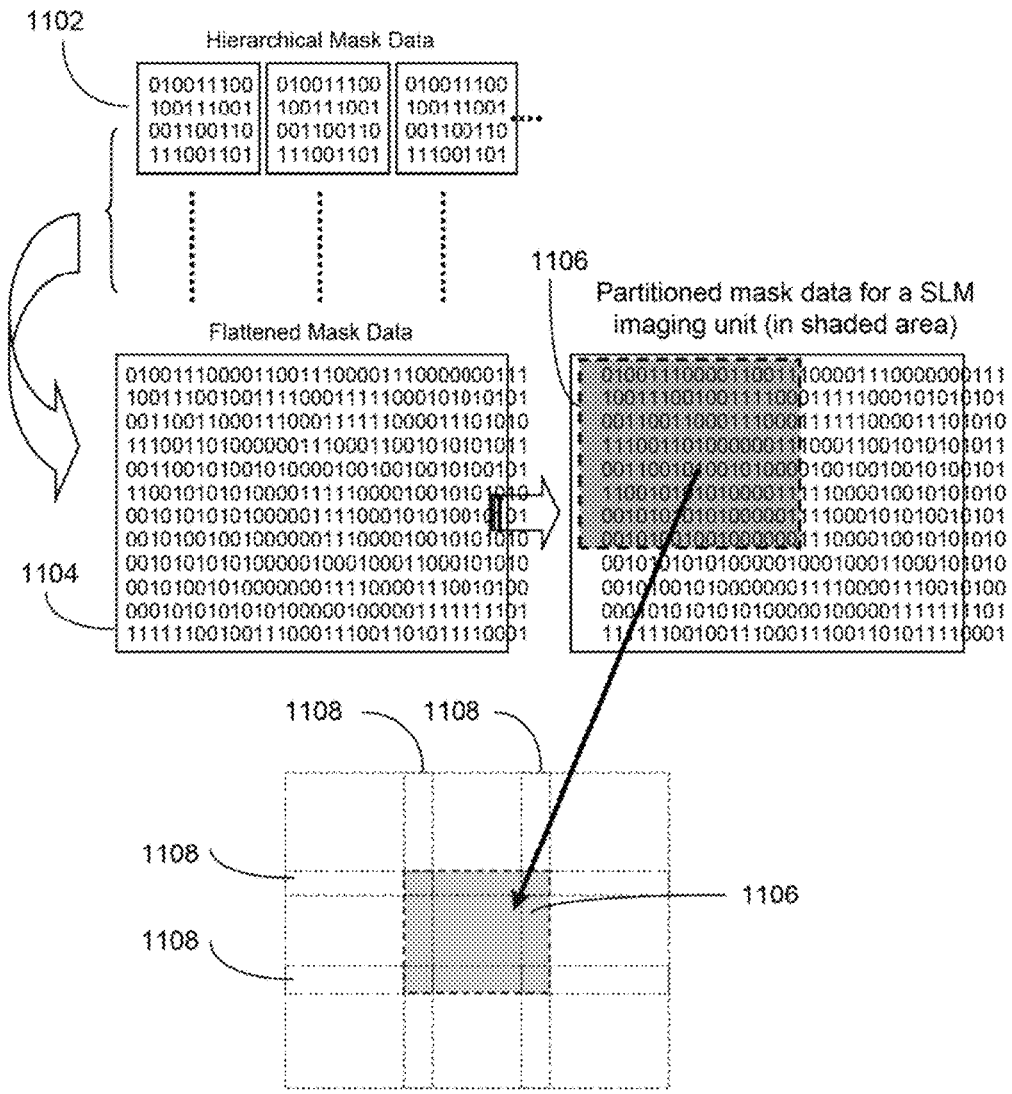
FIG. 11 illustrates an application of a mask data structure according to embodiments of the present invention.

FIG. 11 illustrates an application of a mask data structure according to embodiments of the present invention. In this example, a hierarchical description of a mask data in terms of multiple levels of mask data instances 1102 is first flattened to form a flattened mask data 1104. Then, the flattened mask data 1104 is partitioned into multiple partitioned mask data patterns. One such partitioned mask data pattern is shown as a shaded area 1106, which is also shown as the center block in the nine blocks (separated by dotted lines) at the bottom of FIG. 11. Sufficient mask patterning overlaps between the adjacent imaging units, shown as horizontal and vertical strips 1108, are needed to ensure uniform pattern blending around the borders, where each block represents a partitioned mask data to be imaged by one or more SLM imaging units. According to embodiments of the present invention, the partitioned mask data includes a first set of identifiers for identifying run-in conditions of mirror pixels within a SLM imaging unit and a second set of identifiers for identifying run-out conditions of mirror pixels within a SLM imaging unit. A run-in condition occurs where excessive pixels are found in an area between two SLM imaging units. A run-out condition occurs where insufficient pixels are found in an area between two SLM imaging units. Each partitioned mask data pattern is fed to its corresponding SLM imaging unit for processing, where each SLM imaging unit writes its associated partitioned mask data pattern in predetermined overlapped areas using adjacent SLM imaging units as references to ensure the imaging blending and uniformity meet design criteria. The partitioned mask data pattern may be optimized to enable parallel voting exposures for feature CD uniformity. In this case, a parallel voting exposure scheme is used in minimizing processing variables that may negatively impact CD uniformity. The elimination of Gaussian speckles due to the use of diode laser is accomplished by using sufficient number of micro-mirror pixel exposures for voting.

Figure 12:
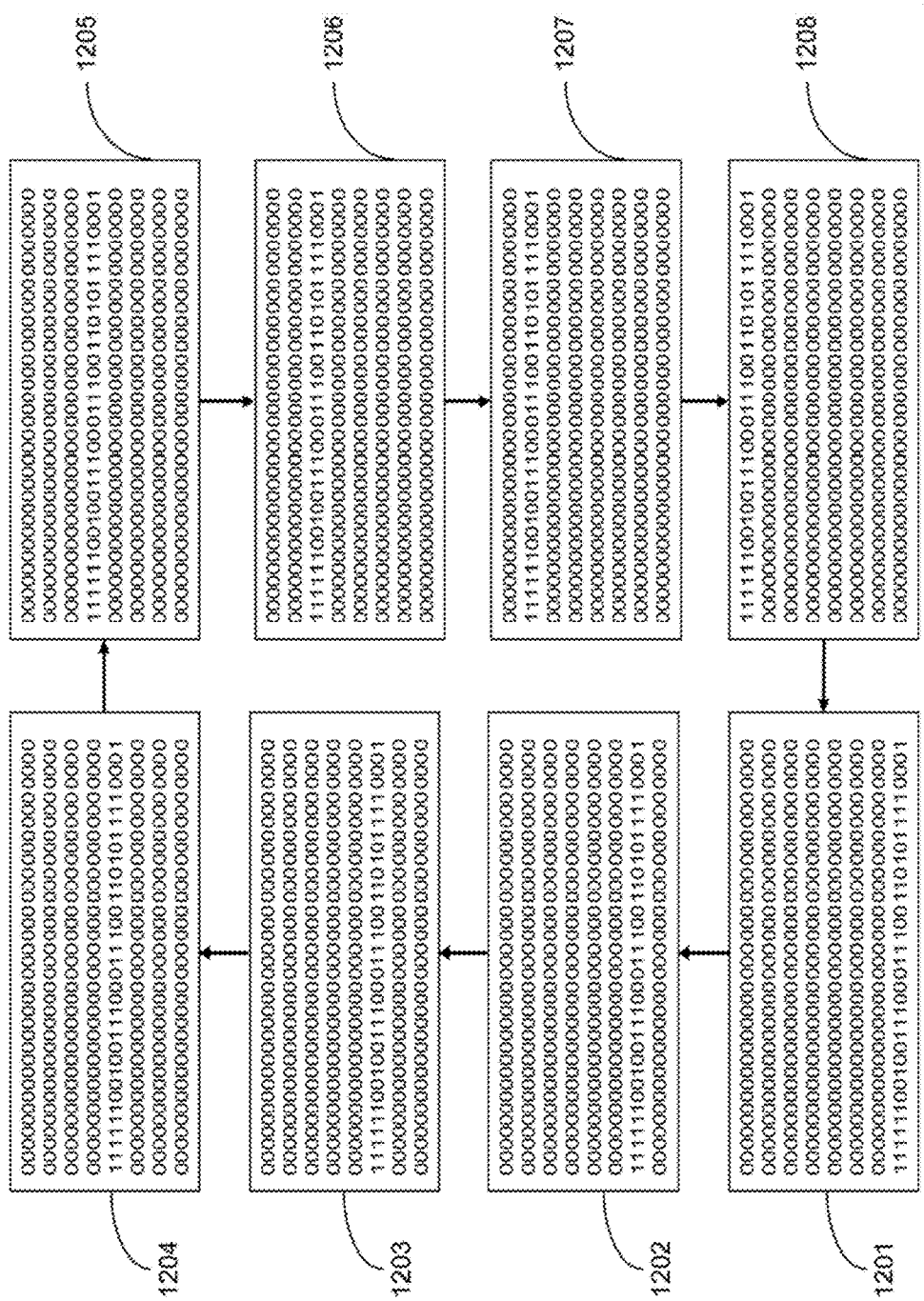
FIG. 12 illustrates a method of parallel array voting exposures according to embodiments of the present invention.

FIG. 12 illustrates a method of parallel array voting exposures according to embodiments of the present invention. The method first sends the mask data to each of SLM imaging unit in a row-by-row fashion, then to flash the row of micro-mirror pixels starting from one end of the row to the next until reaching the opposite end. In one example, the method starts with block 1201 and flashes the bottom row of micro-mirror pixels. It then moves block 1202 and flashes the second row from the bottom row of micro-mirror pixels. In block 1203, the third row from the bottom row of micro-mirror pixels is flashed. The method continues through blocks 1204, 1205, 1206, 1207 and flashes the corresponding row of micro-mirror pixels. And in block 1208, the method has traversed the last row of micro-mirror pixels (which is the top row) in this particular example. The same walking-row of micro-mirror pixels loops again and again from the start to the end. The looping of the walking-row corresponds to exposure actions for writing patterns on substrate. Because micro-mirror flashing rate is fast enough, the feature patterns are exposed by the fast moving walking-row numerous times until nominal exposures level is accumulated. Thus, such a pattern writing scheme is, in effect, done by voted exposures from numerous micro-mirror pixels. By moving substrate stage in a coordinated pace and orientation, the writing for entire substrate is carried out with the same voting exposure scheme.

The walking-row approach illustrated in FIG. 12 is one example of looping walking-row for making one style of parallel voting exposure locally or sub-locally for every imaging unit. In other embodiments, looping methods based on column or diagonal row/column may be used for effective parallel voting exposures. Additional voting schemes can be derived such as interlaced walking-rows from the two adjacent SLM imaging units or to use multiple walking orientations with several data rows, etc., may be employed to improve printing performance, although possibly at the expense of additional stage motion.

For array parallel exposure under heavy production environment, redundancy or fault-tolerance may be built-in to prevent production flow from interruption. That is, as the exposure control routine detects a failure of an SLM imaging unit, it then takes action to disable the problematic imaging unit, redistributes the mask data to one or more of the adjacent imaging units, and then has these adjacent imaging units complete the exposure tasks before unloading the exposed plate. This corrective exposure routine continues until the full batch-load of plates is done. The process continues until both the imaging performance and throughput hit are considered acceptable.

Figure 13:
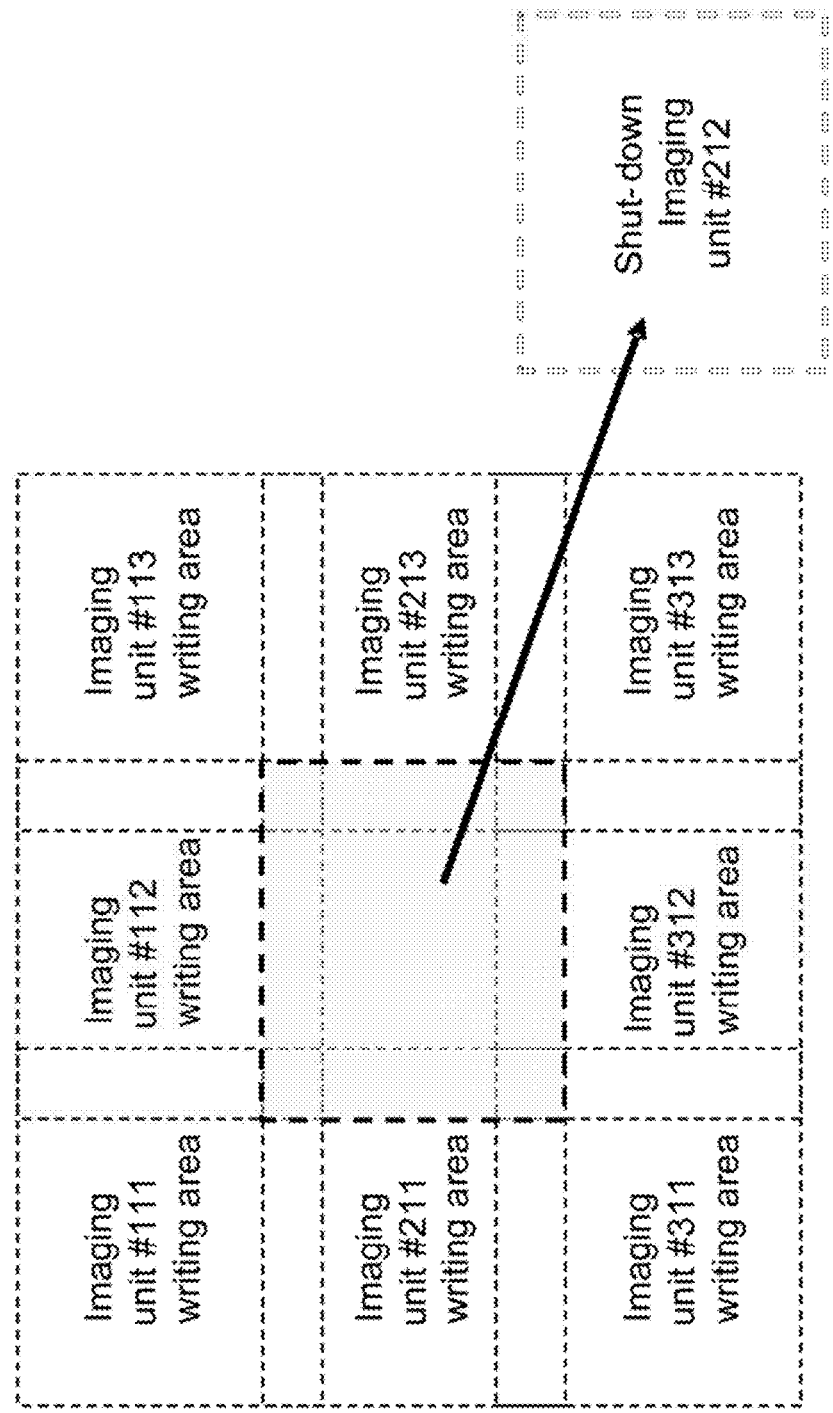
FIG. 13 illustrates a method for implementing redundancy in the imaging writer system according to embodiments of the present invention.

FIG. 13 illustrates a method for implementing redundancy in the imaging writer system according to embodiments of the present invention. In this example, after detecting that image unit 212 has malfunctioned, this unit is shut down. One of the 8 adjacent imaging units may be selected to take over. In this case, the writing for the unit 212 area is done after exposures of other areas have been accomplished.

Figure 14:
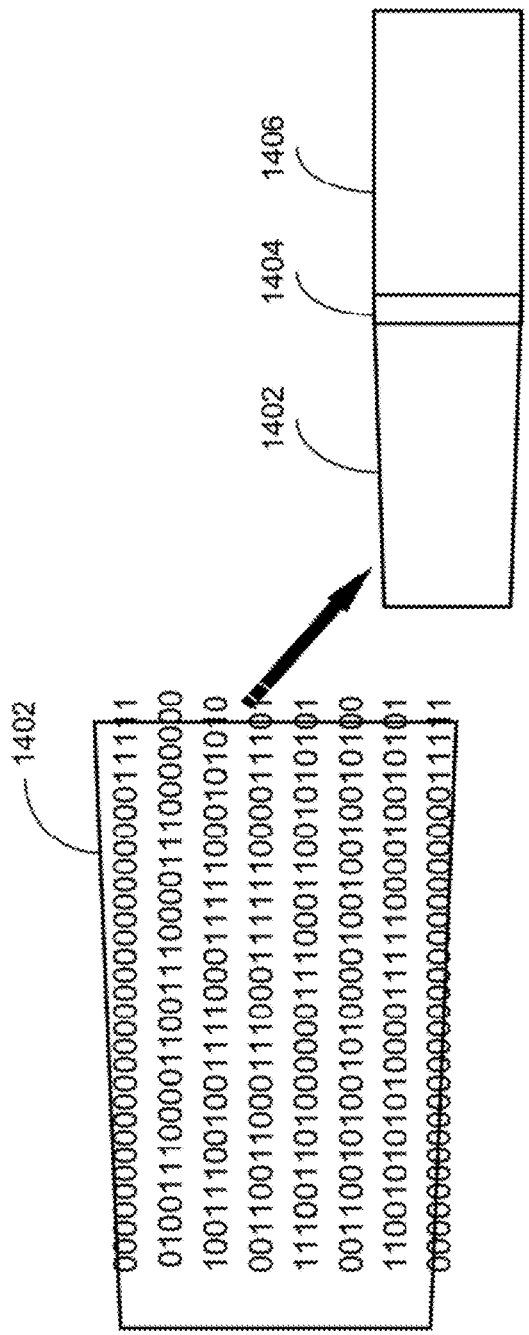
FIG. 14 illustrates the Keystone border blending method according to embodiments of the present invention.

Micro mismatched (local to local) borders from the two adjacent SLM imaging units can occur when imaging distortions result from substrate warping or sagging. This is represented by numeral 1402, where data patterns fall outside of the boxed area. In this case, the pattern blending in the overlapped areas needs to be optimized. FIG. 14 illustrates the Keystone border blending method according to embodiments of the present invention. As shown in FIG. 14, the method turns on micro-mirror pixels at the selected border end 1404 that allows better overlap matching to the adjacent imaging unit writing area 1406. Persons skilled in the art would appreciate that other approaches may be used to achieve border blending by turning on micro-mirror pixels selectively at desired sites.

According to some embodiments, blending may be performed by turning on selected micro-mirror pixels in alternate or complementary manner between the adjacent overlapping borders. According to yet some other embodiments of the present invention, mixing walking-row exposure voting action together with additional pixel turning at selected sites may be used to achieve better blending.

In order to achieve the intended alignment accuracy and precision for the array parallel imaging system, the method decomposes the alignment scheme into several accuracy precision levels in cascade. First alignment level is to aim for global alignment accuracy level, next is to narrow into intermediate level of accuracy precision. Using this bottom-up approach, the method achieves the desired accuracy precision level.

Figure 15:
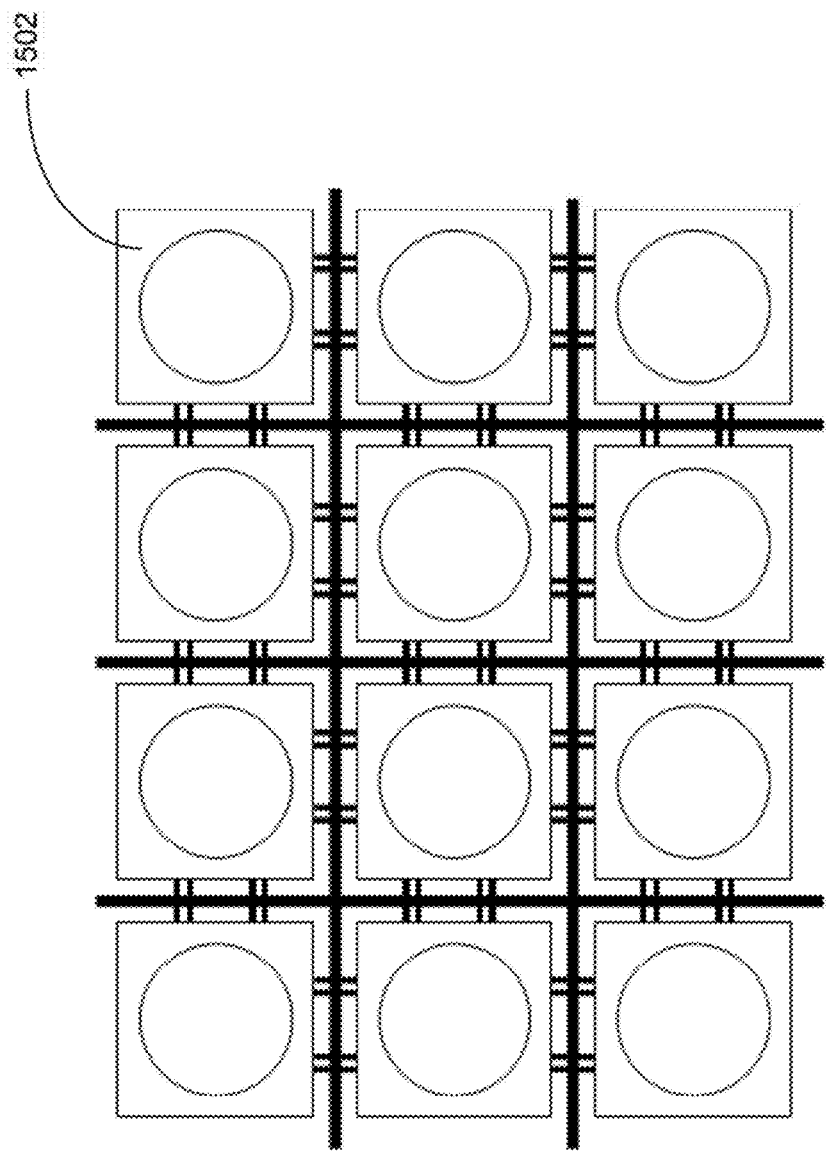
FIG. 15 illustrates a method for placing SLM imaging units in an array according to embodiment of the present invention.

In one approach, three accuracy precision levels are defined: the unit lens array placement, the lens center tuning, and the micro-mirror imaging data manipulation. FIG. 15 illustrates a method for placing SLM imaging units in an array according to embodiment of the present invention. This method provides global placement accuracy of the SLM imaging units 1502 in the millimeters range. Next, for each SLM imaging unit, the position of projection lens assembly is electronically tuned to precision in micrometer range. This is done by aligning the lens center using HeNe laser (or other non-actinic alignment light source) to a known reference position on the stage. Finally the micro-mirrors are controlled to achieve alignment requirements in precision of nanometer range.

According to embodiments of the present invention, the alignment process for making exposure may be carried out as follows:

1) Using a known reference site on the stage, the lens center for each SLM imaging unit in the array is first calibrated. This allows constructing a mathematical grid array points in reference to the physical lens array.

2) For the first masking layer, when there is no alignment marks printed, the plate alignment is done mechanically relying mainly on the stage precision.

3) When the substrate plate has alignment marks throughout the plate as printed from the previous masking layer, these alignment marks can be detected by the corresponding SLM imaging units. From this, a grid map is constructed in reference to the actual image locations that are on the substrate plate.

4) By comparing the two grid maps (SLM imaging unit vs. printed alignment marks detected from the substrate), build a grid map matching mathematical model for stage travel guide.

5) In one example, by considering 2400 array SLM imaging units for G10 substrate, the maximum stage travel distance is about 120 mm in either horizontal (X) or vertical (Y) direction. This is included for grid map matching calculation. Note that such a stage travel distance is rather small hence technologically advantageous compared to making the stage travels in full plate width and length required by using mask-based exposure tool for the G10. The G10 plate substrate can have a heavy mass. The shorter stage distance traveled while carrying such a heavy mass, the better system accuracy performance may be achieved.

6) To fine-tune sub-micron alignment accuracy, the method embeds the correction factors into the mask data that is being sent to the corresponding imaging unit. That is, the correction factors for every imaging unit may be different depending on the relative imaging locations on the substrate. They can also be different from plate to plate since the substrate warping condition may be different and may be detected ahead of the time before exposing each plate.

Figure 16:
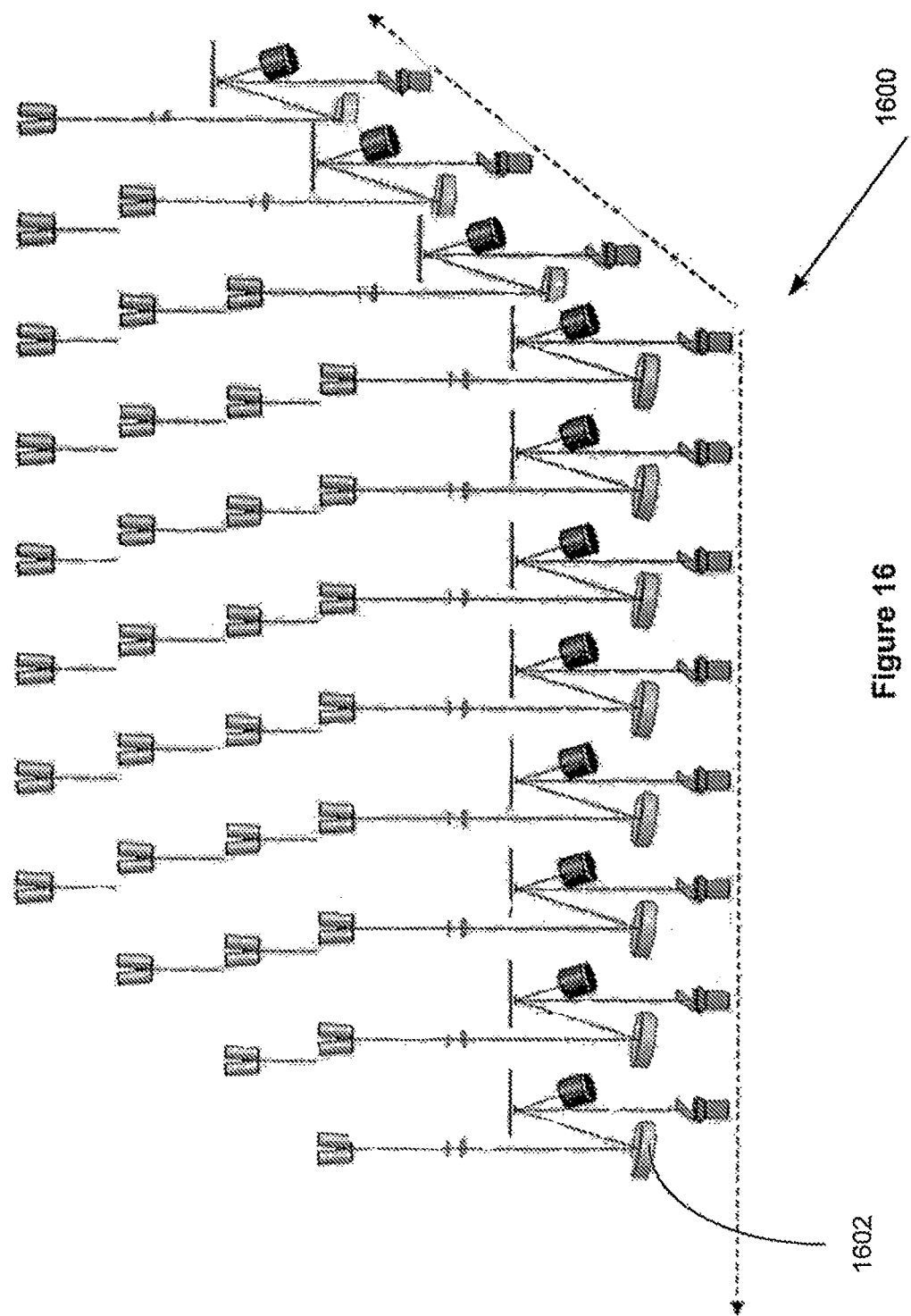
FIG. 16 illustrates an exemplary implementation of a maskless imaging writer system for making flexible display according to embodiments of the present invention.

FIG. 16 illustrates an exemplary implementation of a maskless imaging writer system for making flexible display according to embodiments of the present invention. As shown in FIG. 16 the maskless image writer system 1600 is formed by one or more arrays of SLM imaging units, where 1602 is an example of one of the SLM imaging units. The one or more arrays of SLM imaging units may be formed into a particular shape, for example circular, which may be required by a specific application. In another exemplary implementation, the maskless imaging writer system may be configured to make non-flexible displays.

Figure 17:
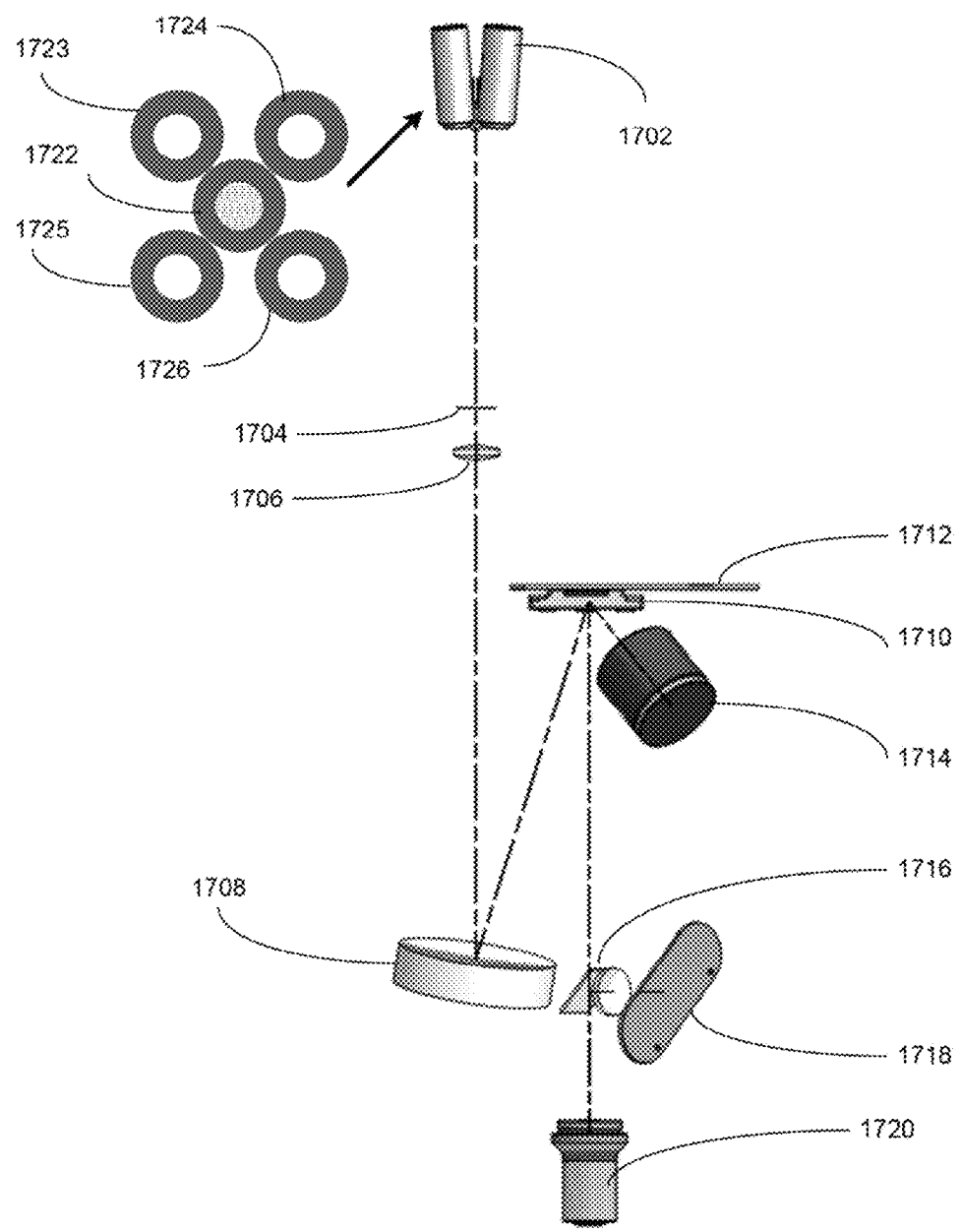
FIG. 17 illustrates a SLM imaging unit according to embodiments of the present invention.

FIG. 17 illustrates a SLM imaging unit according to embodiments of the present invention. The SLM imaging unit includes blue and red diode lasers 1702, an aperture 1704, a lens 1706, a spherical mirror 1708, a DMD 1710 mounted on a printed circuit board 1712, a beam dump 1714, a beam splitter 1716, a CCD camera 1718, and a lens assembly 1720. The blue and red diode lasers 1702 further includes a red laser diode (non-actinic) 1722 and four blue laser diodes (actinic) 1723, 1724, 1725 and 1726. The laser diodes may be arranged in the example as shown in FIG. 17. The center red laser diode is non-actinic and it is mainly used for alignment or catching for initial focus setting. The four blue laser diodes are actinic and they are used for making exposure. Depending on the physical size of the laser diode package, other types of arrangement using different numbers of laser diodes are possible as long as a uniform intensity can be achieved. In another approach, the actinic illumination can also be delivered via optical fiber bundles. In that, each laser diode shines on the one end of the optical fiber bundle and let fiber carry the actinic light to shine from the other end of the optical fiber bundle. In other embodiments, LEDs may be used instead of diode lasers. In this arrange example, the blue LEDs can be placed tightly together in such a way to achieve uniform intensity while multiple red LEDs can be placed in relative locations that may be configured to achieve alignment and initial focusing purposes. In this example, the blue and red diode lasers 1702 project light to the spherical mirror 1708 through the aperture 1704 and the lens 1706. The light is then reflected from the spherical mirror 1708 to the DMD 1710. According to the state of each mirror in the DMD, the light may be sent to the beam dump 1714, or to a substrate through the lens assembly 1720. The image thus created on the substrate reflects back upward through lens 1720 and beam splitter 1716 to CCD camera 1718.

Figure 18:
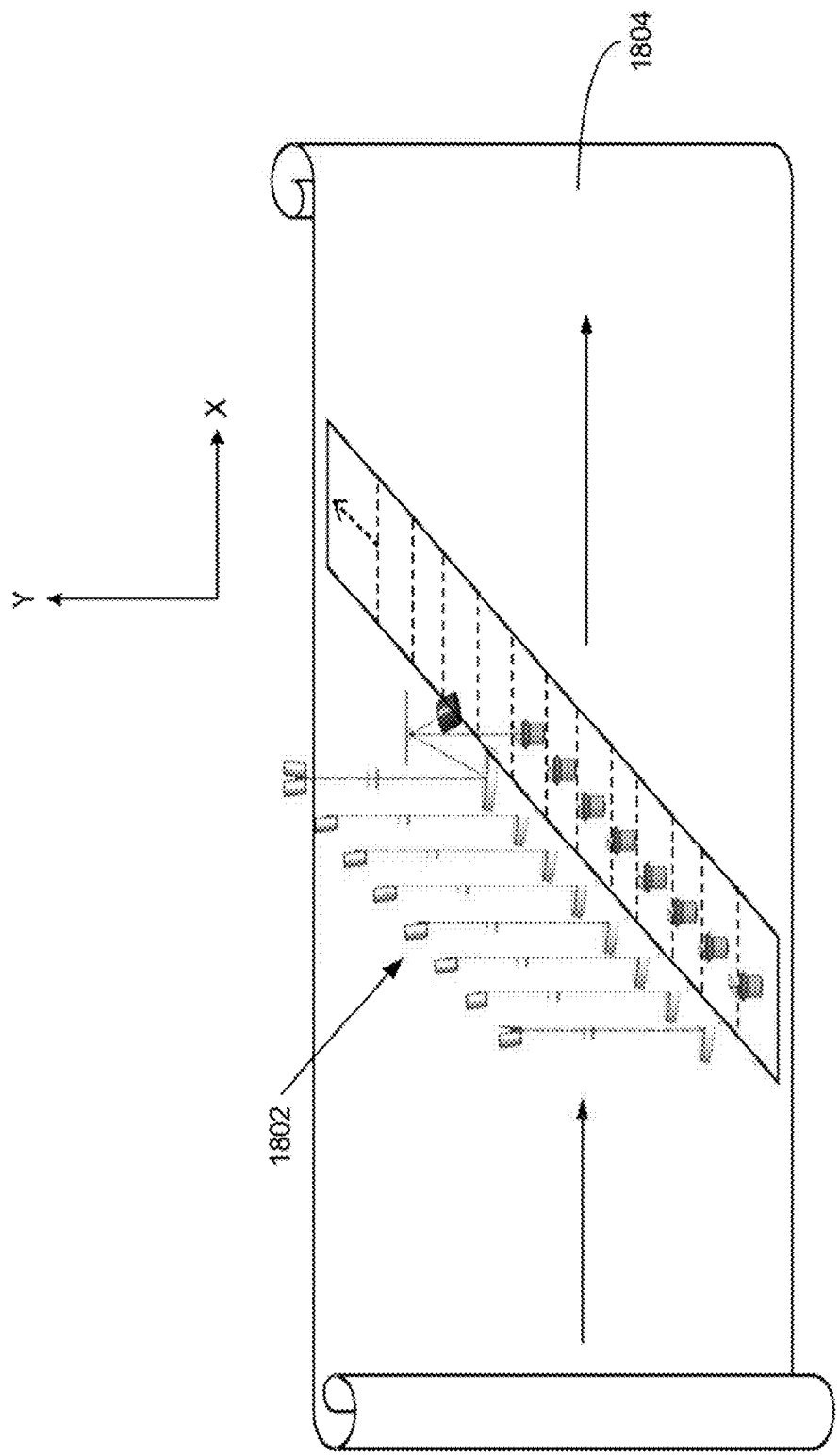
FIG. 18 illustrates a method of using a linear array of SLM imaging units for roll-to-roll maskless lithography according to embodiments of the present invention.

FIG. 18 illustrates a method of using a linear array of SLM imaging units for roll-to-roll maskless lithography according to embodiments of the present invention. In this example, the SLM imaging units 1802 are arranged as a single line array as shown in FIG. 18. The substrate 1804 may be controlled to move along the direction of substrate movement (the X direction) and the linear array of SLM imaging units 1802 may be controlled to move back and forth perpendicular to the direction of substrate movement (the Y direction) in the plane of the substrate 1804. The exposure of the linear array of SLM imaging units can be tuned to process certain area of the substrate 1804 in synchronization with the roll-to-roll substrate movement. In this way, the linear array of SLM imaging units may be controlled to image a substrate that has physical dimensions larger than the size of the linear array of SLM imaging units. Because of the ability to control the SLM imaging units to move in the direction of substrate movement as well as in the direction perpendicular to the substrate movement, the image writer system shown in FIG. 18 overcomes the size limitations of the physical masks required in the conventional methods described in the '779 patent and the Ahn article.

Figure 19:
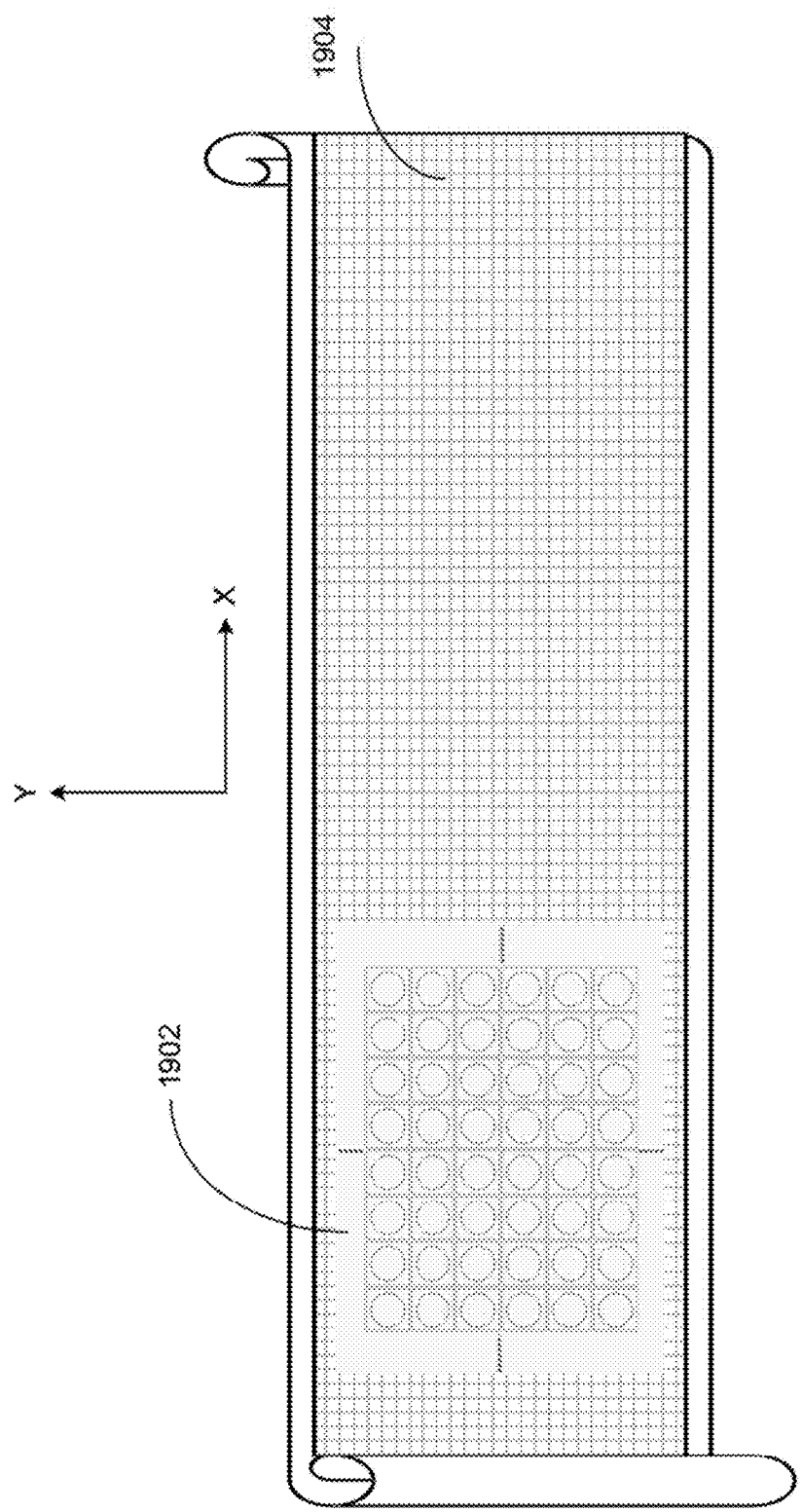
FIG. 19 illustrates a method of using a two dimensional array of SLM imaging units for roll-to-roll maskless lithography according to embodiments of the present invention.

FIG. 19 illustrates a method of using a two dimensional array of SLM imaging units for roll-to-roll maskless lithography according to embodiments of the present invention. This figure shows a top view of a two dimensional SLM imaging array 1902, where each circle represents a SLM imaging unit. Similar to the example shown in FIG. 18, the substrate 1904 may be controlled to move in the X direction and the two dimensional array of SLM imaging units 1902 may be controlled to move back and forth in the Y direction in the plane of the substrate 1904. The exposure of the two dimensional array of SLM imaging units can be tuned to process certain area of the substrate 1904 in synchronization with the roll-to-roll substrate movement. In this way, the two dimensional array of SLM imaging units may be controlled to image a substrate that has physical dimensions larger than the size of the two dimensional array of SLM imaging units. Thus, the image writer system shown in FIG. 19 overcomes the size limitations of the physical masks required in the conventional methods described in the '779 patent and the Ahn article. Note that in some embodiments, the two dimensional array of SLM imaging units may be formed in a staggered or non-staggered array formation.

Figure 20:
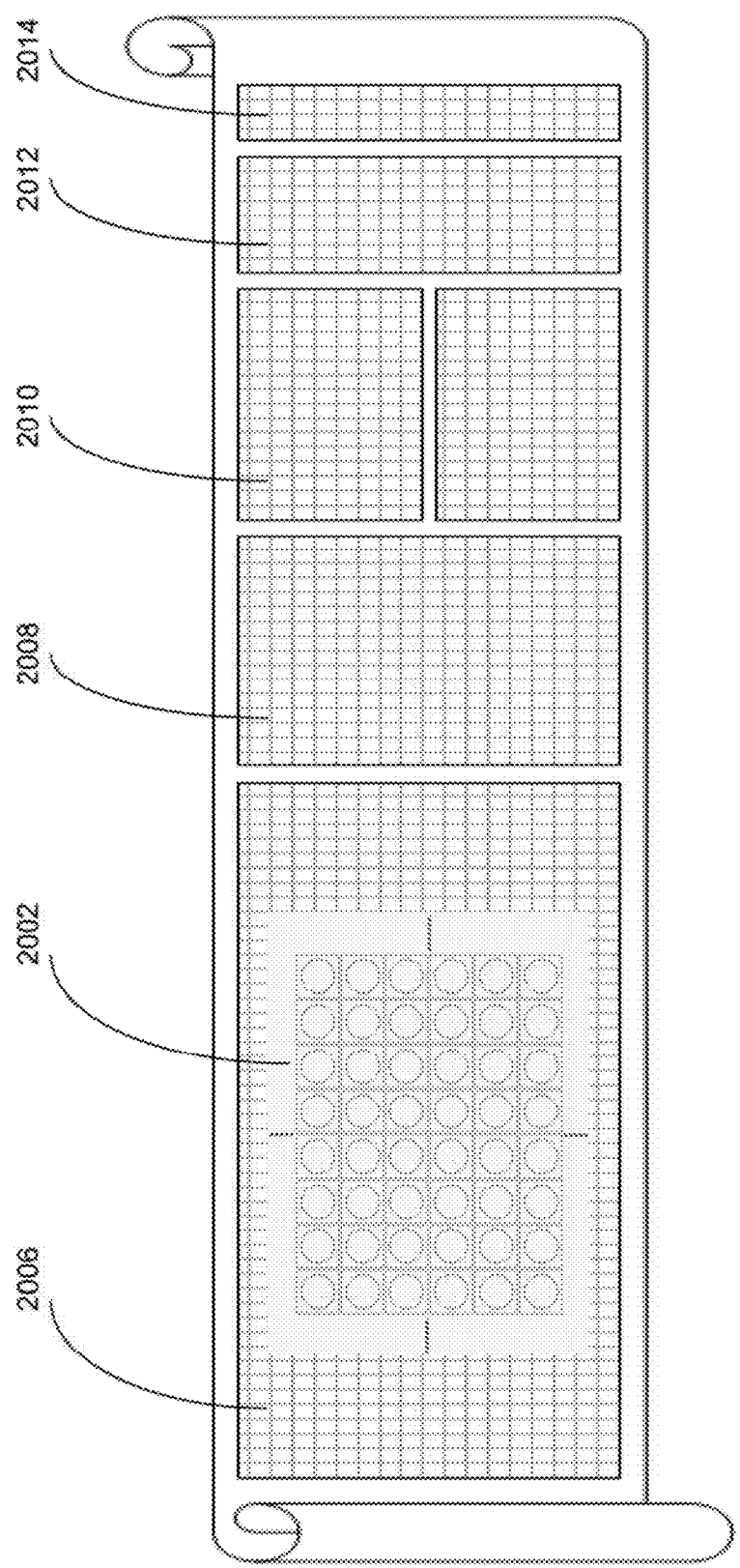
FIG. 20 illustrates a method of imaging plurality of substrate sizes using maskless lithography according to embodiments of the present invention.

FIG. 20 illustrates a method of imaging plurality of substrate sizes using maskless lithography according to embodiments of the present invention. Similar to the method described in FIG. 19, the image writer system also employs a two dimension array of SLM imaging units 2002. Since the two dimensional array of SLM imaging units 2002 may be controlled to receive and process imaging data automatically in a continuous fashion, the image writer system can transition from one substrate design to a different substrate design by loading a new TFT mask database seamlessly without the need to stop and change to a new mask as required by the conventional methods described in the '779 patent and the Ahn article. In the example shown in FIG. 20, different sized substrate designs, such as 2006, 2008, 2010, 2012, and 2014 can be processed on-the-fly as the roll-to-roll substrate containing the different sized substrate designs move by the two dimensional array of SLM imaging units 2002.

Figure 21:
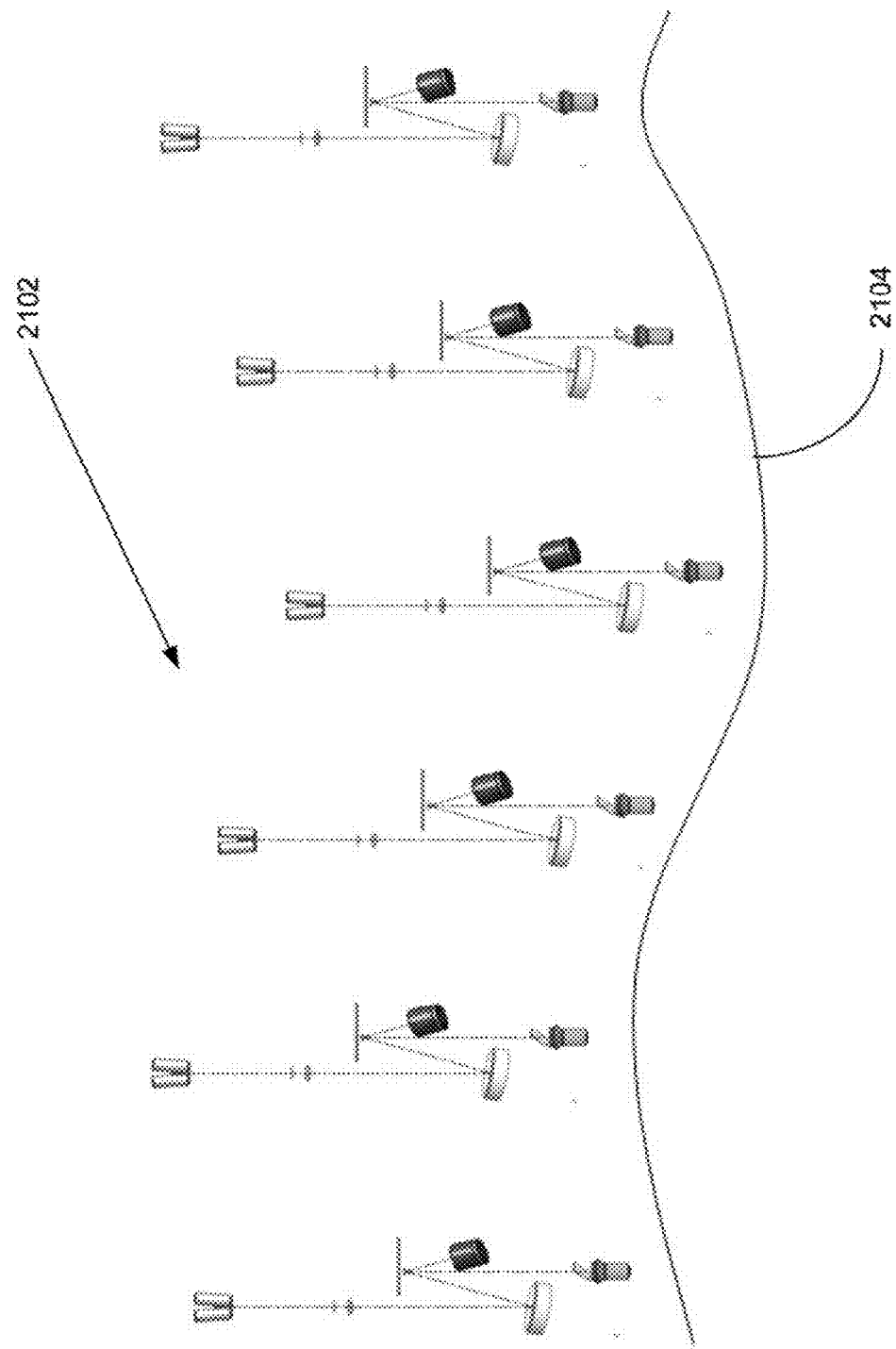
FIG. 21 illustrates a method for positioning each SLM imaging unit corresponding to conditions of localized substrate surface according to embodiments of the present invention.

FIG. 21 illustrates a method for positioning each SLM imaging unit corresponding to conditions of localized substrate surface according to embodiments of the present invention. In this example, the method examines the unevenness of the substrate surface 2104 during exposure, and adjusts the linear array of SLM imaging units 2102 accordingly. In this example, the uneven substrate 2104 is excessively shown to illustrate the benefit of having optimum height adjustment for each SLM imaging unit. This allows achieving auto-focus tuning to come within the range of DOF for intended resolution CD from 1 to 5 μm. This method is further described in the following sections.

In one approach, for printing TFT based photo voltaic (PV) panel, the minimum features CD can be more than 50 μm. In this printing resolution range, it often thought that ink-jet printing could be a less costly option. However, one major drawback for ink-jet printing is defect-prone due to ink mist, a side effect that comes with ink jet droplet stream Ink-jet printing is inherently not as clean as lithography process. It may be suited for patterning mask features that do not form active device or mainly for passive viewing purpose. For production worthy of making active TFT device with roll-to-roll printing, scalable array of SLM imaging units provides a better solution for maskless lithography because it produces better device yield. In this method, a magnification projection is used for maskless imaging. That is, instead of using a reduction objective lens, the exposure lens of the SLM imaging unit employs an enlargement objective lens that can magnify product feature size from 25 μm to a couple of hundred μm in a controlled fashion.

Figure 22:
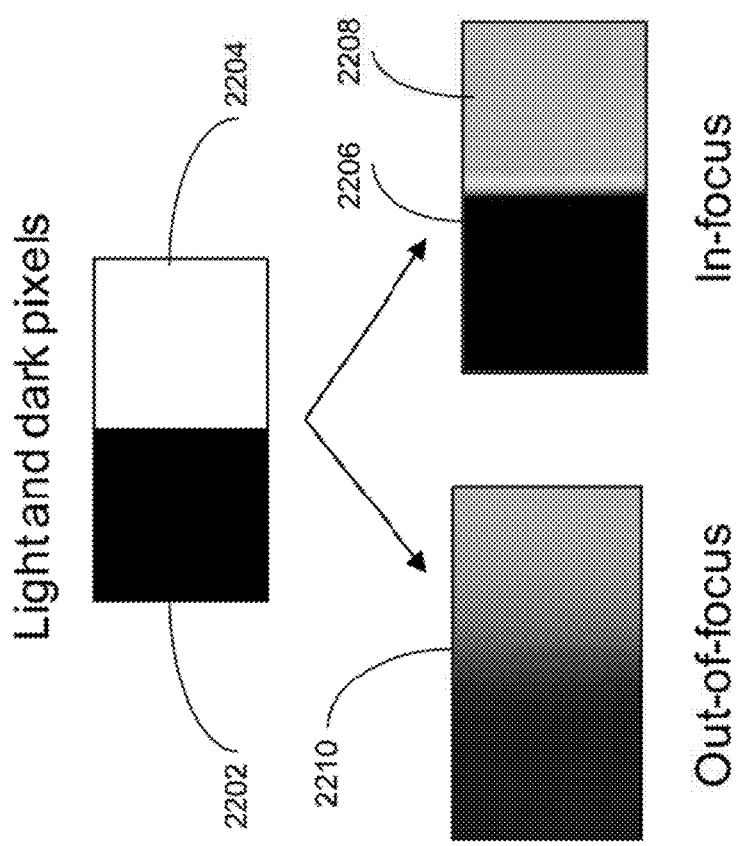
FIG. 22 illustrates a method for detecting focus of pixels according to embodiment of the present invention.

In order to maintain best focus over a substrate that may not be perfectly flat, one way is to monitor and adjust the focus of the SLM imaging unit during exposure. FIG. 22 illustrates a method for detecting focus of pixels according to embodiments of the present invention. One approach for monitoring focus is to use a through-the-lens monitoring camera to capturing images of the exposure in progress. After images are captured, an analysis of dark-light pixel image captured, in comparison with what would be expected for the exposure pattern, can readily derive a relative measure of the amount of defocus. As shown in the example of FIG. 22 is a pair of light and dark pixels (2202 and 2204) with in-focus (2206 and 2208) and an out-of-focus 2210 conditions. At the boundary transition from dark to light area, the in-focus pair exhibits a sharper transition pattern, whereas the out-of-focus pair has a blurred transition. The degree of blurred transition can be mapped to refer to the amount of defocus. In other approaches, one may monitor and analyze spatial frequencies in the image. Since focus errors preferentially reduce the higher spatial frequencies, one may assess the amount of defocus by comparing the loss of high frequency components of the image captured. Yet another method is to monitor and analyze the image contrast from a group of light-dark patterns, with image contrast being the best at optimum focus setting. And the degrees of contrast lost can be referred to the amount of de-focus.

Figure 23A:
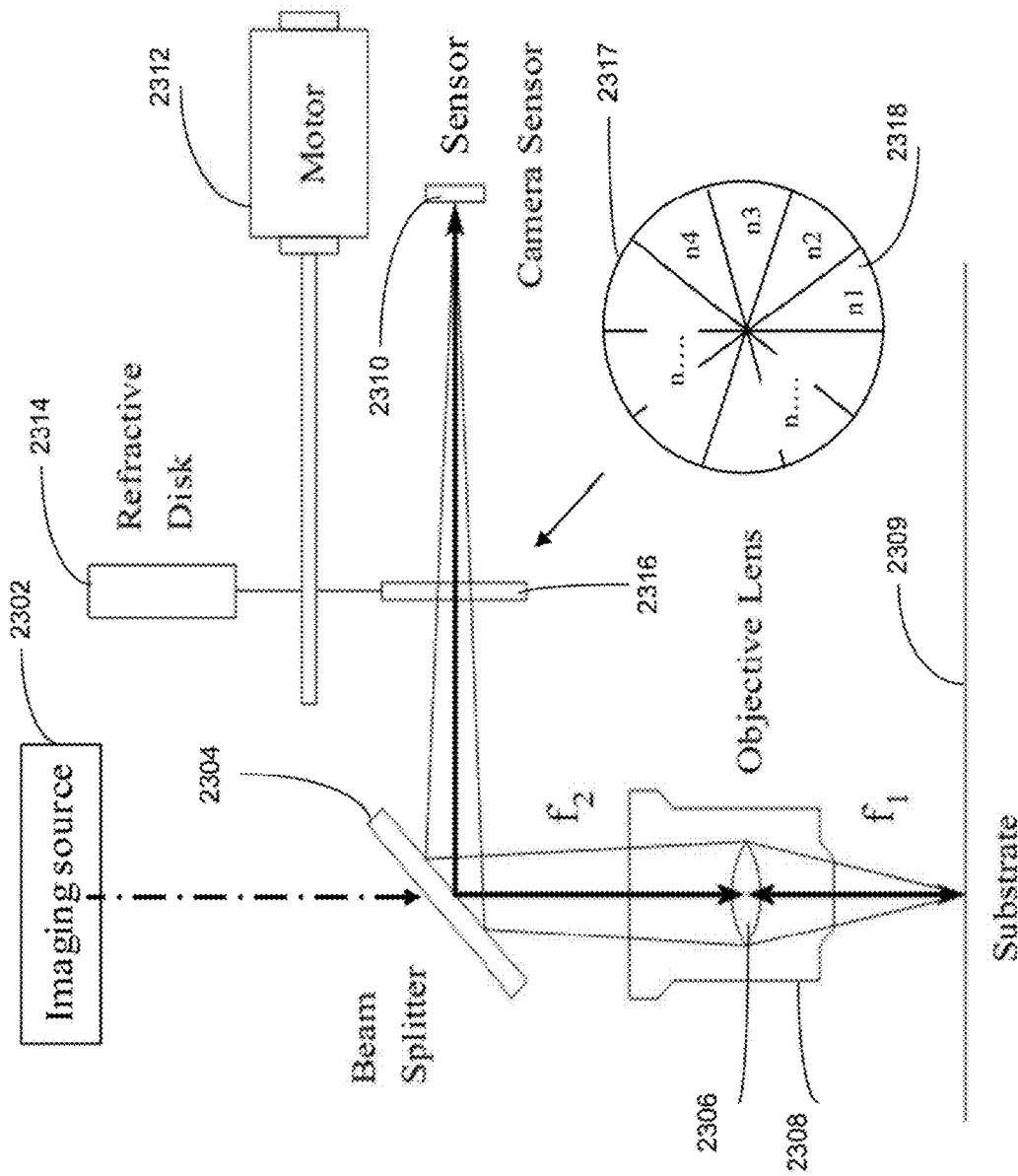
FIGS. 23a-23c illustrate exemplary apparatuses for detecting focus of a SLM imaging unit on-the-fly according to embodiments of the present invention.

Although the methods described above are effective focus monitors of the size of focus error, they do not directly provide any indication of the direction of the error. To address this issue, the system may, under software control, constantly vary the focus slightly over a range centered on the target focus, and update the target focus position to keep it at the best focus. This can most sensitively be determined by balancing the errors at the two extremes of the range. It may be advantageous, however, to avoid the need to intentionally defocus the exposure image. One way to achieve this is to perturb the focus of the camera in a controlled fashion, without altering the focus of the exposure image. This can be done on a through-the-lens monitor camera by altering the effective optical path length between the camera and the objective lens. To a first order approximation, changing the focal length on the camera side of the lens ($f_2$ in the diagram) has the same effect as changing $f_1$ by the same percentage. This focus change can be effected by vibrating the camera in and out, reflecting the image off a mirror that vibrates, or as shown in FIG. 23a, by passing the light through a spinning disk with segments having different thicknesses and/or refractive indices, to give the desired variation in effective optical path length. This is as shown as the first OPD 2316 and the second OPD 2326. Similarly, the image could be reflected off a mirrored disk, with segments at different heights.

FIG. 23a illustrates an exemplary apparatus for detecting focus of a SLM imaging unit on-the-fly according to embodiments of the present invention. As shown in FIG. 23a, the apparatus includes an imaging source 2302, a beam splitter 2304, an objective lens 2306 and its housing 2308. An example of the imaging source 2302 is shown in FIG. 17, including the components 1702 to 1714. The apparatus also includes a first camera sensor 2310 (also referred to as the camera or sensor for short), a first motor 2312, a first refractive disk 2314, and a first optical path difference (OPD) modifier 2316. The first OPD modifier 2316 may be formed from a circular optical device 2317, where the circular optical device 2317 may be made with multiple sectors (for example 2318) and each sector is made with different refraction index material, or made with the same refractive index material but with different thickness than can cause optical path difference.

Figure 23B:
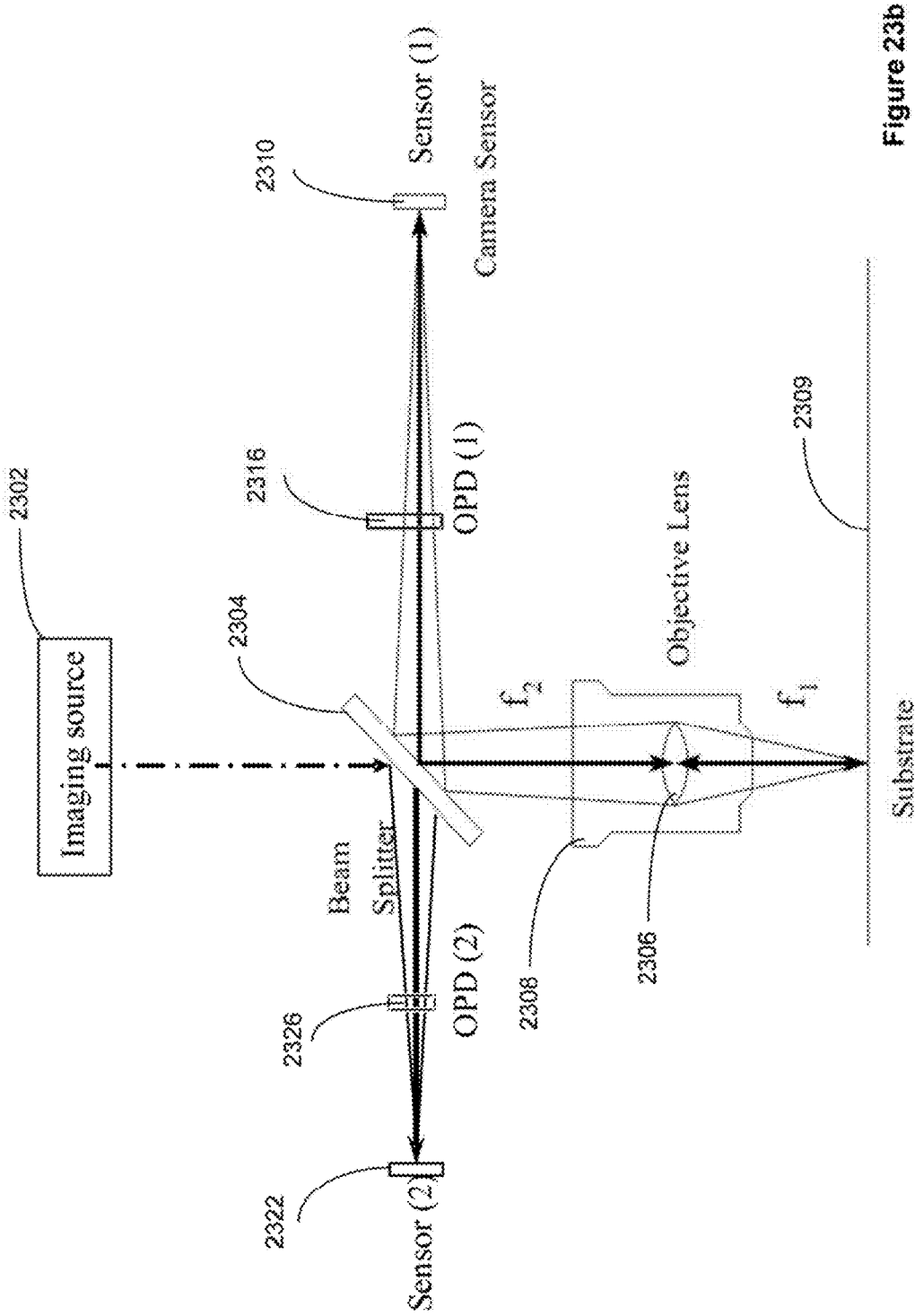
Figure 23C:
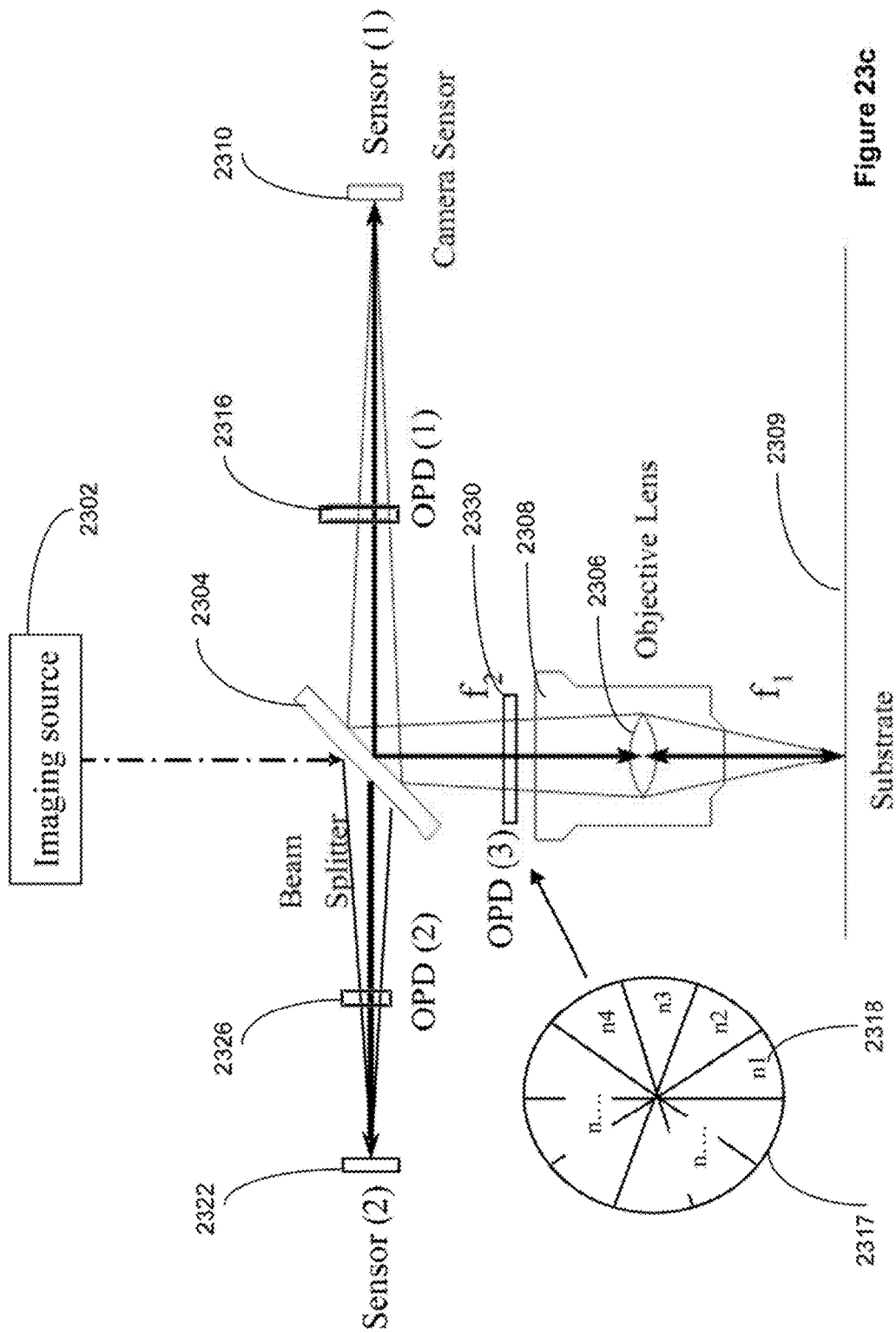

Another way of determining the focus adjustment direction is to have two cameras that can capture the images from different optical path lengths as shown in FIGS. 23b and 23c. FIGS. 23b-23c illustrates two other exemplary apparatuses for detecting focus of a SLM imaging unit on-the-fly according to embodiments of the present invention. In addition to the elements shown in FIG. 23a, these exemplary apparatus further includes a second camera sensor 2322 (also referred to as the camera or sensor for short), and a second optical path difference (OPD) modifier 2326. FIG. 23c also includes a third OPD modifier 2330. The second and third OPD modifiers 2326 and 2330 may be formed in a similar fashion as the first OPD modifier 2316. When with two camera sensors 2310 and 2322 are used, the two respective OPDs 2316 and 2326 with different refractive indexes can be set up to determine focus adjustment direction. In another embodiment, the different OPDs 2316 and 2326 are effected simply by placing the respective cameras 2310 and 2322 at different physical distances, The examples shown in FIGS. 23b-23c examine the images from first camera sensor to second camera sensor to compare and analyze the focus adjustment direction, and adjust focus setting to equalize the defocus observed in the two camera sensors, thus assuring that the best focus is achieved at an OPD midway between the two camera sensors. Here, the first and second camera sensors are configured to observe the substrate with complementary focus offsets to determine direction of a target focus. Yet another method is to avoid adjusting focus by moving the objective lens up and down, this is to place the third OPD 2330 above the housing 2308 of the objective lens 2306 to effect the focus adjustment by changing the effective optical path length.

The on-the-fly focus monitor and adjustment may be performed as follows:

1) The separation of substrate surface from the objective lens is set within the focusing range.
2) To begin with, image is formed and captured by using non-actinic illumination. This will not cause any damage to the photo sensitive material for exposure. That is, the initial focus is set by using non-actinic illumination; the objective is then adjusted accordingly for best focus.
3) As the exposure stage starts to move along the direction of substrate movement (the X direction), the actinic exposure starts.
4) Image captured is then monitored under the actinic illumination. The Objective lens is adjusted accordingly.
5) Note that each focus adjustment is for the next exposure site but based on best focus determined for the previous exposure location.
6) The amount of focus adjustment for the objective lens is based on the optical path difference measured for f1 vs. f2.

Figure 24:
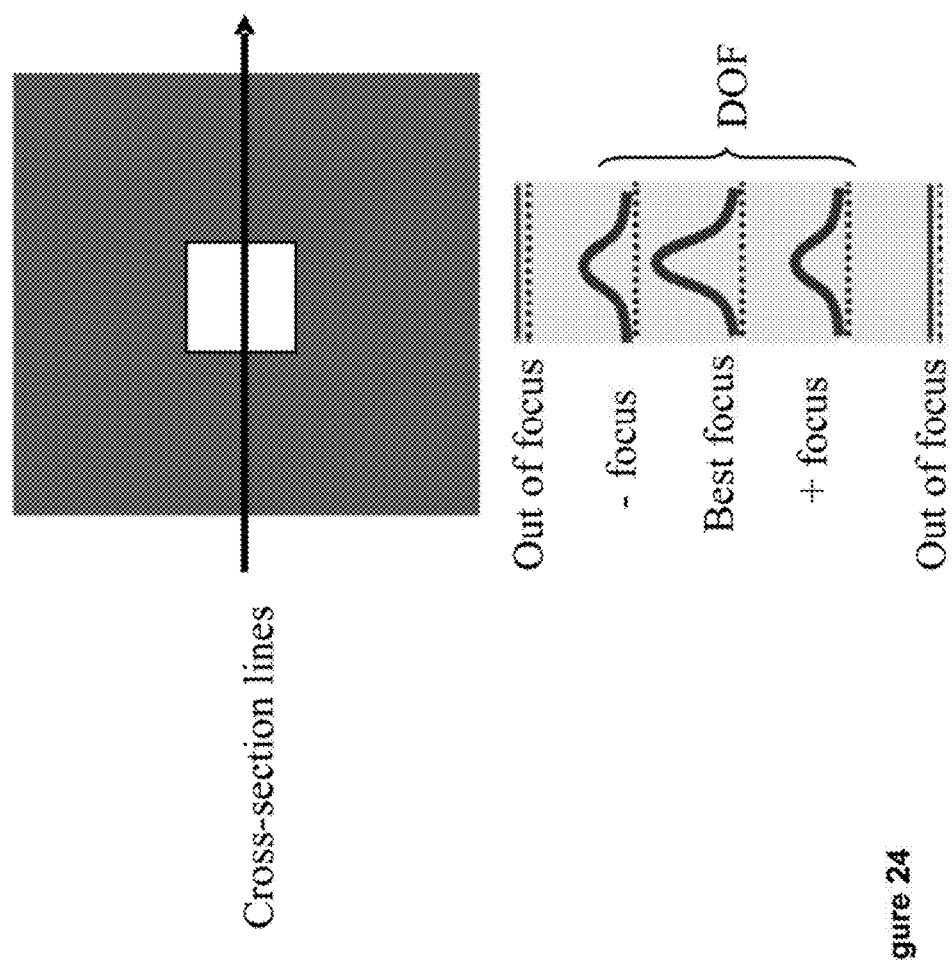
FIG. 24 illustrates an exemplary imaging pattern where pixel voting exposure may be applied according to embodiments of the present invention.

As described above, the image writing may be monitored by one or more cameras on-the-fly while exposure is taking place. By using a mirror pixel voting scheme for exposure, each image pattern is being exposed and formed by many DMD mirror pixels. This exposure scheme inherently permits more margin of focusing error at the initial stage of exposure since each mirror pixel exposure only contributes a small fraction of the total exposure energy required. As pixel voting exposure progresses, the focus of each SLM imaging unit may be tuned and adjusted on-the-fly. This margin of focus error is important for writing the features that are either isolated "hole-like" patterns surrounded by dark field, or isolated "island-like" patterns surrounded by a clear field such as the example shown in FIG. 24. This is because both aforementioned feature patterns are not easy to set optimum focus initially due to the lack of image variation while perturbing the focus setting. However, the optimum focus can be determined after a number of exposures have been progressed.

Figure 25:
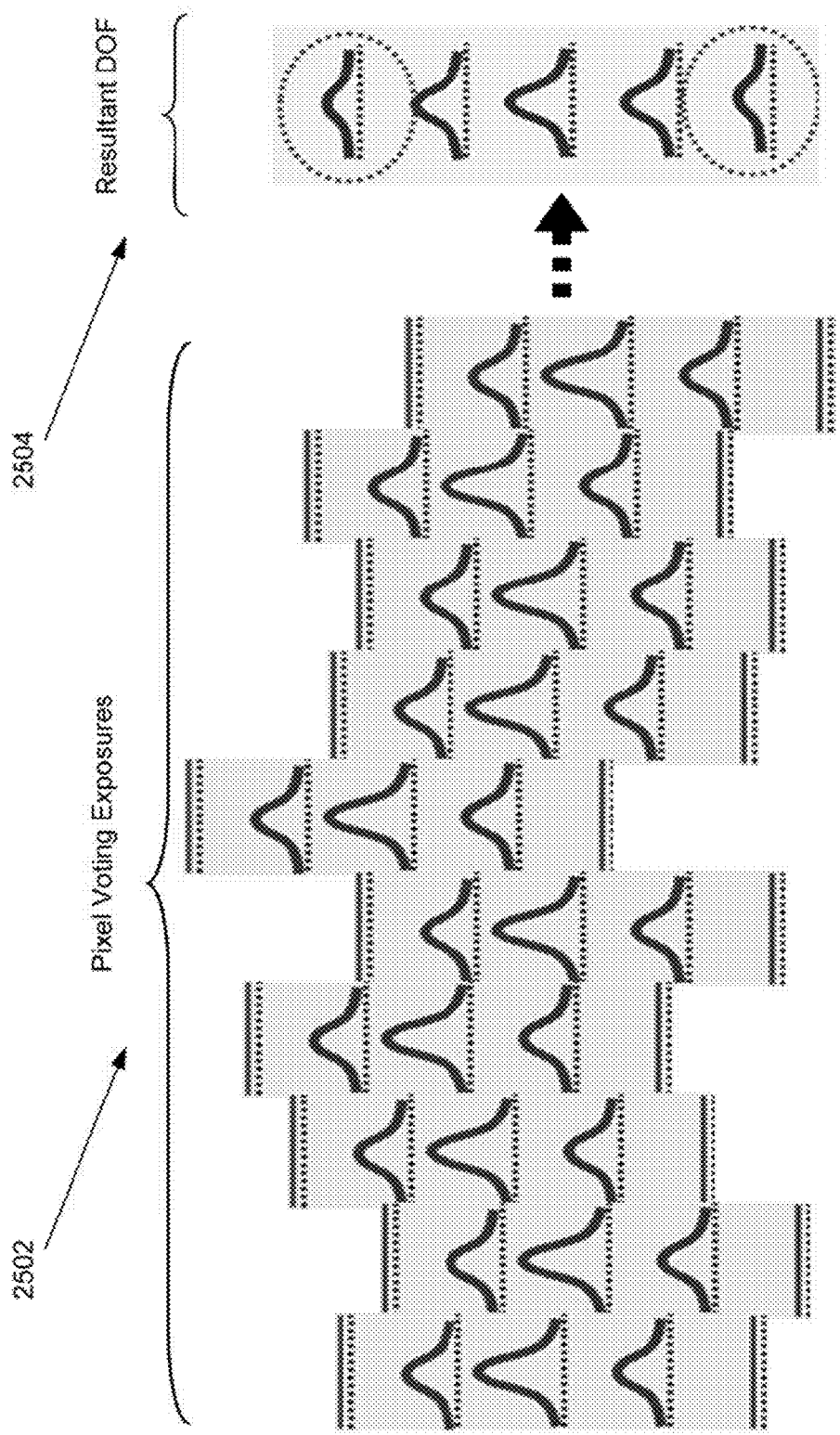
FIG. 25 illustrates a method for improving DOF through pixel voting exposures according to embodiments of the present invention.

In another approach, the type of auto-focusing mechanism described above may be used to accomplish "focus voting exposure" to expand the overall DOF. FIG. 25 illustrates a method for improving DOF through pixel voting exposures according to embodiments of the present invention. In the example shown in FIG. 25, the optimum exposure setting can be dynamically tuned during the pixel voting exposure. This allows the pixel voting exposures to be accomplished by a different best focus levels that are still within the DOF. This scheme enables the final image pattern to be exposed and formed by many votes of the focus settings 2502 that may extend to the overall resultant DOF 2504.

FIG. 26a-26b illustrate methods to stitch adjacent imaging areas using an overlapping region according to embodiments of the present invention. FIG. 26a illustrates two adjacent imaging areas 2602 and 2606, and their corresponding SLMs 2604 and 2608, respectively. An overlap region 2610 is defined as the area between the two adjacent imaging areas 2602 and 2606, where the SLM 2604 may image across a theoretical boundary 2612 to a user defined boundary 2614 (dotted line) in the imaging area 2606. Similarly, the SLM 2608 may image across the theoretical boundary 2612 to another user defined boundary 2616 (dotted line) in the imaging area 2602. By having this double coverage in the overlapping area 2610, the method may compensate for inconsistencies, such as positional mismatches or exposure dose differences, from one area to the other, and vice versa.

FIG. 26b illustrates another two adjacent imaging areas 2622 and 2626, and their corresponding SLMs 2624 and 2628, respectively. In this example, the two SLMs and their corresponding imaging areas are horizontal to each other, as opposed to be vertical to each other as shown in the example of FIG. 26a. Although the orientation of the overlapping region may be different between FIG. 26a and FIG. 26b, similar technique may still be applied to both cases, or in other embodiments, horizontal overlapping regions may be treated differently from the vertical overlapping regions. Similar to FIG. 26a, an overlap region 2630 is defined as the area between the two adjacent imaging areas 2622 and 2626, where the SLM 2624 may image across a theoretical boundary 2632 to a user defined boundary 2634 (dotted line) in the imaging area 2626. Similarly, the SLM 2628 may image across the theoretical boundary 2632 to another user defined boundary 2636 (dotted line) in the imaging area 2622.

One approach to image the overlapping region 2630 is to have the two SLMs 2624 and 2628 to fade over each other. The lines 2638 and 2639 (dotted line) show the approximate conception intensity of the SLMs 2624 and 2628 respectively. In the overlapping region 2630, the intensity of SLM 2624 transitions from full intensity to zero intensity while the intensity of SLM 2628 transitions from zero intensity to full intensity. It is noted that for this approach, if the theoretical boundary is substantially aligned (for example, within 50 nm) with the actual transition of the imaging area, good imaging results may be expected.

Automated optical inspection (AOI) can be applied to Integrated circuit (IC), printing circuit board (PCB), and flat panel display (FPD) manufacturing. For the state-of-the-art VLSI manufacturing, the critical line width in design rules already is a fraction of deep UV (DUV) exposure wavelength at about 193 nm. For PCB, FPD, and similar line width level of electronic devices, AOI can be a critical step in manufacturing process to ensure the production yield. For example, AOI can be configured to check line width, capture particles often down to very small sizes relative to the target line width, detect substrate surface contaminations, and find patterns that are missing, distorted, or extra.

With AOI inspection, various methods can be applied to determine if a PCB can be acceptable as per product quality specifications. The first method is to match the obtained AOI images with the images from a known reference, also referred to as the golden PCB reference. The second method is to compare the captured image pattern to both known good and bad PCB images that have been pre-stored. The third method extends from the second method by applying statistical pattern matching. By matching to a known golden reference together with a number of bad PCB images ranged from minor to severe failure types; it enables statistical determination to accommodate minor acceptable deviations.

For PCB and similar substrate type and line width grade of electronic devices, the main objectives for AOI are to help determine the failure source(s) quickly so can be rectified before too many boards are built with the same problem.

And then to be able to cleanly reject the unusable defective parts to ensure overall product quality for delivery. Due to cost, resource, and time constraints, except for special engineering purpose, defective PCBs are rarely repaired. They are likely marked for rejection in a typical volume manufacturing line.

For FPD and similar substrate type and line width grade of electronic devices, the use of AOI is also to perform inspection functions, such as capturing particles, contaminations, and unwanted pattern defects. One pattern defect type can be mura, a low contrast but visually noticeable inference beat pattern that tends to upset human vision. Other pattern defect types are missing, extras, or combinations of the two that cause pattern distortion.

The AOI hardware mechanism maybe arranged differently because much larger substrate size needs to be dealt with. For example, instead of having camera mounted on a fast moving X-Y track stage overhead to scan and capture images on the substrate from site to site, a closely packed horizontal line of cameras can be set up to scan the entire substrate while it is being moved through horizontally beneath but perpendicularly with respect to the line of cameras. Such an in-line style of substrate moving speed can be kept in pace with image capturing rate while maintaining within focus range underneath the line of cameras. Each camera can capture tens of thousands of scan line images and every pixel line may have 8-bit pixels, etc. In one example, a camera resolution of 7.5 um can be employed to inspect 8 to 10 um line width TFT color filter panel product. For the inspection of finer line width, for example from 1 to 3 um of TFT array, higher resolution cameras are employed. In this case, the line width is closer to illumination wavelength, the data volume and image processing algorithm are adjusted accordingly.

To deliver product for visual communication applications, no visible defect can be shipped in any of high-resolution panel product. However, the material price for incoming substrate used for manufacturing has been getting more expensive due to the increasingly larger size substrate demanded in each newer product generation. Thus there is a need not to reject any of the costly substrate material, but aiming to repair every panel with all defects identified by AOI. As a result, repairing defects becomes a critical manufacturing step for FPD and similar electronic devices.

Taking the $10^{th}$ generation FPD substrate as an example, one solution is to locate the defect locations using AOI, and then perform pattern repair to fix the defects. Due to the large size of the substrate, on the order of 2.88 by 3.08 meters, manual repair by a human is challenging, and it is better done by automation using a robot. When set up robot to perform defect repair tasks automatically, such as removing surface particles, applying laser to etch or blast away extra patterns, and depositing process compatible thin film locally to make up missing parts of patterns in sparse pattern areas, these tasks can be performed with software algorithms. Since the AOI can provide precise site locations, define areas to be repaired, identify types of pattern defects (such as missing or extras), and be able to refer to intended pattern reference, etc, the task is to reconstruct intended pattern from distorted pattern defects that have both unwanted missing and extra patterns.

To reconstruct a distorted pattern identified, if to use laser ablation in conjunction with localized thin film deposition, at an elementary image processing level, a first step is to identify what parts of the pattern are missing and/or having unwanted extras. This is feasible by using an SLM imaging unit to capture the defect image and correlate the captured image with the original mask pattern. This can be done using an array of SLM imaging units to perform image scanning as if they were making exposures, but instead just capturing the pattern images. Alternatively, a single SLM imaging unit can be mounted on an AOI system. After AOI has performed defect type analysis and determined that it is necessary to perform a follow-up defect review and classification, it can then direct the additionally mounted SLM imaging units to perform this task. In FIG. 28c, the left figure shows that element 2810 is a defect identified as an extra pattern between two parallel rectangles 2812. The right figure shows the defect 2810 is being identified and removed (represented as a white area within the dotted lines) from the original mask.

According to embodiments of the present invention, another pattern reconstruction method after AOI is to use SLM imaging unit to repair the pattern using maskless imaging process locally in areas with defects. This imaging method requires re-coating the photoresist either locally or globally. If re-coating locally is required, photoresist is applied locally for development; but if many sites on the substrate need pattern reconstruction, then it may be preferable to re-coat the photoresist for the entire substrate.

Similar to an in-line lithography process, except that only the defect pattern areas need to be re-imaged for pattern reconstruction purpose, either a single SLM imaging unit or an array of SLMs can be instructed to perform the re-patterning tasks. The first step is to perform alignment to the already patterned areas. This is no different by using SLM imaging unit for making mask alignment. Unlike the first lithography exposure where mask patterns can be written in parallel, the alignment is made to the previous masking layer. In case of pattern reconstruction, this is to align to the same masking layer patterns that have already gone through etching process. Hence the mask pattern may likely be appeared differently depending on actual process conditions that have gone through. The pattern reconstruction needs to factor in the process conditions in order for the reconstructed patterns to better match with the neighboring patterns. In other words, the re-imaging needs to include process correction factors in terms of sizing up or down the reconstructed pattern areas.

In FIG. 28d, the left figure shows the defect pattern to have factored in a known process correction. The right figure shows the defect pattern imaging alignment correlation, when compare to the defect pattern previously captured versus what is actually being seen on the defect site. The small dark area 2820 in the center indicates a strong alignment correlation can be obtained hence the defect site, or the pattern reconstruction site, is precisely identified. After the reconstruct images have been factored in with processing conditions, the next step is to perform maskless exposure for localized pattern reconstruction.

Figure 27B:
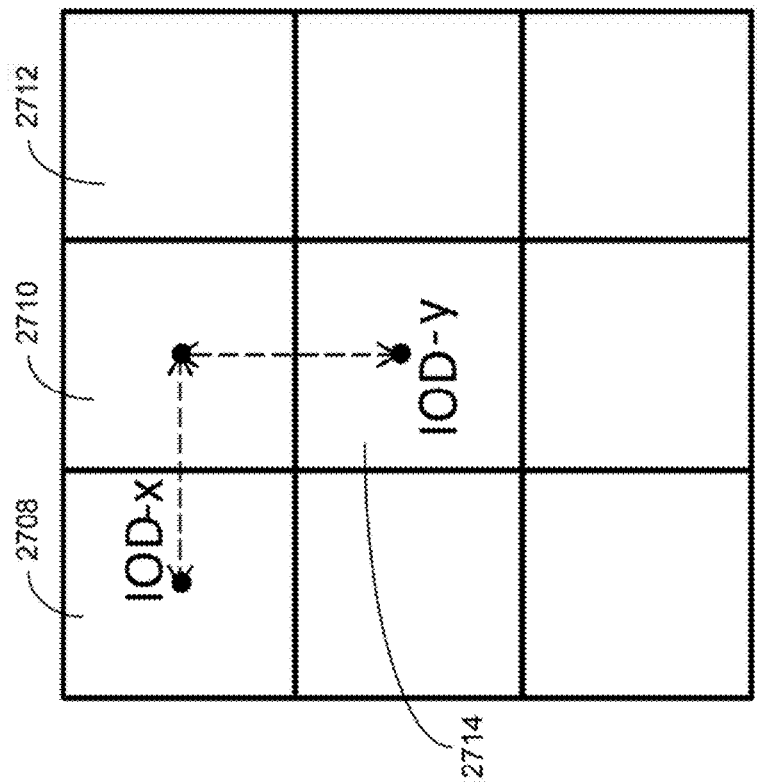
FIGS. 27a-27b illustrate methods to measure and use inter-ocular displacement between centers of adjacent SLMs according to embodiments of the present invention.
Figure 27A:
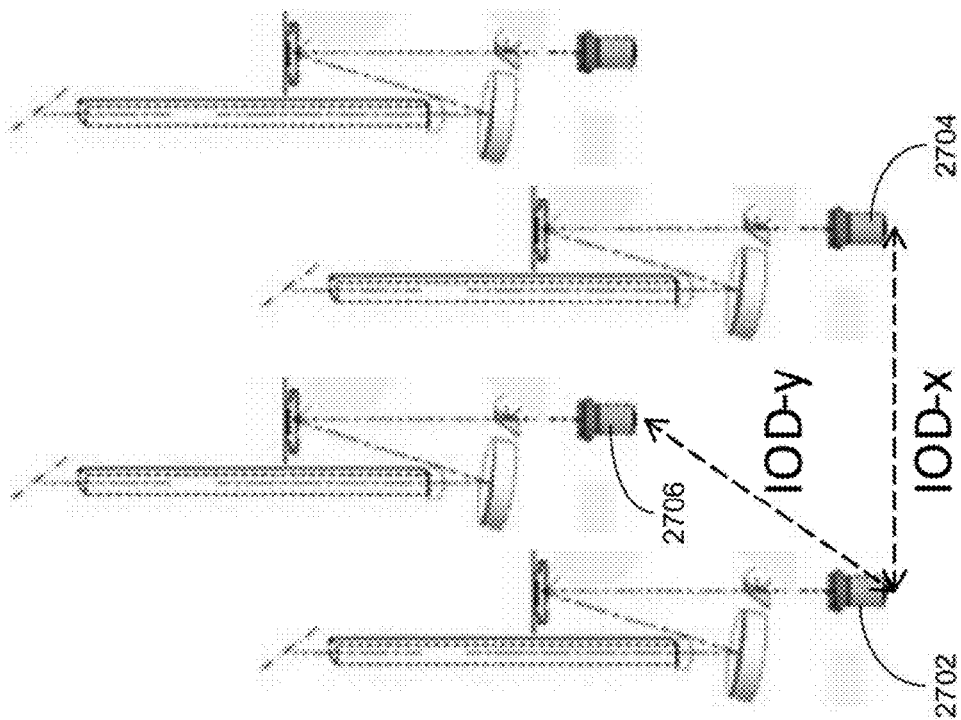

FIGS. 27a-27b illustrate methods to measure and use inter-ocular displacement between centers of adjacent SLMs according to embodiments of the present invention. An array of four SLMs is used in the example shown in FIG. 27a. An inter-ocular displacement (IOD) is the vector-valued distance between the centers of two adjacent SLMs. For example, IOD-x is the displacement between the centers of SLM 2702 and SLM 2704; similarly IOD-y is the displacement between the centers of SLM 2702 and SLM 2706. In FIG. 27b, the overall imaging area is divided to a number of sub-sections in a grid, for example sub-sections 2708, 2710, 2712, and 2714. Each sub-section corresponds to an image area of one SLM. In this example, the IOD between the SLMs for imaging sub-sections 2708 and 2710 is measured to be IOD-x; and the IOD between the SLMs for imaging sub-sections 2710 and 2714 is measured to be IOD-y. Upon measuring the IODs among the corresponding SLMs in the system, such information is used by the system for calibration and for creating mask data for controlling the exposures of each SLM in the system. By applying the IOD data, even though each SLM may not be perfectly centered with respect to its imaging area, the system is able to prepare mask data using the IODs to compensate for any imperfections in the alignment of the SLMs in the system.

Figure 28A:
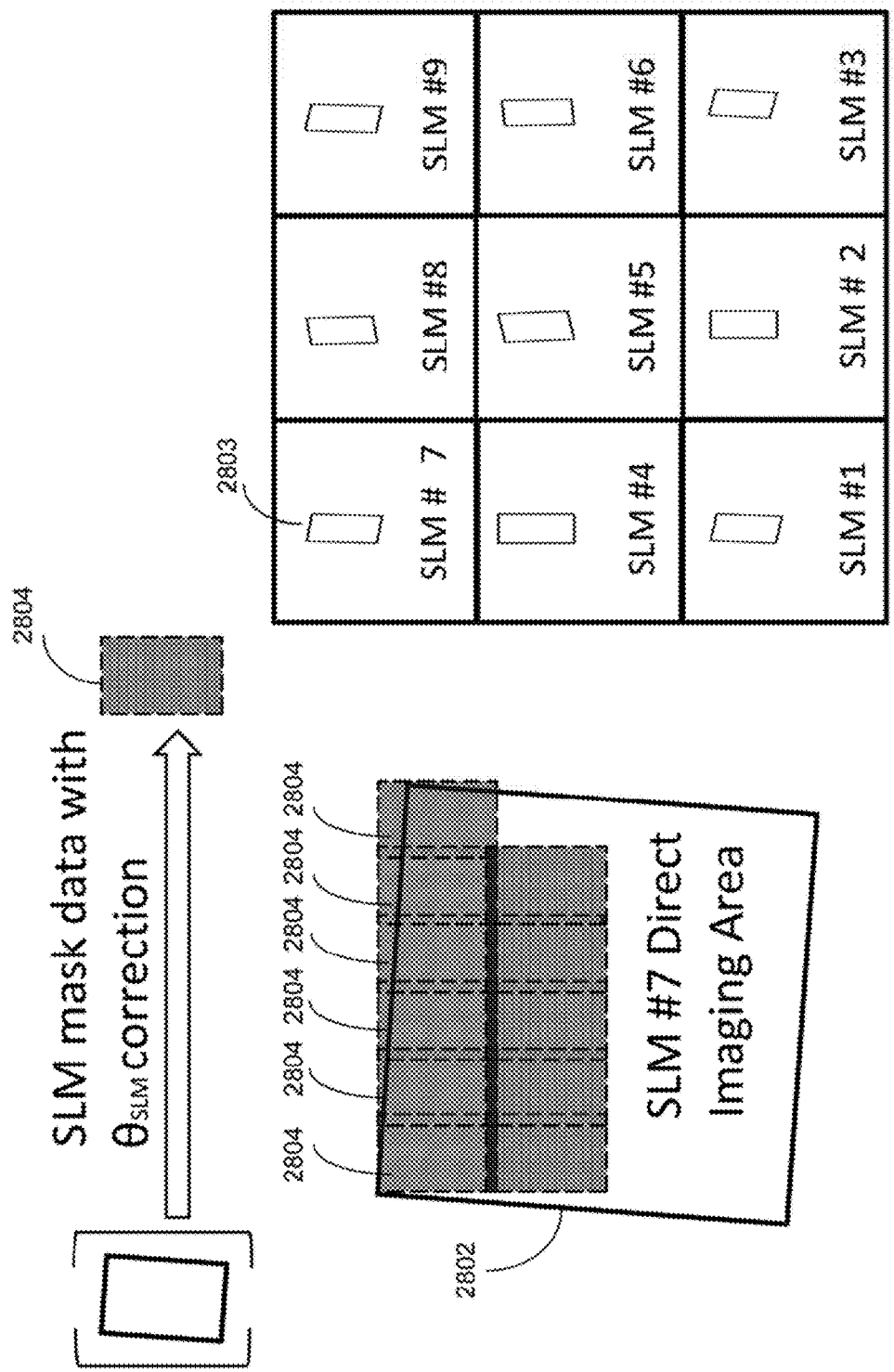
FIGS. 28a-28b illustrate methods to measure and correct alignment by the image writer system according to embodiments of the present invention.
Figure 28B:
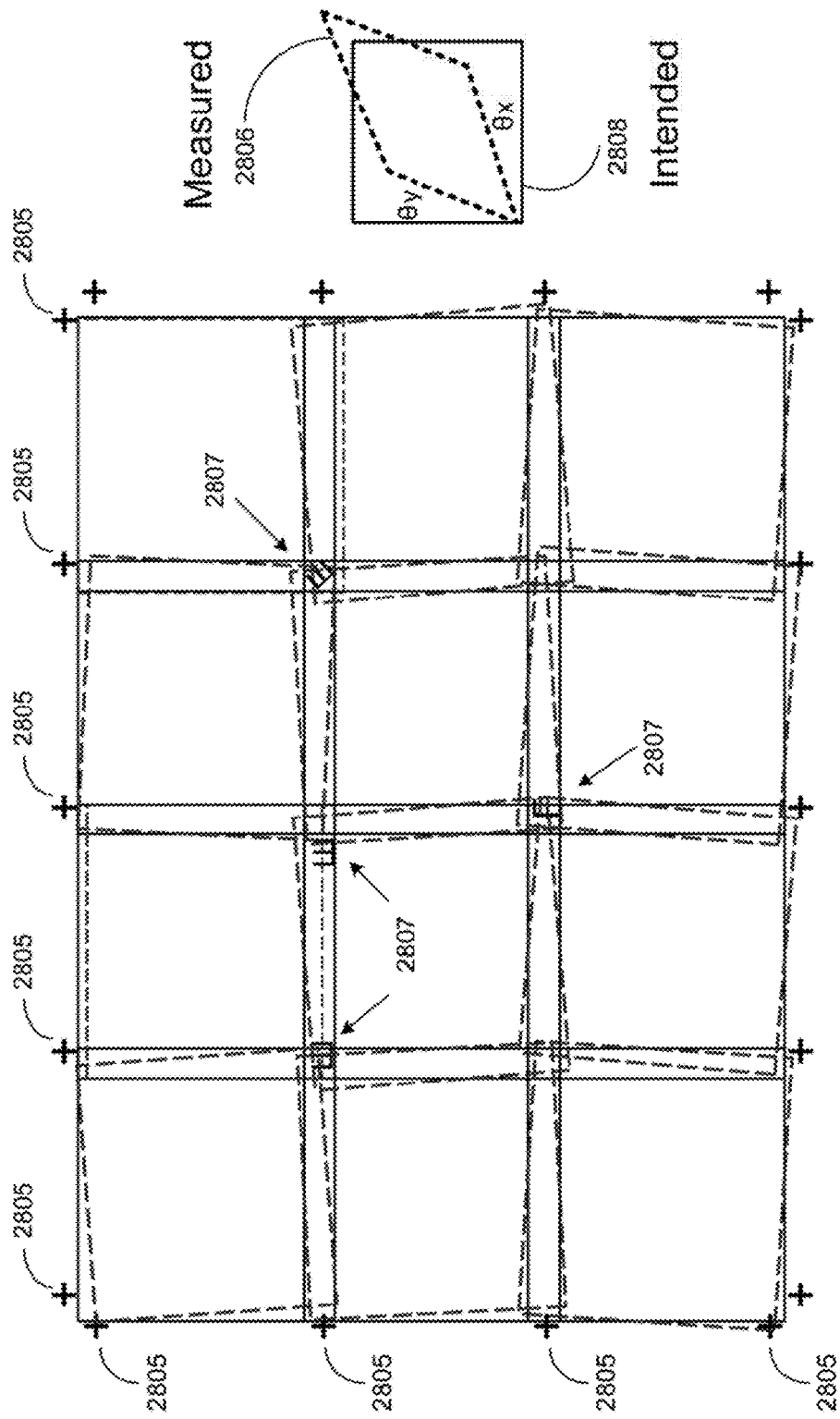

FIGS. 28a-28b illustrate methods to measure and correct alignment by the image writer system according to embodiments of the present invention. As shown in FIG. 28a, if some of the SLMs are rotated, for example SLM1 and SLM2 are slightly rotated to the right; SLM5, SLM6, and SLM8 are slightly rotated to the left; and SLM7 and SLM9 are slightly rotated to the right (all shown with exaggeration). Such rotational errors may be detected and determined during routine system setup or maintenance. In this example, the rotational correction factors are measured to be $\theta_{SLM}$. Upon measuring the $\theta_{SLM}$ for each SLM in the system, such information is used by the system for calibration and for creating mask data to control the exposures of each SLM in the system. By applying the rotational correction factor, even though each SLM may not be perfectly oriented with respect to its imaging area, the system is able to prepare mask data using the rotational correction factors to compensate for any imperfections in the orientation of the SLMs. For example, the rotational correction factor for the imaging area of SLM7 2803 is measured to be $\theta_{SLM}$. In preparing the mask data, the system takes such rotational correction factors into account, and generates mask data that are aligned 2804.

FIG. 28b illustrates a method of pattern recognition conformal alignment according to embodiments of the present invention. In this exemplary approach, a number of predetermined patterns may be employed as landmarks for pattern recognition based alignment target capturing. For example, plus signs (+) 2805 may be used along the edges of the imaging area to identify the boundaries. In addition, existing design patterns (shown as E and F) 2807 may be used to identify corners of imaging areas between adjacent SLMs. According to embodiments of the present invention, SLMs may seek alignment targets simultaneously. Using the alignment targets, the system determines a set of correction factors, such as offsets, rotational corrections, and scaling factors. With enough additional alignment marks corrections for non-linear distortions, such as axis curvature or Keystoning, can also be computed. The system then generates mask data that adapts the intended pattern 2808 to align with the measured locations of the alignment marks using these correction factors.

Driven by Moore's Law in the last forty years, the continuous scaling of CMOS design rules has enabled IC device makers to put in more functionality or greater numbers of transistors within the same chip area in each newer generation of devices, while also being capable of operating at higher frequency and at lower overall chip cost. Eventually, however, economics has caught up. As CMOS scaling becomes increasingly challenging technologically, in order to manufacture the upcoming device generations at sub-20 nm design rules, it would demand a level of capital investment beyond reach by most companies in the industry. For lithography exposure tool alone, the projected cost would be sufficiently risky that even the industry top companies consider prohibitive. To seek less costly alternative to achieve miniaturization with high performance system scaling, or, by the notion of "More than Moore's Law", in the beginning of the last decade, the industry started paying more attention to system integration rather than just to keep trying to increase transistor density.

3D packaging with through silicon via (TSV) interconnect offers a scaling pathway around Moore's Law. It makes heterogeneous integration feasible, which allows integrating devices such as radio frequency (RF), logic, memory, and microelectromechanical (MEM) sensors in a tight space package. As oppose to system on a chip (SOC) that demands putting more and more transistors into a 2D chip area, or with the notion of "More Moore's Law", that would need to count on ever more aggressive design rule scaling. For a relatively smaller capital investment, 3D packaging becomes economically attractive for producing the next generation of consumer devices like smart mobile devices. In fact, these devices have already become one of the major drivers for 3D packaging. Motivated by strong market demand, in spite of the ongoing world-wide recession, the industry is fast developing the manufacturing tools, processes and technologies necessary to implement system integration packaging in 3D.

There are two approaches for 3D packaging, one is referred to as "3D Si integration" and the other is referred to as "3D IC integration". Both based on TSV but represent two different levels of manufacturing challenges. The 3D Si integration is also referred to as wafer to wafer bonding. This method offers better electrical performance, less power, lower profile, less weight, and higher throughput.

Figure 29A:
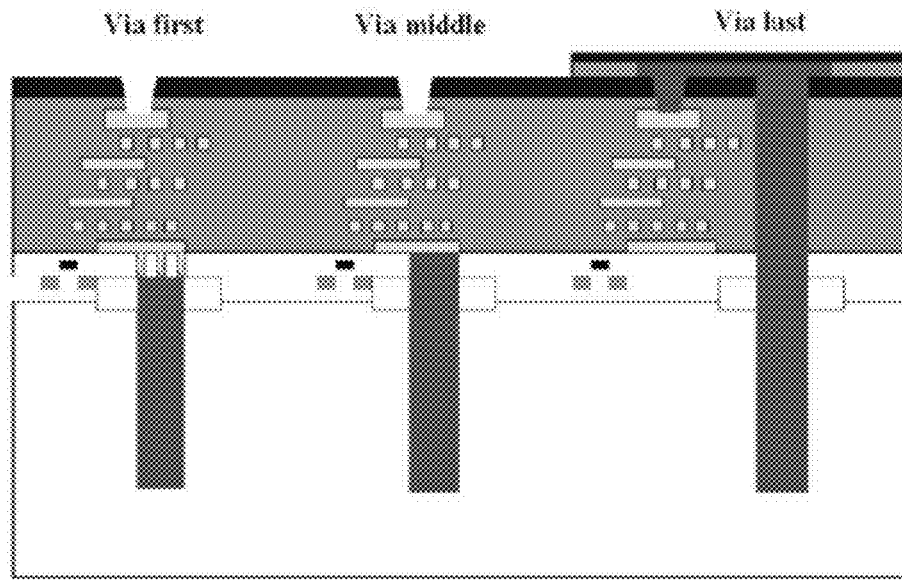
FIGS. 29a-29d illustrate methods for maskless parallel manufacturing of 3-dimensional integrated circuits according to embodiments of the present invention.

The 3D IC integration can be applied to increase the density of CMOS Image Sensors in digital cameras. This can be done by using 3D IC interconnect with TSV. Memory applications can also adopt 3D stacking in order to reduce foot print and still meet the stringent requirements for increased memory densities. FIGS. 29a-29d illustrate methods for maskless parallel manufacturing of 3-dimensional integrated circuits according to embodiments of the present invention. Three types of TSV are shown in FIG. 29a, namely via-first, via-middle, and via-last. The names refer to whether to form the TSV is formed before, in the midst of, or after the IC is completed, respectively. In the example of FIG. 29a, a cross-sectional view of TSV in three different styles is shown. In each of TSV type (dark gray), via patterns are first formed by lithography, next to etch a deep trench into the silicon substrate, then fill in the conducting metal or cupper material by plating. After that, the backside of the silicon substrate may be ground to become thin enough to expose the TSV on the back side. In this manner, they can be directly connected to another chip with a matched TSV scheme.

Various TSV design rule examples specified in terms of diameter/pitch in aspect ratio for depth versus diameter. In one example, the diameter/pitch ratio can be 50/250 um in 5:1. In another example, the diameter/pitch ratio can be scaled down to 10/100 um in 10:1, 5/50 um in 16:1, 3/50 um in 16:1, and then to 1/20 um in 20:1 respectively. These diameter/pitch ratios are reasonable from lithography patterning and etch perspectives but may be optimistic for deep trench plating. In order to have mature manufacturing practices, there is a need to improve development processes such as via formation with electrical reliability, very thin wafer handling together with much worsened wafer bow and warp, thermal management, testing for the stacked chip, and etc.

One approach is to incorporate the TSV processing steps into the semiconductor manufacturing process. In this case, the wafer die yield can be adversely impacted. The adverse impact is more severe when wafers with many known good die must be scrapped after via-last process. Another approach is to bond to another chip directly. And this other chip may likely be designed by another company that may or may not have been made by a compatible semiconductor manufacturing process.

Another approach is to allow IC chips to be produced in their traditional manufacturing process and be tested independently in order to get interconnected with other chips. This is done by using a passive interposer with TSV, to which IC chips are attached as an intermediate step prior to packaging. Here, an interposer is a substrate material that can either be silicon or glass. It can be in a silicon wafer shape/size or in a rectangular shape/size of glass substrate. It acts to accommodate ICs with high I/O counts and their high-density routing from the package to the PCB. Such a passive interposer has no active device and can be built separately by foundries or out sourced.

Figure 29B:
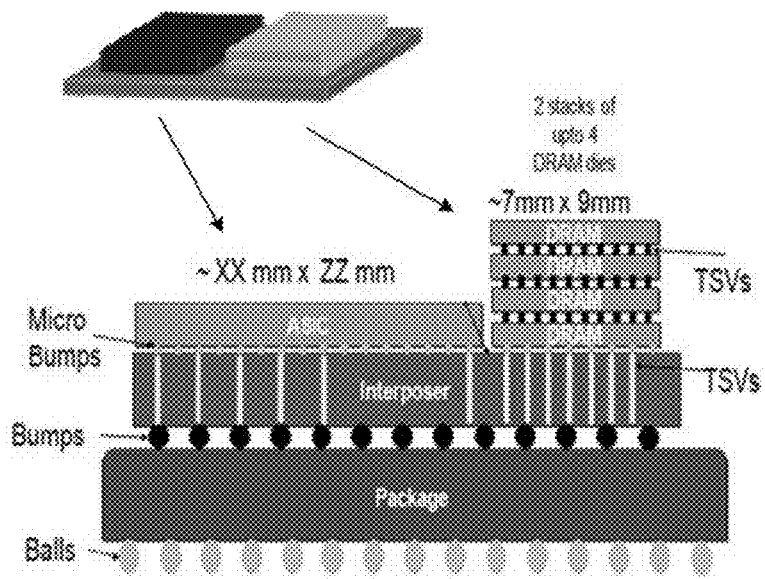

FIG. 29b shows an example of interposer implementation in cross-sectional view, where an ASIC logic chip has been bonded next to a stack of DRAM chips on the same passive interposer. For the stacked DRAM, yet another TSV type can be done between the memory chips.

For patterning on active silicon interposer, where TSV are expected to be patterned on IC device wafers, an array of SLMs (AOS) maskless direct imaging tool can be compatible with existing IDM or foundry exposure tools for mix-n-match exposure and do that with sufficient throughput. For via-middle, it is a masking step for patterning 3 to 5 microns diameter in a rather large via to via pitch TSV that occurs after transistors and tungsten contact mask layer but before multi-level copper interconnect. While for via-last, this refers to TSV etched to a stop layer from the backside of thinned wafers temporarily-bonded to carriers; here the TSV diameter is in the range of 8 to 10 microns.

DDR3 DRAM for mobile devices requires reduction in size and power consumption. In the case of memory ICs, 10 to 50 micron thick of silicon can be used for via with 5:1 to 10:1 aspect-ratios (AR) for copper electroplating. This translates to 2 to 5 microns in via diameter. This approximately agrees with the silicon TSV diameters that have been intended for IDM and foundries.

For patterning TSV through passive interposers, this may be done by out sourced assembly and test (OSAT) lines. In this style of interposers, the final silicon target thickness can be 100-140 μm. Interposer thickness cannot be reduced below 100 μm without rigid silicon wafers becoming flexible silicon foils. In terms of via diameters, if to go with 5:1 aspect ratio, then the imaging target for TSV diameters may be about 20 to 30 microns. In a silicon interposer, there are redistribution layers (RDL) that consists of plated copper wires. The line width and pitch are close to the respective TSV diameters.

The line width and diameters discussed above are within the current AOS maskless direct imaging capability using 405 nm exposure wavelength. Interposers can be used in many different ways. For example, they can be used to adapt obsolete components to a circuit board that may be challenging to redesign. To compete with foundries or IDM's for interposer commercial applications, OSAT can offer rapid design, prototyping and production of silicon interposers from small scale to large-volume, and adapt the complex substrate to the standard footprint by re-routing on the interposer, etc. For these tasks, AOS maskless direct imaging offers fast turn with flexibility that is unmatched by conventional mask-based exposure tools including both stepper and mask aligners.

Another issue addressed by the AOS maskless direct imaging system is to make adequate alignment when working with ultra thin interposer substrate that can be deformed (for example bow and warp). With the disclosed approach, the AOS maskless direct imaging system performs localized alignment by efficiently "stretching" mask data to fit the existing substrate pattern. This is not possible for conventional mask based lithography.

In another approach, the AOS maskless direct imaging system is applied to pattern active silicon interposer TSVs. Due to the need to optimize thermal and electrical properties for 3D IC integration, it may be necessary to have design of experiment (DOE) of TSV placement on active die during research or development phase or during a design-split intended for different application purposes on the same wafer. This can be accomplished with the AOS maskless imaging system efficiently so that there is no need to order any mask for this purpose.

Figure 29D:
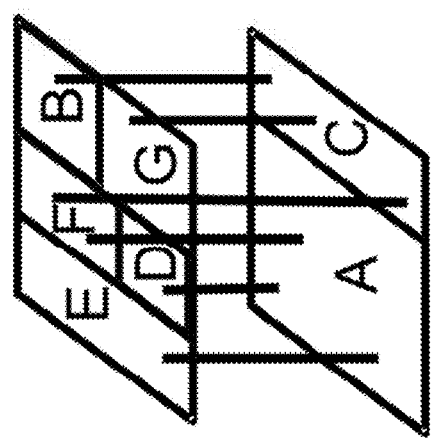
Figure 29C:
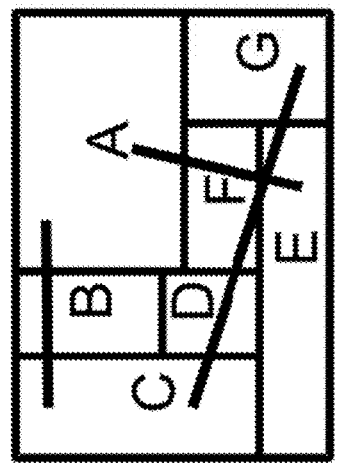

FIG. 29c illustrates a layout of a 2-dimensional integrated circuit. As shown in this example, each block in the layout, namely A, B, C, D, E, F, G, represents a portion of the integrated circuit and its corresponding area on a wafer. The exemplary lines between block A to block C, block A to block E, and block C to block G represent the routing necessary for these blocks to communicate to each other. Person skilled in the art would appreciate that in an integrated circuit having billions of transistors, such routing of communication signals between the blocks are extremely complex and presents numerous design challenges such as issues in RC delay, crosstalk, power consumption, form factor, etc., which directly impacts the cost of the integrated circuit.

The disclosed systems and methods of the present invention may be applied to address issues of the system-on-chip design of FIG. 29c, and in particular may be applied to the area of 3-dimensional die-to-die, die-to-wafer, and wafer-to-wafer bonding that creates a 3-dimensional integrated circuit more effectively. The integrated circuit may be arranged in a 3-dimensional manner as shown in FIG. 29d, where the routing of communication signals between the blocks can be significantly shortened. In this example, blocks A and C are placed in a first layer of the integrated circuit, and blocks B, D, E, F, and G are placed in a second layer of the integrated circuit. Person skilled in the art would appreciate that more than two layers may be formed to accommodate particular design and cost objectives of the integrated circuit. The vertical lines between block A to block E, block A to block D, block A to block F, block C to block B, block C to block F, and block C to block G represent the routing of communication signals between the blocks in different layers of the integrated circuit, which may be significantly shortened in the 3-dimensional arrangement. In other embodiments, analog circuit designs and digital circuit designs may be separated in different layers of the 3-dimensional integrated circuit. In yet other embodiments, circuit power and ground planes may be separated in different layers of the 3-dimensional integrated circuit.

In creating a 3-dimensional integrated circuit, conventional approaches would require a mask for each layer of the integrated circuit. However, in the design process, multiple iterations are typically required to address all design criteria from the perspective of functionality, performance, and cost. In other words, each mask of a corresponding layer of the integrated circuit may need to be modified during the design and verification process, which in turn increases the cost and duration of the integrated circuit development. Employing the image writer system of the present invention, no mask is required to manufacture each layer of the circuit design. In addition, using a multi-wafer direct imaging approach of the disclosed imaging writer system, multiple layers of the integrated circuit may be manufactured in parallel, and thus it reduces the cost and duration of the integrated circuit development.

According to embodiments of the present invention, the imaging writer system may be employed in a "via first" through-silicon-via (TSV) approach for 3-dimensional integrated circuit chip bonding. The disclosed maskless approach may be used in place of a conventional fill process using a mask. The fill process is the second step in the before Front End of Line (FEOL) processing (process 1), or alternatively the fill process is the third step in the after FEOL processing (process 2). Similarly, the imaging writer system may be employed in a "via last" through-silicon-via (TSV) approach for 3-dimensional integrated circuit chip bonding. The disclosed maskless approach may be used in place of a conventional fill process using a mask. The fill process is the third step in the before Back End of Line (BEOL) processing (process 3), or alternatively the fill process is the fifth step in the after BEOL processing (process 4).

Note that the flexibility of the maskless approach is specially beneficial because the via mask patterns for TSV is typically in a different critical dimension scale, which may not be economical to use the most advanced exposure tools for its manufacturing as is done for masking layers in FOEL in existing conventional methods. As described above, the ability of the disclosed imaging writer system to make scaling, inter-ocular displacements, and rotational factor corrections during the imaging process can lead to lower product development cost and shorter product development cycle.

FIG. 30 illustrates a method of multi-wafer direct imaging according to embodiments of the present invention. In the example shown in FIG. 30, two 300 mm wafers may be imaged in parallel with a 3 by 6 array of SLMs, where a first wafer 3002 may be imaged by a first set of 3 by 3 array of SLMs, and a second wafer 3004 may be imaged by a second set of 3 by 3 array of SLMs. In this approach, each wafer may contain different designs or different layers of a 3-dimensional integrated circuit. Also, each SLM may be configured to image a different type of via from other SLMs. In addition, each SLM may be configured to implement different stitching algorithms, scaling, inter-ocular displacements, and rotational factor corrections.

According to embodiments of the present invention, the array of SLMs may be employed to process multiple wafers in parallel. For example, a 3 by 3 array of SLMs can be employed for imaging nine 2-inch wafers without image stitching. Each 2-inch wafer is directly imaged by a corresponding SLM, and all nine wafers may be exposed in parallel through independent control of each SLM by the disclosed imaging writer system. Similar to the example of FIG. 30, each SLM may be configured to implement different stitching algorithms, scaling, inter-ocular displacements, and rotational factor corrections. In another approach, the 3 by 3 array of SLMs may be configured to image nine 2-inch printed circuit boards (PCBs). Each PCB is directly imaged by a corresponding SLM, and all nine PCBs may be exposed in parallel through independent control of each SLM by the disclosed imaging writer system. Person skilled in the art would appreciate the array of SLMs may be modified to accommodate different manufacturing scenarios, for example, a 4 by 6 array, a 5 by 5 array, or a 12 by 12 array of SLMs may be employed for parallel imaging of corresponding arrangement of 2-inch wafers or PCBs.

In the example shown in FIG. 30, the AOS maskless direct imaging system can be arranged to expose 300 mm wafers or rectangular shaped interposer substrates, either for active or passive TSV interposers. For active interposer, the wafer loading scheme can be designed to be compatible with mask-based exposure system. For rectangular shape interposer substrate, due to its relaxed resolution and alignment requirements, it may be done with manual load in addition to machine auto load. Depending on the throughput requirement, such AOS exposure system can be configured to load more than one wafer or substrate on the same exposure platform for simultaneous scanning exposures. In FIG. 30, it shows an example of performing two wafers exposures in parallel.

During wafer loading, the orientation of wafers are identified and then loaded to the designated positions. Each SLM can be configured to independently perform "regional alignment" at respective exposure areas. The misalignment correction factors for each region are calculated and applied to the mask data corresponding to each SLM separately. Note that with the disclosed method, there is no need to require a precision pre-alignment for each wafer, as long as each alignment target is within the field of view of its corresponding alignment camera, or within an area of several $mm^2$. Subsequent alignment correction can be performed since the misalignment corrections for the mask data can be applied independently for each SLM imaging unit. Because of this capability, the AOS maskless direct imaging system can be configured to perform multiple wafer exposures. During the AOS exposures for multiple wafers, since all substrates are placed on the same exposure platform, the AOS is configured to perform scanning action physically in terms of orientation and distance. However, because the mask data can be applied with correction factors for each SLM separately prior to exposure, the produced wafer patterns can be considered as if they were patterned using one physical mask. This approach is illustrated in FIG. 28b. As shown in FIG. 28b, within the same wafer, regional alignment corrections can be applied independently to the mask data corresponding to each SLM imaging unit. In addition, two different pre-alignment errors for different wafers, for a first wafer can have pre-alignment error $(\theta_{x1}, \theta_{y1})$ and a second wafer can have pre-alignment error $(\theta_{x2}, \theta_{y2})$, their errors can be independently corrected and applied to mask data for correction. Note that, similar method can be applied to configure the AOS for making exposures on rectangular shaped substrates, where the correction factors may be controlled and applied accordingly when necessary. Regional alignment corrections can be independently applied to the mask data with respect to each SLM imaging unit.

The explosive growth of the high brightness LED (HB-LED) market has been driven by back lighting application in display industry, including handset, TV, computer monitor, advertisement signs, etc. To reduce LED chip manufacturing cost, one approach is to scale with larger wafers, for example from 2 inch wafer to a 4 or 6 inch wafer. Unlike silicon based IC manufacturing, the HB-LED epitaxial wafer uses materials such as sapphire or silicon carbide, and then deposit a thin film of gallium nitride (GaN) via MOCVD, or metal organic chemical vapor deposition. GaN is a hard, mechanically stable wide bandgap semiconductor material with high heat capacity and thermal conductivity. The lattice constants of GaN mismatches with sapphire or silicon carbide. When deposited on these substrates, it is able to resist film cracking but causes severe wafer warp and bow. The larger the substrate size, the problem of wafer warping becomes worse. For instance, GaN film on 2 inch sapphire wafer can have 20 to 25 microns wafer warp and bow, 4 inch wafer can be worse than 100 microns, while the flatness range for 6 inch often exceeds 250 microns. In comparison, a 6 inch silicon epitaxial wafer can be as low as a couple of microns in flatness. This has no doubt presented a challenge for scaling HB-LED wafer to large size.

To achieve cost effective lithography manufacturing beyond today's mainstream 2 inch wafer for LED chip processing, the lithography tool not only needs to have the necessary resolution but also sufficient depth of focus (DOF). It needs to be at least better than the typical warp and bow range found for GaN-on-sapphire wafer within each exposure field. Robust layer to layer alignment given the uneven wafer flatness is another critical consideration. Hence the traditional contact aligner is considered unsuitable beyond 2 inch wafer for HB-LED chip process.

FIG. 31 illustrates a maskless scanning exposure system according to embodiments of the present invention. As shown in FIG. 31, the system has a relatively smaller exposure field size thus can be configured to more flexibly track focus according to substrate surface for scanning exposure. This system tends to be more forgiving to sapphire wafer with severe warp and bow.

Note that such maskless scanning exposure system can be arranged in an array form making scanning exposure for multiple wafers separately on the same stage. Alternatively, such maskless scanning exposure system can be arranged jointly to expose one large-sized wafer in parallel.

In the case of making scanning exposure for multiple wafers separately on the same stage, after all of the wafers have been loaded at each respective position, each wafer is to have a unique set of rotation errors but can be within a range of pre-set limits after a crude pre-aligning step during the wafer loading. For making maskless exposure with alignment, the first step is to scan alignment marks (for example shown in FIG. 28b) on each wafer to determine the actual pattern map.

In addition to pattern rotation (for example shown in FIG. 28a), each wafer may have pattern shift or distortion due to wafer warp or bow as a result of mismatched lattice constants that are getting ever more pronounced at each subsequent heat processing cycle. Each maskless scan exposure unit, also known as a SLM imaging unit, can independently determine the pattern correction factors for mask data and apply them separately to each SLM imaging unit.

As described above, a linear array of SLMs (AOS) can perform maskless scanning exposure in parallel simultaneously on a same stage. To do so, the array of SLMs has same mask data but each has been applied with unique set of correction factors that corresponds to the wafer being exposed. In another example, an array of two SLM imaging units can be configured to process the same wafer. In this case, both the wafer mapping and the mask data correction steps are essentially the same, except the fact that now the exposure is being done by two SLM imaging units on one wafer.

There are numerous advantages with the disclosed AOS maskless scanning exposure system. It not only has the ability to better track focus with respect to the substrate surface, it also has the ability to apply different mask correction patterns for each wafer being exposed separately. In addition, with the ability to expose multiple wafers in parallel simultaneously, the throughput of the manufacturing system is multiplied by the number of wafers exposed. This is done without having to compromise mask patterning correction for every wafer. Note that the tolerance can be rather forgiving for pre-align error during the loading of wafer on the exposure stage. This error can be in the range of several millimeters or within the range of image capturing limit for the alignment camera in each SLM imaging unit. Although it is preferable to have robotic wafer loading and un-loading mechanism, it is possible to have a skilled human operator to perform manual wafer loading for AOS maskless scanning exposure if needed.

In one approach, the array of SLMs may be configured to image multiple pattern sapphire substrate (PSS) light emitting diodes (LEDs) in parallel. Since each SLM may be configured to expose one PSS LED wafer, high manufacturing throughput may be achieved. For example, using a 5 by 5 array of SLMs and each PSS LED consumes one minute of exposure time, the exposure throughput may be 25 wafers per minutes, or 1500 wafers per hour. This exceeds the throughput of conventional exposure tools used in manufacturing of PSS LEDs. Note that the PSS LED process tends to induce high stress to the wafer, which caused substantial substrate warpage, typically in the order of 100 micron for each wafer. In addition, each wafer lot may have different substrate warpage characteristic, which presents a challenge for conventional exposure tools to account for such variations during the manufacturing process. This is because conventional proximity aligners by nature are not well-suited for handling warped substrates, and conventional steppers would have incurred additional costs associated with the masks. To address this issue, the disclosed imaging writer system may be configured to control the focus of each SLM independently to achieve the best imaging results in corresponding local area of each SLM. This approach of adaptive focusing to address the issue of substrate warpage is described in association with FIGS. 8, 13-15, and 21 above.

Figure 32B:
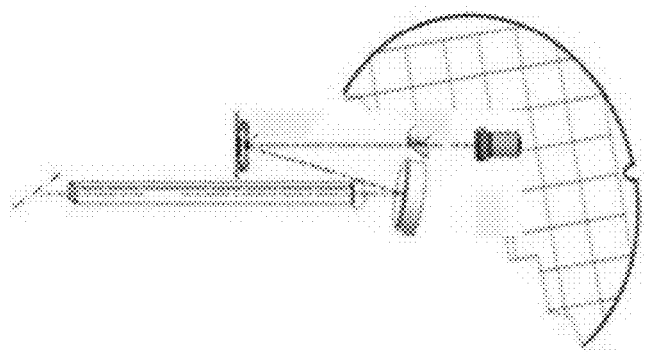
FIGS. 32a-32b illustrate methods of maskless parallel manufacturing utilizing partial wafers according to embodiments of the present invention.
Figure 32A:
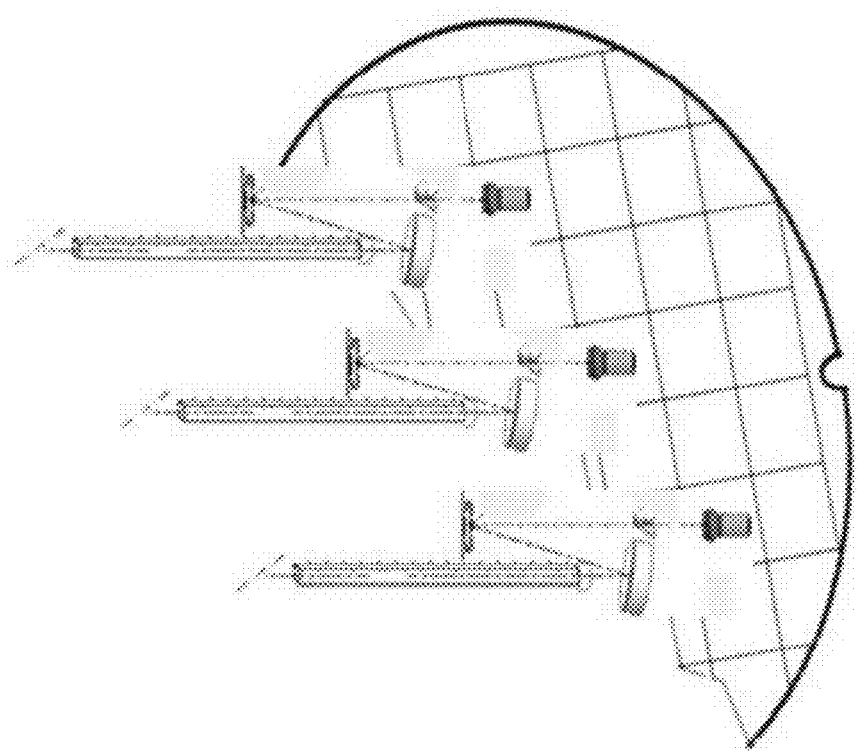

FIGS. 32a-32b illustrate methods of direct imaging on partial wafer substrates according to embodiments of the present invention. In FIG. 32a, an implementation of conformal alignment exposure is performed by a 1 by 3 array of SLMs. In this approach, imaging pattern may be independently exposed by each SLM accordingly. Note that the ability to process partial wafers is particularly useful in manufacturing of GaAs wafers, since GaAs wafers tend to break more easily than silicon wafers. With conventional tools, it is difficult to process partial wafers because the mask may not be used with a partial wafer, and even if the mask may be used, it is difficult to achieve alignment between the mask and the partial wafer. With the disclosed imaging writer system, each SLM may be independently control to compensate for scaling, IOD, and rotational factor corrections in imaging the partial wafer. Thus, the partial wafer does not have to be perfectly aligned for exposure. Similarly, FIG. 32b illustrates conformal alignment exposure of two partial wafers in parallel; each partial wafer is independently exposed by a corresponding SLM using a 1 by 2 array of SLMs. Note that in the example of FIG. 32b, the two partial wafers do not need to be aligned with respect to each other. Each partial wafer may have its own angular offsets, and such angular offsets may be accounted for by the SLMs on-the-fly during exposure. FIGS. 32c-32d illustrates methods of direct imaging designs having different shapes according to embodiments of the present invention. Specifically, the heart shape design 3202 in FIG. 32c may be directly imaged without a mask by a 1 by 4 array of SLMs, and the curved-rectangle design 3204 in FIG. 32d may be directly imaged without a mask by a 2 by 4 array of SLMs.

In the above examples, each SLM may be programmed to compensate for warpage, scaling, IOD, and rotational factor corrections.

FIGS. 33a-33b illustrate methods of maskless manufacturing according to embodiments of the present invention. In particular, FIG. 33a illustrates a conventional manufacturing process using a mask, and FIG. 33b illustrates a maskless manufacturing process using the disclosed imaging writer system. In FIG. 33a, the conventional manufacturing process receives a product design tape out in block 3302. Then, the conventional process performs mask shop preparation in block 3304, mask write in block 3306, and mask inspection and repair in block 3308. The operations performed in blocks 3304 to 3308 are also referred to as mask shop operations. In case defects are found in block 3308, such defects are repaired and in some situations the mask write operation in block 3306 is repeated, which would incur additional costs (indicated by $) related to materials used and time lost in preparing new masks in block 3306. After the mask shop operations, the mask undergoes quality assurance testing in block 3316. In case errors are found in testing, a re-spin would be necessary and the process would have to return to block 3306 to make new masks. This may incur even more costs (indicated by $$) for the materials and time lost in re-spinning the masks. In block 3312, the process performs product manufacturing verification. In case functional or performance problems are found in verification, the product may need to be redesigned and the process may need to be repeated with a new product design tape out in block 3302. In this case, even higher costs (indicated by $$$) would be incurred, and in real world situations this may cost a company millions of dollars. If product manufacturing verification is successful in block 3312, the process moves on to volume manufacturing in block 3314.

In FIG. 33b, the maskless manufacturing process receives a product design tape out in block 3302. From there, according to embodiments of the present invention, the disclosed imaging writer system is able to take the design data and process it for imaging using an array of SLMs to perform the exposure in parallel. In processing the design data for imaging, the disclosed imaging writer system performs alignment, scaling, wafer warpage, inter-ocular displacement, and rotational factor corrections with respect to each SLM. Such corrections are made based on parameters of the specific areas of the substrate, and each SLM is independently controlled to carry out such corrections.

Similar to the process in FIG. 33a, in block 3312, the process performs product manufacturing verification. In case functional or performance problems are found in verification, the product may need to be redesigned and the process may need to be repeated with a new product design tape out in block 3302. In this case, since there is no physical mask made, and there is no mask shop operations (blocks 3304-3308) and mask quality assurance involved, a re-spin of the design would have a shorter cycle and lower product development cost compared to the conventional manufacturing process in FIG. 33a, as indicated by the dotted line from block 3312 to block 3302. In case product manufacturing verification is successful in block 3312, the process moves on to volume manufacturing in block 3314.

According to embodiments of the present invention, the disclosed imaging writer system may be configured to perform automatic optical inspection of integrated circuits. The array of SLMs may be configured to capture substrate images, as described in association with FIGS. 23a-23c. For example, sensors 2310 and 2322 may be used to capture one or more images of a region of a substrate, which represents a portion of an integrated circuit under inspection. Each captured image is analyzed for abnormally pattern inspection, such as unwanted defects, foreign particles, distorted patterns, etc. In one implementation, the disclosed imaging writer system may be configured to perform three types of inspections: 1) inspections to find substrate to mask database discrepancies; 2) inspections to find substrate pattern related distortions; 3) inspections to find foreign particles on substrates. The automatic optical inspection by the disclosed imaging writer system has numerous advantages over conventional inspection methods. First, it has very high throughout, because the array of SLMs may perform comparison to mask database in parallel. Second, the ability to perform image stitching by the disclosed imaging writer system enables substrate pattern to mask database inspection of a large design. Last but not least, since each SLM may be configured to inspect a specific region of the substrate independently, as a result, each SLM may be better adapted to the conditions of the substrates in each corresponding region, such as alignment, scaling, IOD, rotational factor, and substrate warpage corrections. Such automatic optical inspection technique is useful on very large substrates, such as substrates for $10^{th}$ generation and later flat panel displays.

Embodiments of the present invention not only are applicable and beneficial to the lithography for manufacturing of FPD and mask for FPD manufacturing, the making of one-of-a-kind or precision duplicates of life-sized art on glass substrate, they are also applicable and beneficial to the manufacturing of integrated circuits, computer generated holograms (CGH), printed circuit board (PCB), for large imaging display applications in both micro and meso scales.

Embodiments of the present invention are further applicable and beneficial to lithography manufacturing processes without using mask, such as writing intended mask data patterns to substrates directly. In this way, the mask cost and associated issues of concern are eliminated. Embodiments of the present invention enable exposure tools for mask-less exposure that exceeds the throughput requirements for the upcoming G10 and beyond. More importantly, this configuration comes with improved process window to ensure better lithography yield.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method for manufacturing multiple light emitting diodes (LEDs) in parallel, comprising:
   providing an imaging writer system, wherein the imaging writer system includes a plurality of spatial light modulator (SLM) imaging units arranged in one or more parallel arrays;
   providing a plurality of light emitting diode (LED) wafers to be manufactured;
   receiving mask data to be written to the plurality of LED wafers;
   processing the mask data to form a plurality of partitioned mask data patterns corresponding to the plurality of LED wafers, wherein processing the mask data to form the plurality of partitioned mask data patterns corresponding to the plurality of LED wafers comprises scaling the plurality of LED wafers from a first wafer size to a second wafer size, wherein the first wafer size is smaller than the second wafer size;
   assigning one or more SLM imaging units to handle each of the partitioned mask data pattern; and
   controlling the plurality of SLM imaging units to write the plurality of partitioned mask data patterns to the plurality of LED wafers in parallel, wherein the controlling the plurality of SLM imaging units comprises compensating for wafer warp caused by the scaling of the plurality of LED wafer from the first wafer size to the second wafer size.

2. The method of claim 1, wherein processing the mask data comprises:
   processing the mask data to form a plurality of partitioned mask data patterns corresponding to the plurality LED wafers of a same LED design.

3. The method of claim 1, wherein processing the mask data comprises:
   processing the mask data to form a plurality of partitioned mask data patterns corresponding to the plurality LED wafers of different LED designs.

4. The method of claim 1, wherein controlling the plurality of SLM imaging units comprises:
   detecting deformation at each local region of a LED wafer in the plurality of LED wafers associated with each SLM imaging unit; and
   adjusting focus at each SLM imaging unit in response to the deformation at each local region of the LED wafer in the plurality of LED wafers.

5. The method of claim 1, wherein controlling the plurality of SLM imaging units further comprises:
   detecting rotational errors at each local region of a LED wafer in the plurality of LED wafers associated with each SLM imaging unit;
   determining rotational correction factors to the corresponding partitioned mask data pattern; and
   applying the rotational correction factors to the corresponding partitioned mask data pattern for each local region of the LED wafer in the plurality of LED wafers associated with each SLM imaging unit.

6. The method of claim 1, wherein controlling the plurality of SLM imaging units further comprises:
   detecting pattern distortions due to substrate deformation at each local region of a LED wafer in the plurality of LED wafers associated with each SLM imaging unit;
   determining pattern correction factors to the corresponding partitioned mask data pattern; and
   applying the pattern correction factors to the corresponding partitioned mask data pattern for each local region of the LED wafer in the plurality of LED wafers associated with each SLM imaging unit.

7. The method of claim 1, wherein providing the plurality of LED wafers to be manufactured comprises:
   depositing a thin film of gallium nitride on a sapphire wafer via a metal organic chemical vapor deposition, wherein the thin film of gallium nitride is configured to resist film cracking, and wherein the thin film of gallium nitride causes warping of the each LED wafer in the plurality of LED wafers.

8. A system for manufacturing multiple light emitting diodes (LEDs) in parallel, comprising:
   a plurality of spatial light modulator (SLM) imaging units arranged in one or more parallel arrays;
   a controller configured to control the plurality of SLM imaging units, wherein the controller includes
   logic for providing a plurality of light emitting diode (LED) wafers to be manufactured;
   logic for receiving mask data to be written to the plurality of LED wafers;
   logic for processing the mask data to form a plurality of partitioned mask data patterns corresponding to the plurality of LED wafers, wherein the logic for processing the mask data to form the plurality of partitioned mask data patterns corresponding to the plurality of LED wafers comprises logic for scaling the plurality of LED wafer from a first wafers size to a second wafer size, wherein the first wafer size is smaller than the second wafer size;
   logic for assigning one or more SLM imaging units to handle each of the partitioned mask data pattern; and
   logic for controlling the plurality of SLM imaging units to write the plurality of partitioned mask data patterns to the plurality of LED wafers in parallel, wherein the logic for controlling the plurality of SLM imaging units comprises logic for compensating for wafer warp caused by the scaling of the plurality of LED wafer from the first wafer size to the second wafer size.

9. The system of claim 8, wherein logic for processing the mask data comprises:
   logic for processing the mask data to form a plurality of partitioned mask data patterns corresponding to the plurality LED wafers of a same LED design.

10. The system of claim 8, wherein logic for processing the mask data comprises:
    logic for processing the mask data to form a plurality of partitioned mask data patterns corresponding to the plurality LED wafers of different LED designs.

11. The system of claim 8, wherein logic for controlling the plurality of SLM imaging units comprises:

logic for detecting deformation at each local region of a LED wafer in the plurality of LED wafers associated with each SLM imaging unit; and logic for adjusting focus at each SLM imaging unit in response to the deformation at each local region of the LED wafer in the plurality of LED wafers.

12. The system of claim 8, wherein logic for controlling the plurality of SLM imaging units further comprises:

logic for detecting rotational errors at each local region of a LED wafer in the plurality of LED wafers associated with each SLM imaging unit;

logic for determining rotational correction factors to the corresponding partitioned mask data pattern; and logic for applying the rotational correction factors to the corresponding partitioned mask data pattern for each local region of the LED wafer in the plurality of LED wafers associated with each SLM imaging unit.

13. The system of claim 8, wherein logic for controlling the plurality of SLM imaging units further comprises:

logic for detecting pattern distortions due to substrate deformation at each local region of a LED wafer in the plurality of LED wafers associated with each SLM imaging unit;

logic for determining pattern correction factors to the corresponding partitioned mask data pattern; and logic for applying the pattern correction factors to the corresponding partitioned mask data pattern for each local region of the LED wafer in the plurality of LED wafers associated with each SLM imaging unit.

14. The system of claim 8, wherein logic for providing the plurality of LED wafers to be manufactured comprises:

logic for depositing a thin film of gallium nitride on a sapphire wafer via a metal organic chemical vapor deposition, wherein the thin film of gallium nitride is configured to resist film cracking, and wherein the thin film of gallium nitride causes warping of the each LED wafer in the plurality of LED wafers.

* * * * *

UNITED STATES PATENT AND TRADEMARK OFFICE
CERTIFICATE OF CORRECTION

PATENT NO.        : 9,507,271 B1                             Page 1 of 1
APPLICATION NO.   : 13/225405
DATED             : November 29, 2016
INVENTOR(S)       : Jang Fung Chen et al.

It is certified that error appears in the above-identified patent and that said Letters Patent is hereby corrected as shown below:

In the Specification

In Column 9, Line 53, below "present invention."
insert -- FIGS. 28c-28d illustrate defect patterns and corrections of the present disclosure. --.

In Column 11, Line 23, delete "m" and insert -- µm --, therefor.

In Column 19, Line 29, delete "stream" and insert -- stream. --, therefor.

In Column 20, Line 62, delete "distances," and insert -- distances. --, therefor.

In Column 26, Line 9, delete "microeletromechanical" and insert -- microelectromechanical --, therefor.

Signed and Sealed this
Fourth Day of April, 2017

Michelle K. Lee
*Director of the United States Patent and Trademark Office*